US011282747B2

(12) United States Patent
Zhao et al.

(10) Patent No.: US 11,282,747 B2
(45) Date of Patent: Mar. 22, 2022

(54) METHODS OF FORMING MICROELECTRONIC DEVICES, AND RELATED MICROELECTRONIC DEVICES, AND ELECTRONIC SYSTEMS

(71) Applicant: Micron Technology, Inc., Boise, ID (US)

(72) Inventors: Bo Zhao, Boise, ID (US); Nancy M. Lomeli, Boise, ID (US); Lifang Xu, Boise, ID (US); Adam L. Olson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/799,254

(22) Filed: Feb. 24, 2020

(65) Prior Publication Data
US 2021/0265216 A1    Aug. 26, 2021

(51) Int. Cl.
*H01L 27/00* (2006.01)
*H01L 21/8229* (2006.01)
(Continued)

(52) U.S. Cl.
CPC .... *H01L 21/8229* (2013.01); *H01L 21/76822* (2013.01); *H01L 27/1157* (2013.01);
(Continued)

(58) Field of Classification Search
None
See application file for complete search history.

(56) References Cited

U.S. PATENT DOCUMENTS 9,449,987 B1    9/2016  Miyata et al.
10,283,493 B1 *  5/2019  Nishida ............. H01L 27/11582
(Continued)

FOREIGN PATENT DOCUMENTS

KR    10-2017-0109014 A    9/2017
WO        2019/143400 A1    7/2019

OTHER PUBLICATIONS

International Search Report for Application No. PCT/US2021/017430, dated Jun. 7, 2021, 4 pages.
(Continued)

*Primary Examiner* — Reema Patel
(74) *Attorney, Agent, or Firm* — TraskBritt

(57) ABSTRACT

A microelectronic device comprises a microelectronic device structure having a memory array region and a staircase region. The microelectronic device structure comprises a stack structure having tiers each comprising a conductive structure and an insulative structure; staircase structures confined within the staircase region and having steps comprising edges of the tiers of the stack structure within the deck and the additional deck; and semiconductive pillar structures confined within the memory array region and extending through the stack structures. The stack structure comprises a deck comprising a group of the tiers; an additional deck overlying the deck and comprising an additional group of the tiers; and an interdeck section between the deck and the additional deck and comprising a dielectric structure confined within the memory array region, and another group of the tiers within vertical boundaries of the dielectric structure and confined within the staircase region.

14 Claims, 42 Drawing Sheets

(51) Int. Cl.
*H01L 21/768* (2006.01)
*H01L 27/11573* (2017.01)
*H01L 27/1157* (2017.01)
*H01L 27/11578* (2017.01)

(52) U.S. Cl.
CPC .. *H01L 27/11573* (2013.01); *H01L 27/11578* (2013.01); *H01L 21/76877* (2013.01)

(56) References Cited

U.S. PATENT DOCUMENTS

2017/0033117 A1 2/2017 Lee
2019/0198109 A1 6/2019 Li et al.

OTHER PUBLICATIONS

Written Opinion of the International Searching Authority for Application No. PCT US2021/017430, dated Jun. 7, 2021, 7 pages.

* cited by examiner

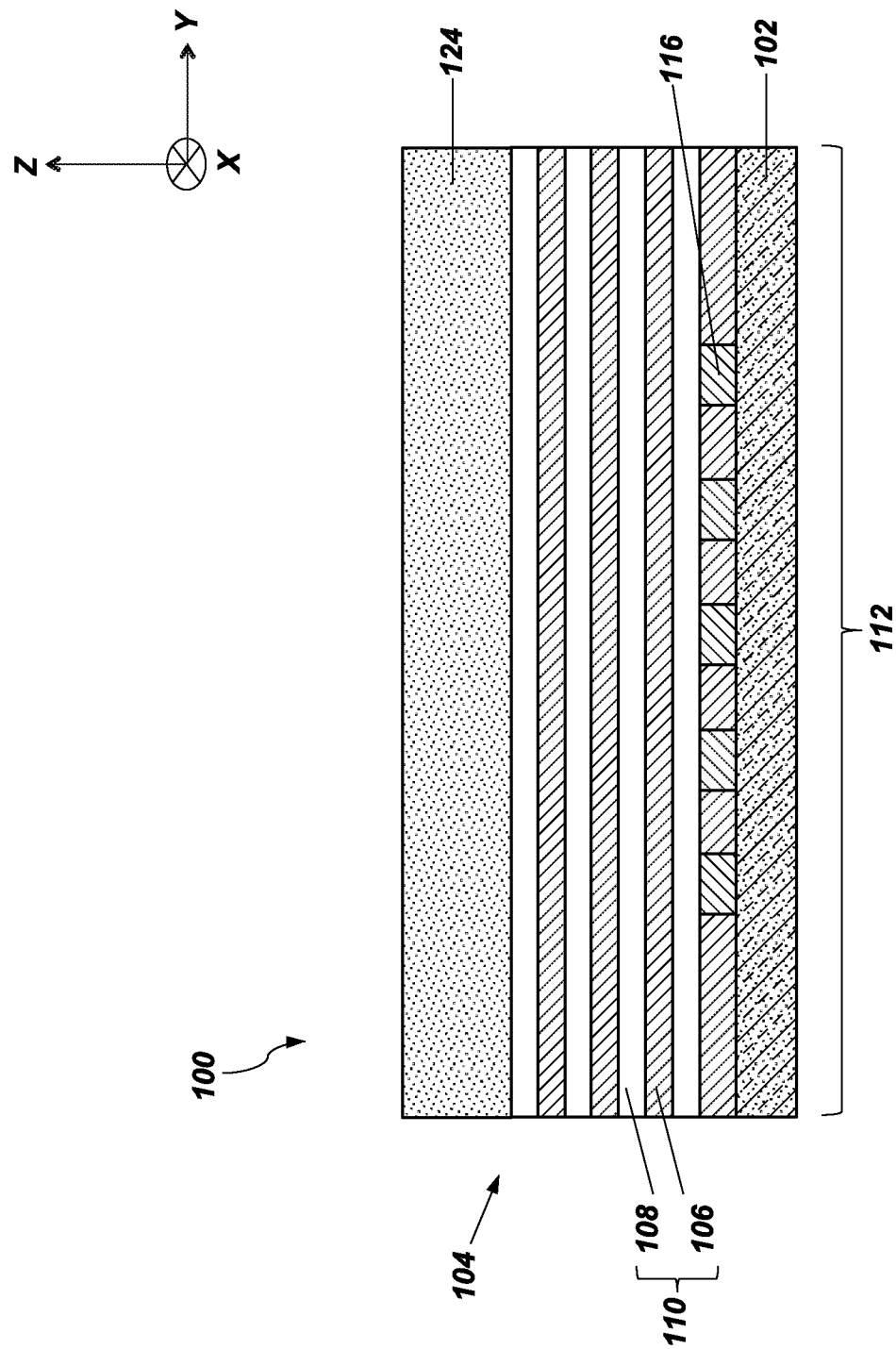

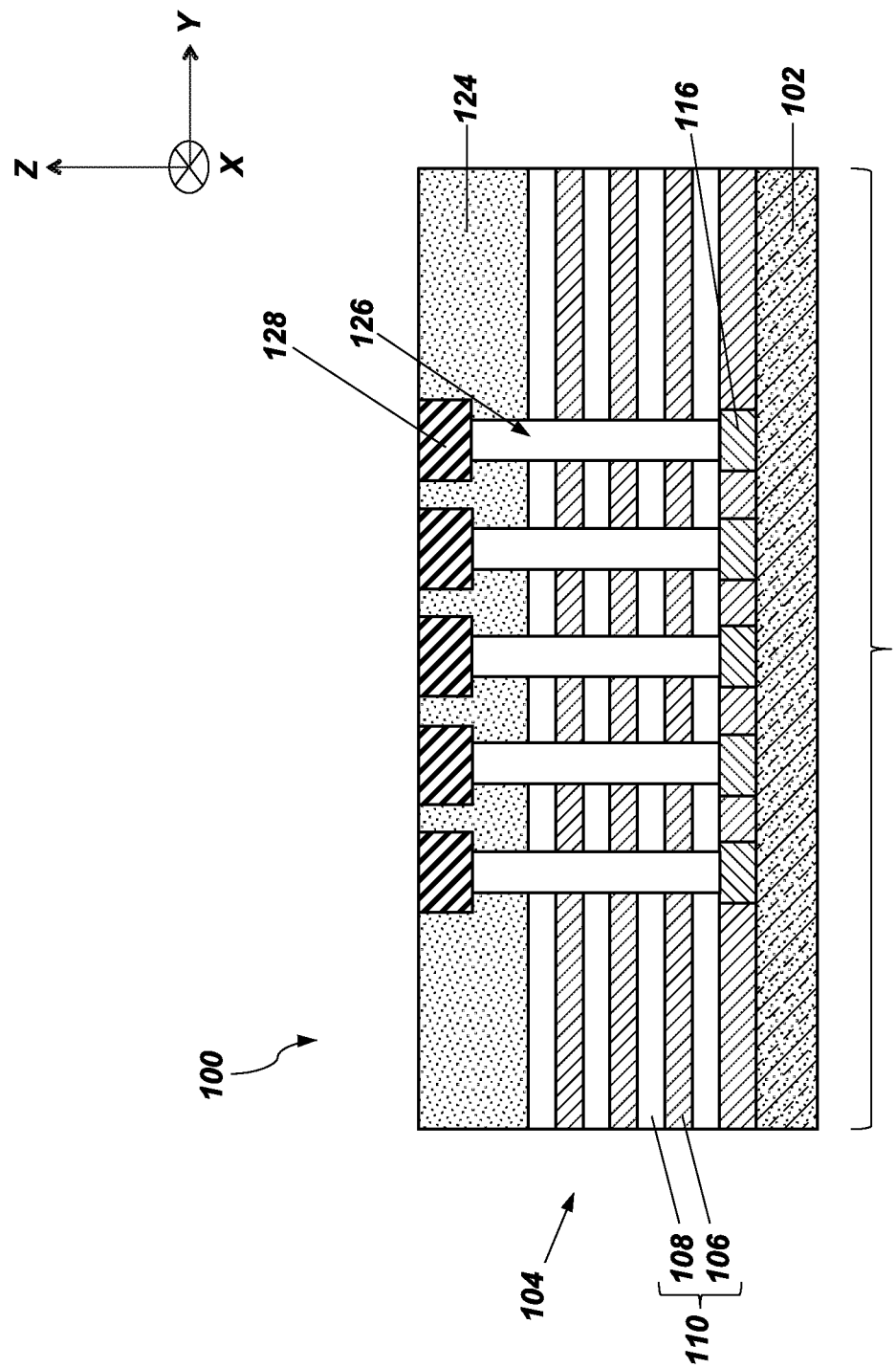

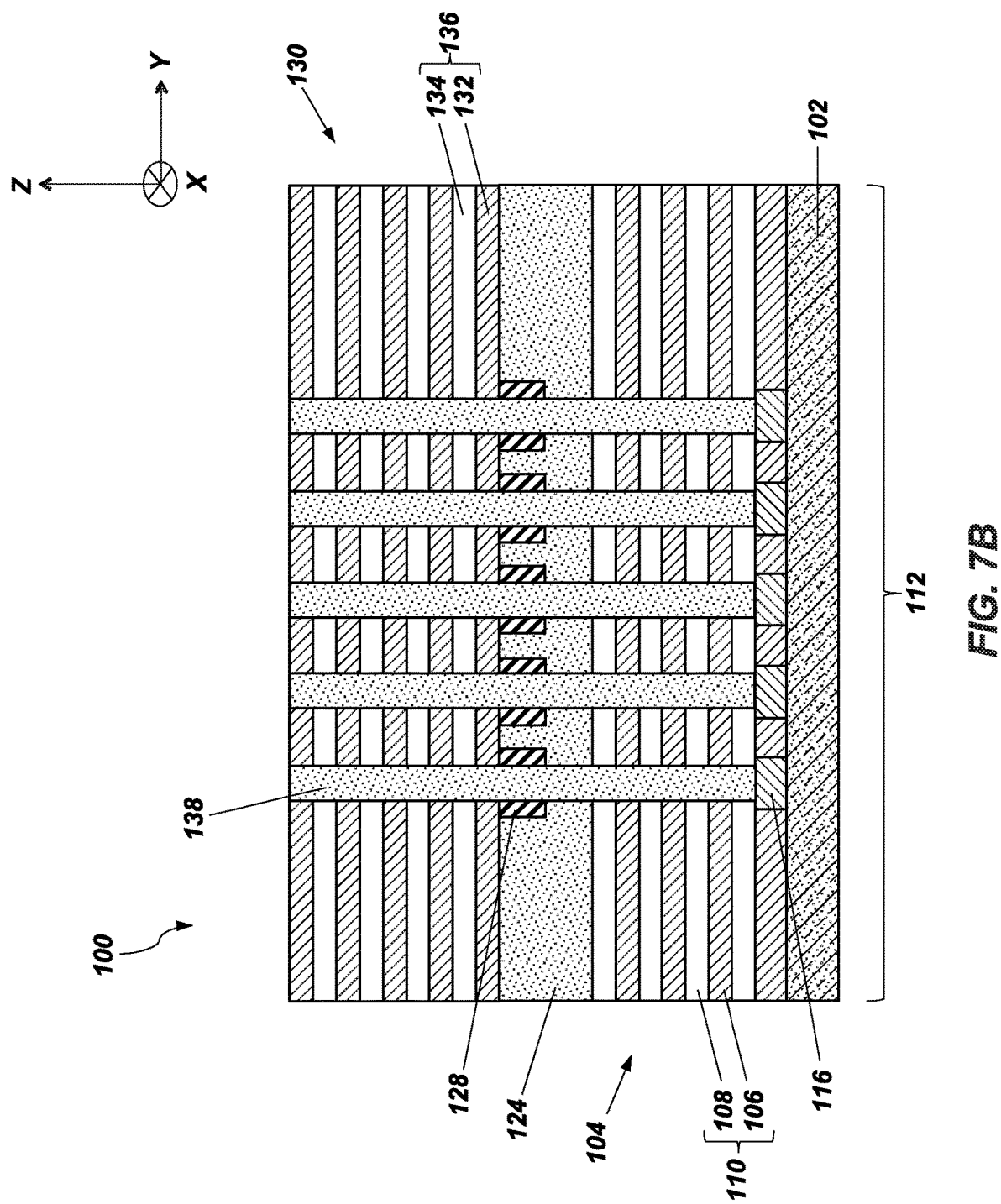

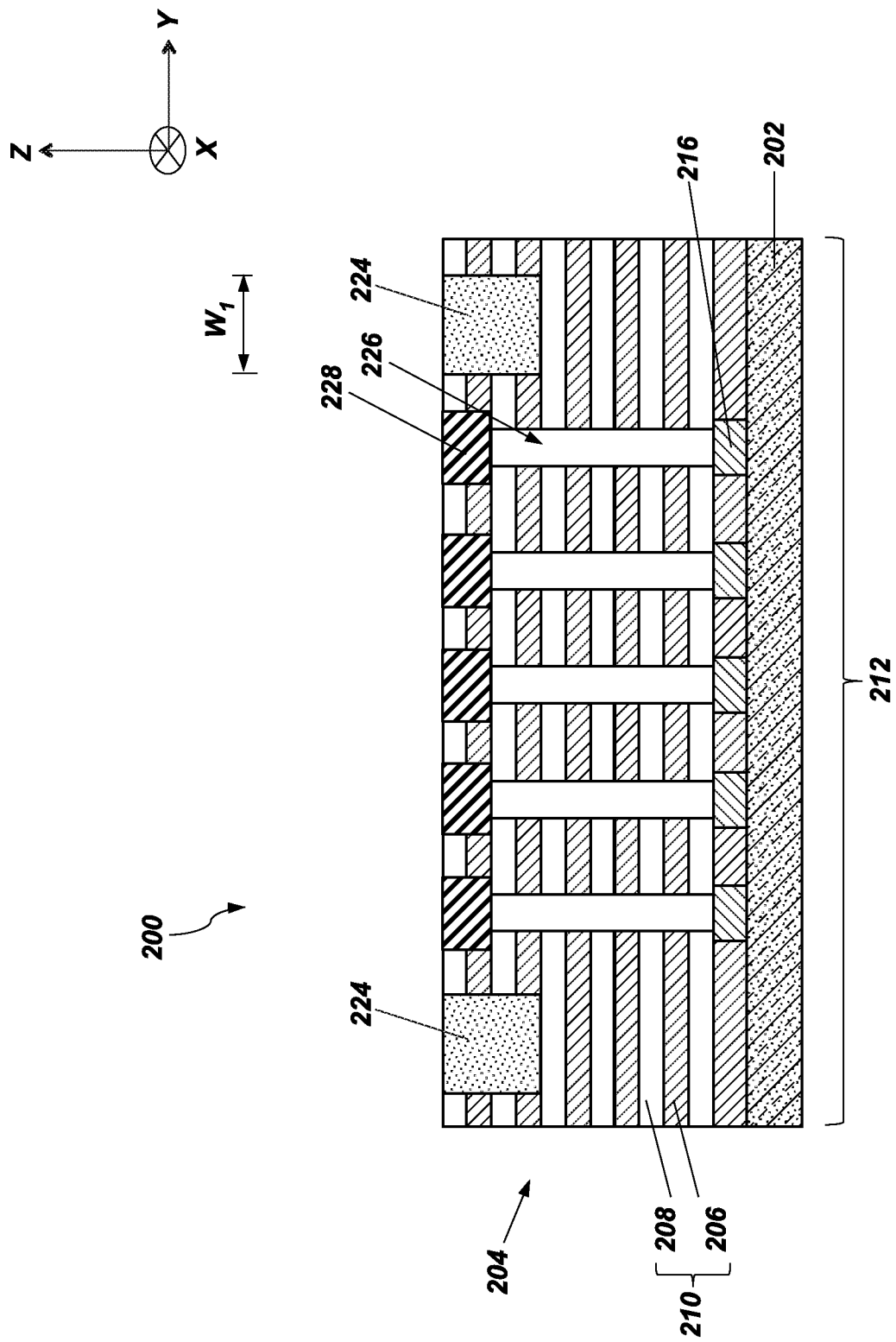

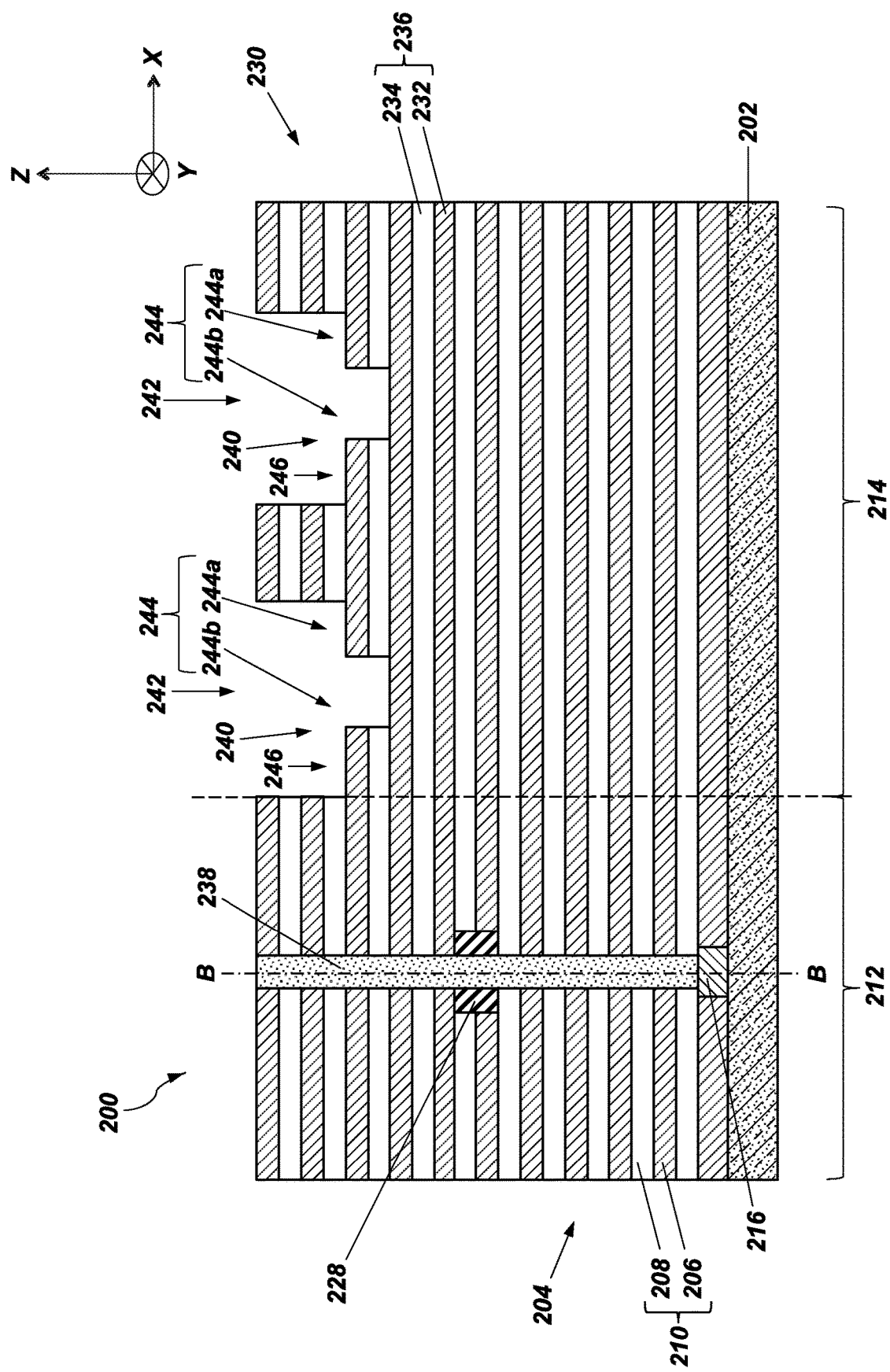

US 11,282,747 B2

METHODS OF FORMING MICROELECTRONIC DEVICES, AND RELATED MICROELECTRONIC DEVICES, AND ELECTRONIC SYSTEMS

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more stack structures including tiers of conductive structures and dielectric materials. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the stack structure(s) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the stack structure(s) of the memory device. The staircase structure includes individual "steps" defining contact regions of the conductive structures, upon which conductive contact structures can be positioned to provide electrical access to the conductive structures.

As vertical memory array technology has advanced, enhanced memory density has been provided by forming memory devices to exhibit multiple deck (e.g., dual deck) configurations. For example, in one conventional dual deck configuration, some vertical memory strings are located in an upper deck comprising a first stack structure, and additional vertical memory strings are located in a lower deck underlying the upper deck and comprising a second stack structure. The vertical memory strings of the upper deck may be electrically isolated from the additional vertical memory strings of the lower deck (e.g., by way of an interdeck dielectric structure), or the vertical memory strings of the upper deck may be electrically coupled to the additional vertical memory strings of the lower deck (e.g., by way of conductive interconnect structures extending through an interdeck dielectric structure). Unfortunately, conventional methods of forming multiple deck (e.g., dual deck) configurations may result in relatively thick interdeck dielectric structures vertically intervening between different decks that can impede efficient formation of staircase structures within relatively lower deck(s). The interdeck dielectric structure may, for example, disrupt a vertically alternating sequence of first structures (e.g., insulative structures) and second structures (e.g., additional insulative structures, conductive structures) within the different decks, and thereby obstruct simple and efficient transfer of one or more staircase structure configurations from a relatively higher deck into a relatively lower deck using conventional chopping processes. As a result, forming desired staircase structures within the stack structures of different decks can require complex, inefficient, and costly processes (e.g., separate staircase formation processes each including a series of masking and etching acts) for the each of the different decks.

Accordingly, there remains a need for new methods of forming microelectronic devices (e.g., memory devices, such as 3D NAND Flash memory devices) that facilitate enhanced memory density while alleviating the problems of conventional methods of forming microelectronic devices, as well as for new microelectronic devices and new electronic systems formed using such methods.

BRIEF DESCRIPTION OF THE DRAWINGS

FIGS. 1A through 10B are simplified partial cross-sectional views illustrating a method of forming a microelectronic device, in accordance with embodiments of the disclosure.

FIGS. 1B, 2B, 3B, 4B, 5B, 6B, 7B, 8B, 9B, and 10B are simplified partial cross-sectional views about the line A-A depicted in FIGS. 1A, 2A, 3A, 4A, 5A, 6A, 7A, 8A, 9A, and 10A, respectively.

FIGS. 11A through 20B are simplified partial cross-sectional views illustrating a method of forming a microelectronic device, in accordance with additional embodiments of the disclosure. FIGS. 11B, 12B, 13B, 14B, 15B, 16B, 17B, 18B, 19B, and 20B are simplified partial cross-sectional views about the line B-B depicted in FIGS. 11A, 12A, 13A, 14A, 15A, 16A, 17A, 18A, 19A, and 20A, respectively.

DETAILED DESCRIPTION

Figure 1A:
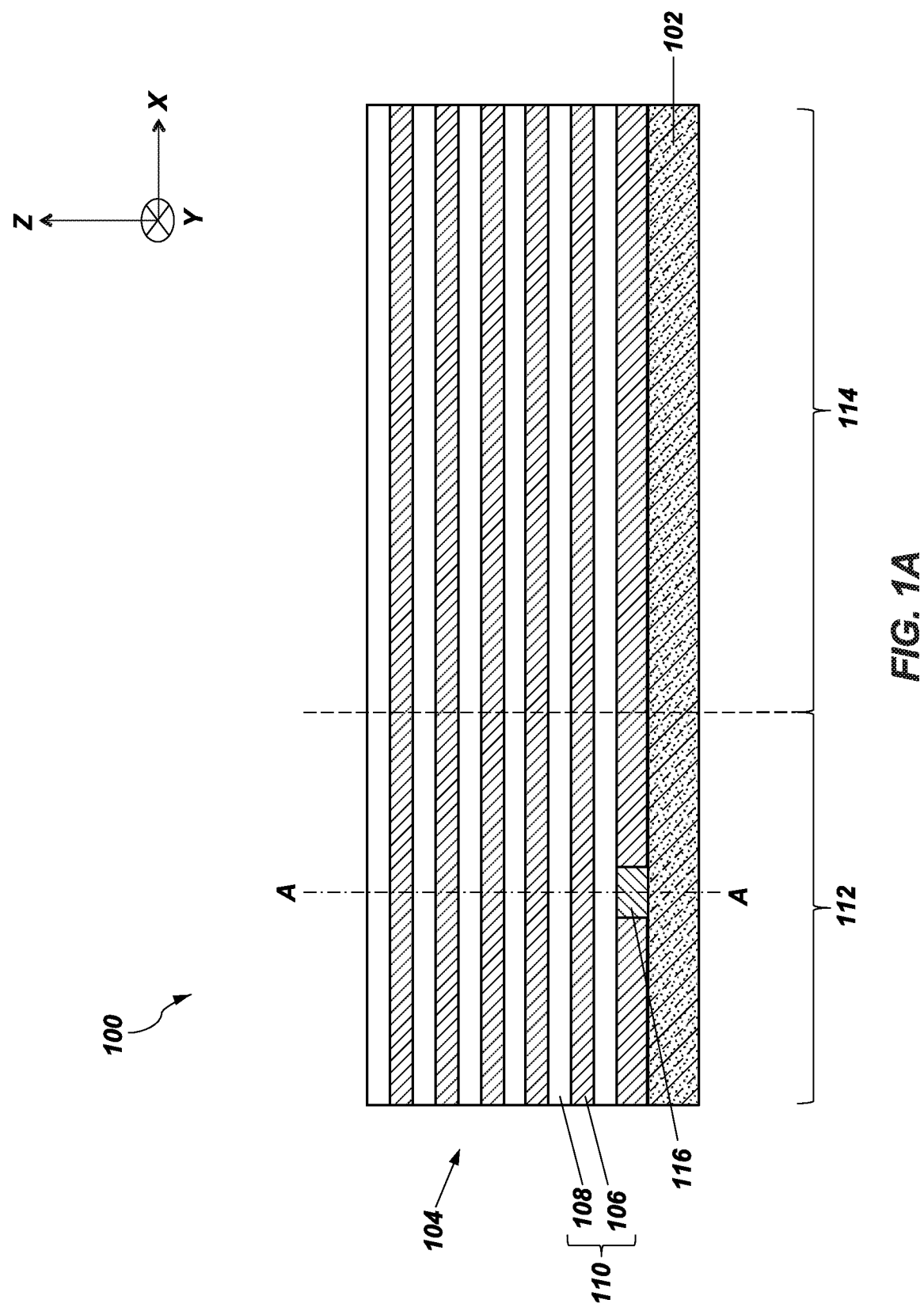

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes a microelectronic device exhibiting, but not limited to, memory functionality.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the terms "comprising," "including," "having," and grammatical equivalents thereof are inclusive or open-ended terms that do not exclude additional, unrecited elements or method steps, but also include the more restrictive terms "consisting of" and "consisting essentially of" and grammatical equivalents thereof. As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Unless the context indicates otherwise, the materials described herein may be formed by any suitable process including, but not limited to, spin coating, blanket coating, chemical vapor deposition ("CVD"), atomic layer deposition ("ALD"), plasma enhanced ALD, physical vapor deposition ("PVD") (including sputtering, evaporation, ionized PVD, and/or plasma-enhanced CVD), or epitaxial growth. Depending on the specific material to be formed, the technique for depositing or growing the material may be selected by a person of ordinary skill in the art. In addition, unless the context indicates otherwise, the removal of materials described herein may be accomplished by any suitable process including, but not limited to, etching (e.g., dry etching, wet etching, vapor etching), ion milling, abrasive planarization, or other known methods.

FIGS. 1A through 10B are simplified partial cross-sectional views illustrating embodiments of a method of forming a microelectronic device (e.g., a memory device, such as a 3D NAND Flash memory device). FIGS. 1B, 2B, 3B, 4B, 5B, 6B, 7B, 8B, 9B, and 10B are simplified partial cross-sectional views about the line A-A depicted in FIGS. 1A, 2A, 3A, 4A, 5A, 6A, 7A, 8A, 9A, and 10A, respectively. With the description provided below, it will be readily apparent to one of ordinary skill in the art that the methods and structures described herein may be used in various devices and electronic systems.

Figure 1B:
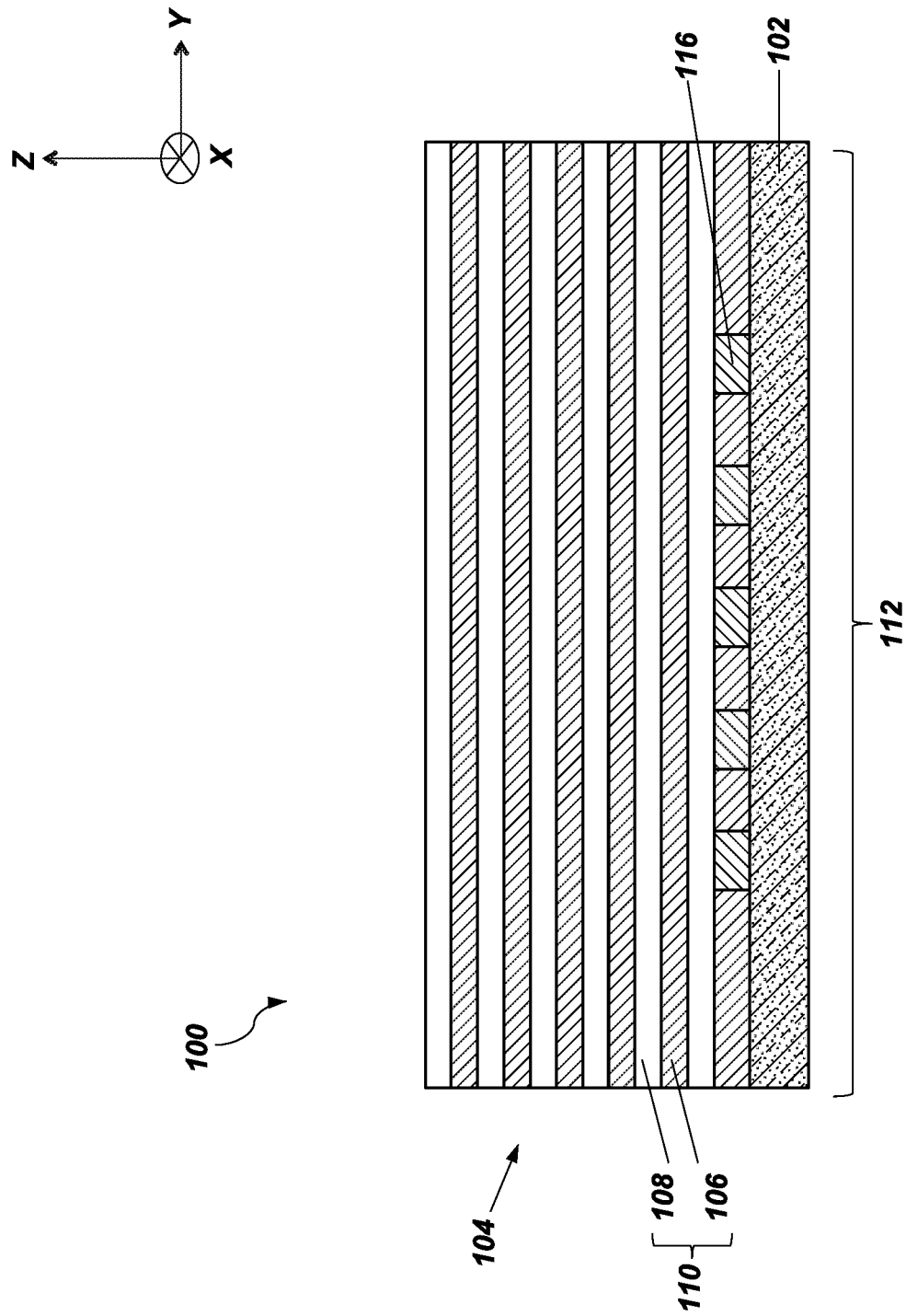

Referring to FIG. 1A, a microelectronic device structure 100 may be formed to include a base structure 102, and a first preliminary stack structure 104 on or over the base structure 102. The microelectronic device structure 100 includes a memory array region 112, and a staircase region 114 horizontally neighboring (e.g., in the X-direction) the memory array region 112. As described in further detail below, the microelectronic device structure 100 further includes additional components (e.g., features, structures, devices) within boundaries of the different horizontal regions (e.g., the memory array region 112, the staircase region 114) thereof. FIG. 1B is a simplified partial cross-sectional view of the microelectronic device structure 100 at the processing stage depicted in FIG. 1A about the line A-A shown in FIG. 1A.

The base structure 102 of the microelectronic device structure 100 may comprise a base material or construction upon which additional materials and structures of the microelectronic device structure 100 are formed. In some embodiments, the base structure 102 comprises a conductive structure formed of at least one electrically conductive material, such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductively-doped semiconductor material (e.g., conductively-doped polysilicon, conductively-doped germanium (Ge), conductively-doped silicon germanium (SiGe)), and a conductive metal-containing material (e.g., a conductive metal nitride, a conductive metal silicide, a conductive metal carbide, a conductive metal oxide). The base structure 102 may, for example, be employed as a source structure (e.g., a source plate) for a microelectronic device, as described in further detail below.

The first preliminary stack structure 104 of the microelectronic device structure 100 includes a vertically alternating (e.g., in the Z-direction) sequence of first insulative structures 106 and second insulative structures 108 arranged in tiers 110. Each of the tiers 110 of the first preliminary stack structure 104 may include at least one of the first insulative structures 106 vertically neighboring at least one of the second insulative structures 108. The first preliminary stack structure 104 may include a desired quantity of the tiers 110. For example, the first preliminary stack structure 104 may include greater than or equal to ten (10) of the tiers 110, greater than or equal to twenty-five (25) of the tiers 110, greater than or equal to fifty (50) of the tiers 110, greater than or equal to one hundred (100) of the tiers 110, greater than or equal to one hundred and fifty (150) of the tiers 110, or greater than or equal to two hundred (200) of the tiers 110 of the first insulative structures 106 and the second insulative structures 108.

The first insulative structures 106 of the tier 110 of the first preliminary stack structure 104 may be formed of and include at least one electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x", "y", and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the first insulative structures 106 may comprise one or more stoichiometric compounds and/or one or more non-stoichiometric compounds, and values of "x", "y", and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. Each of the first insulative structures 106 may individually include a substantially homogeneous distribution or a substantially heterogeneous distribution of the at least one electrically insulative material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. In some embodiments, each of the first insulative structures 106 exhibits a substantially homogeneous distribution of electrically insulative material. In further embodiments, at least one of the first insulative structures 106 exhibits a substantially heterogeneous distribution of at least one electrically insulative material. One or more of the first insulative structures 106 may, for example, be formed of and include a stack (e.g., laminate) of at least two different electrically insulative materials (e.g., at least two different dielectric materials). In some embodiments, each of the first insulative structures 106 is formed of and includes a dielectric oxide material, such as $SiO_x$ (e.g., silicon dioxide (Sift)). The first insulative structures 106 may each be substantially planar, and may each individually exhibit a desired thickness. In addition, each of the first insulative structures 106 may be substantially the same (e.g., exhibit substantially the same material composition, material distribution, size, and shape) as one another, or at least one of the first insulative structures 106 may be different (e.g., exhibit one or more of a different material composition, a different material distribution, a different size, and a different shape) than at least one other of the first insulative structures 106. In some embodiments, each of the first insulative structures 106 is substantially the same as each other of the first insulative structures 106.

The second insulative structures 108 of the tiers 110 of the first preliminary stack structure 104 may be formed of and include at least one additional electrically insulative material. Material compositions of the second insulative structures 108 and the first insulative structures 106 may be selected such that the first insulative structures 106 and the second insulative structures 108 may be selectively removed relative to one another. The second insulative structures 108 may be selectively etchable relative to the first insulative structures 106 during common (e.g., collective, mutual) exposure to a first etchant, and the first insulative structures 106 may be selectively etchable to the second insulative structures 108 during common exposure to a second, different etchant. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. A material composition of the second insulative structures 108 is different than a material composition of the first insulative structures 106. The second insulative structures 108 may comprise one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, each of the second insulative structures 108 is formed of and includes a dielectric nitride material, such as $SiN_y$ (e.g., $Si_3N_4$). Each of the second insulative structures 108 may individually include a substantially homogeneous distribution of the at least one additional electrically insulative material, or a substantially heterogeneous distribution of the at least one additional electrically insulative material. In some embodiments, each of the second insulative structures 108 of the first preliminary stack structure 104 exhibits a substantially homogeneous distribution of additional electrically insulative material. In additional embodiments, at least one of the second insulative structures 108 of the first preliminary stack structure 104 exhibits a substantially heterogeneous distribution of at least one additional electrically insulative material. The second insulative structure(s) 108 may, for example, individually be formed of and include a stack (e.g., laminate) of at least two different additional electrically insulative materials. The second insulative structures 108 may each be substantially planar, and may each individually exhibit a desired thickness.

With continued reference to FIG. 1A, the microelectronic device structure 100 may further include contact structures 116 within the memory array region 112 thereof. The contact structures 116 may, for example, serve as source contact structures. The contact structures 116 may be configured (e.g., sized, shaped, materially composed) and positioned to facilitate an electrical connection between one or more features (e.g., the base structure 102) of the microelectronic device structure 100 and one or more additional structures or devices (e.g., pillar structures, vertical strings of memory cells) to be formed on or over the contact structures 116, as described in further detail below. The contact structures 116 may each individually be formed of and include at least one electrically conductive material, such as a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductively-doped semiconductor material (e.g., conductively-doped polysilicon, conductively-doped Ge, conductively-doped SiGe), a conductive metal-containing material (e.g., a conductive metal nitride, a conductive metal silicide, a conductive metal carbide, a conductive metal oxide), or combinations thereof. In some embodiments, the contact structures 116 are formed of and include W. Each of the contact structures 116 may individually include a substantially homogeneous distribution of the at least one electrically conductive material, or a heterogeneous distribution of the at least one electrically conductive material. In some embodiments, each of contact structures 116 exhibits a substantially homogeneous distribution of electrically conductive material. In additional embodiments, at least one of the contact structures 116 exhibits a heterogeneous distribution of at least one electrically conductive material.

The base structure 102, the first preliminary stack structure 104 (including the tiers 110 of the first insulative structures 106 and the second insulative structures 108 thereof), and the contact structures 116 may be formed using conventional processes (e.g., conventional material deposition processes, conventional photolithographic patterning processes, conventional material removal processes), and conventional processing equipment, which are not described in detail herein.

Figure 2A:
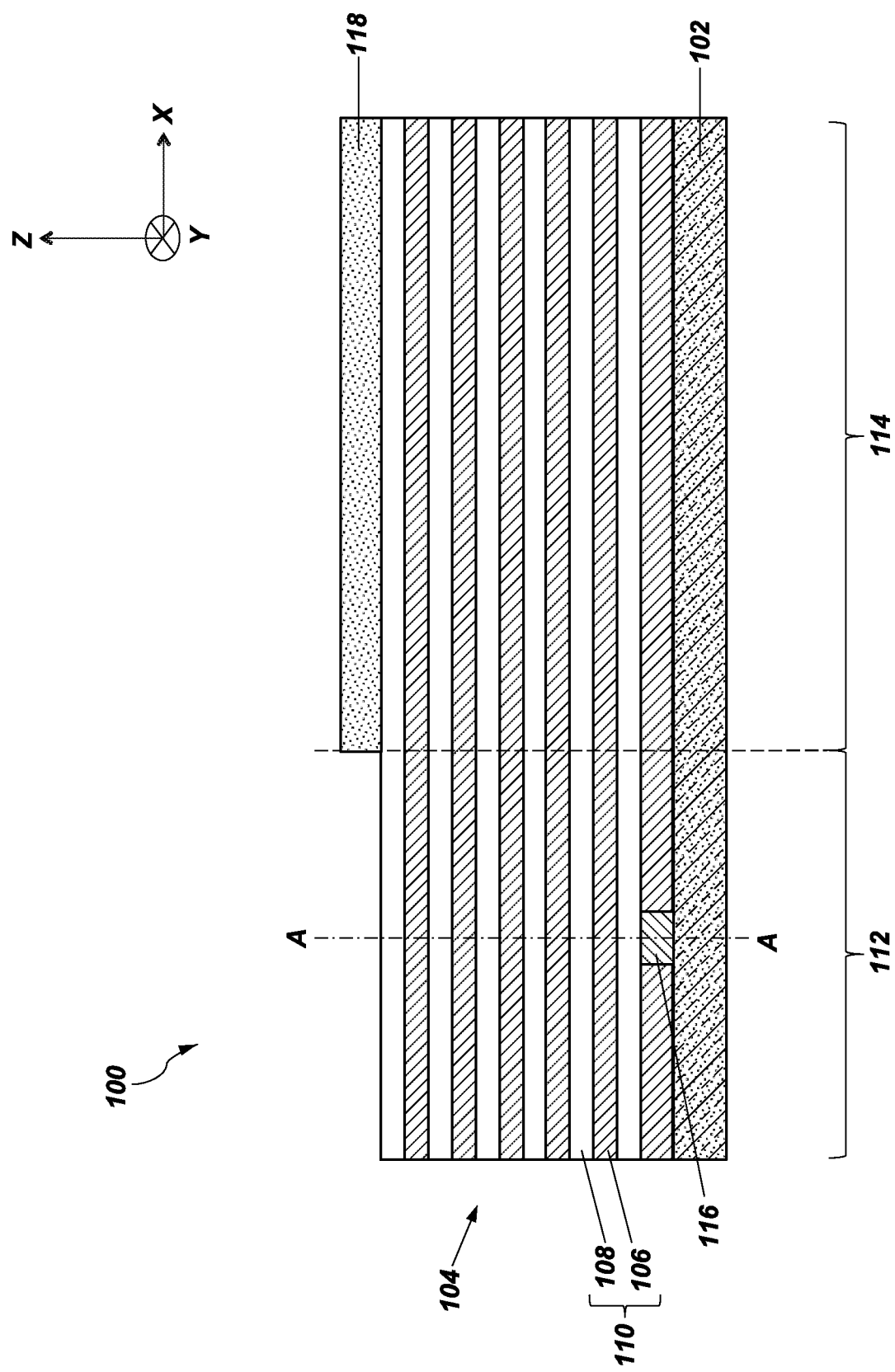
Figure 2B:
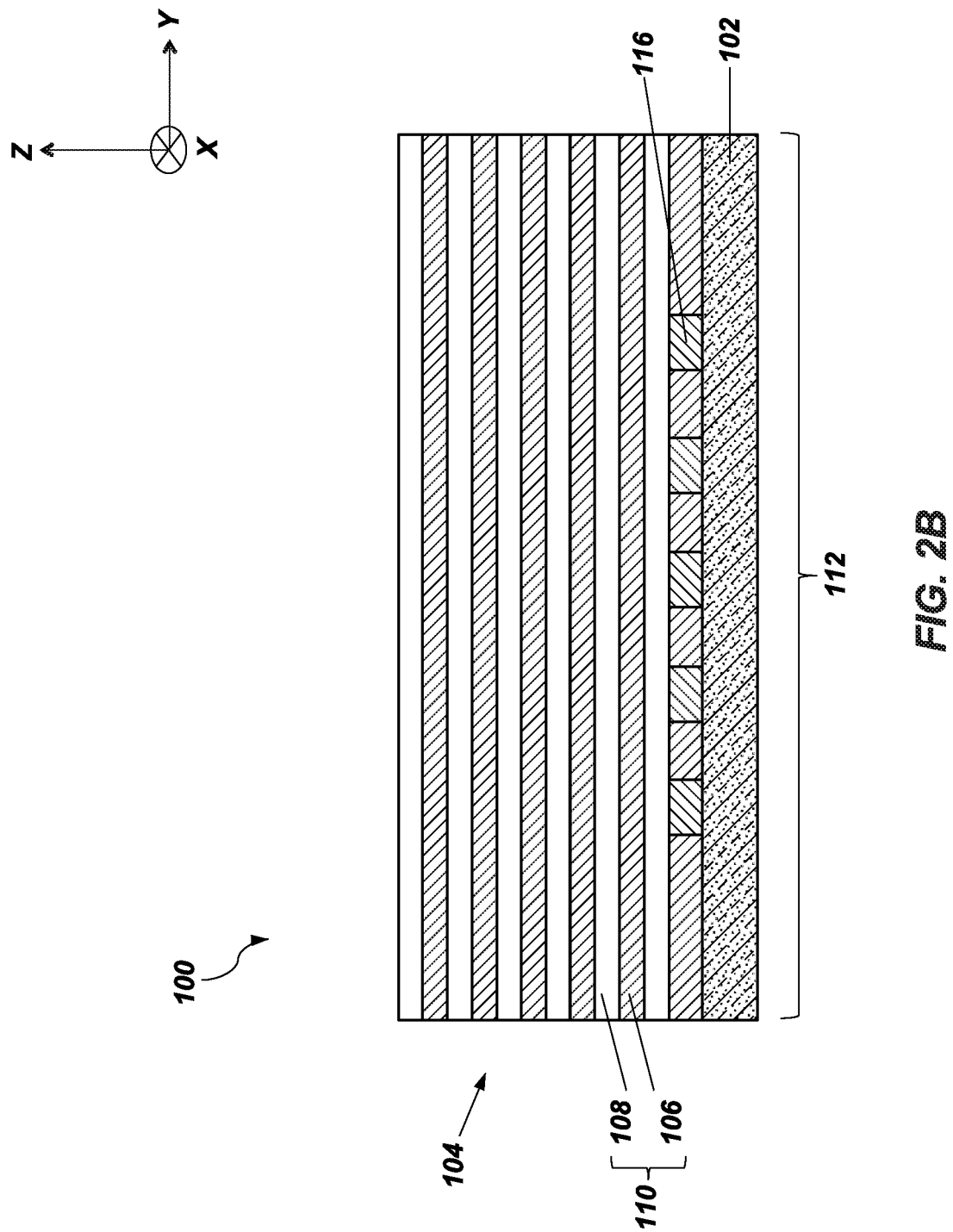

Referring next to FIG. 2A, a photoresist structure 118 may be formed on or over portions of the first preliminary stack structure 104 within horizontal boundaries of the staircase region 114 of the microelectronic device structure 100. As shown in FIG. 2A, the photoresist structure 118 may be formed to be substantially confined within the staircase region 114, such that the photoresist structure 118 does not substantially horizontally extend into the memory array region 112 of the microelectronic device structure 100. Put another way, the photoresist structure 118 may be formed such that the photoresist structure 118 is substantially (e.g., completely) absent from memory array region 112 of the first preliminary stack structure 104. FIG. 2B is a simplified partial cross-sectional view of the microelectronic device structure 100 at the processing stage depicted in FIG. 2A about the line A-A shown in FIG. 2A.

The photoresist structure 118 may serve as a mask to protect portions of the first preliminary stack structure 104 (e.g., including the tiers 110 of the first insulative structures 106 and the second insulative structures 108 thereof) vertically thereunder and within horizontal boundaries thereof from removal during subsequent processing, as described in further detail below. The photoresist structure 118 may be formed of and include a photoresist material, such as a positive tone photoresist material, or a negative tone photoresist material. Suitable photoresist materials (e.g., positive tone photoresist materials, negative tone photoresist materials) are known in the art, and are, therefore, not described in detail herein. The photoresist structure 118 may, for example, be compatible with 13.7 nm, 157 nm, 193 nm, 248 nm, or 365 nm wavelength systems; with 193 nm wavelength immersion systems; and/or with electron beam lithographic systems.

The photoresist structure 118 may be formed using conventional processes (e.g., conventional deposition processes, such as one or more PVD, CVD, ALD, and spin-coating; conventional photolithography processes; conventional material removal processes). Such processes are known in the art and, therefore, are not described in detail herein.

Figure 3A:
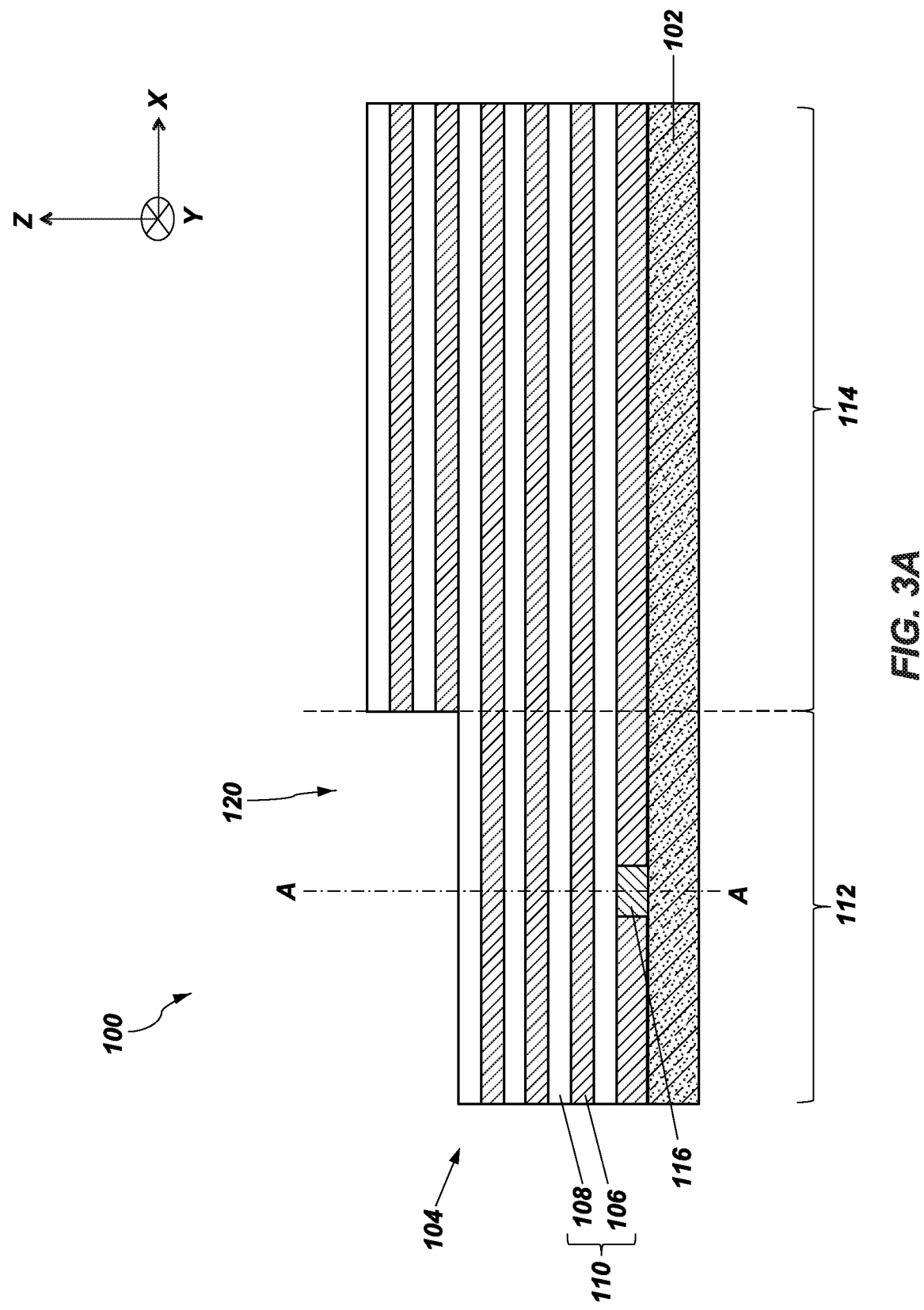
Figure 3B:
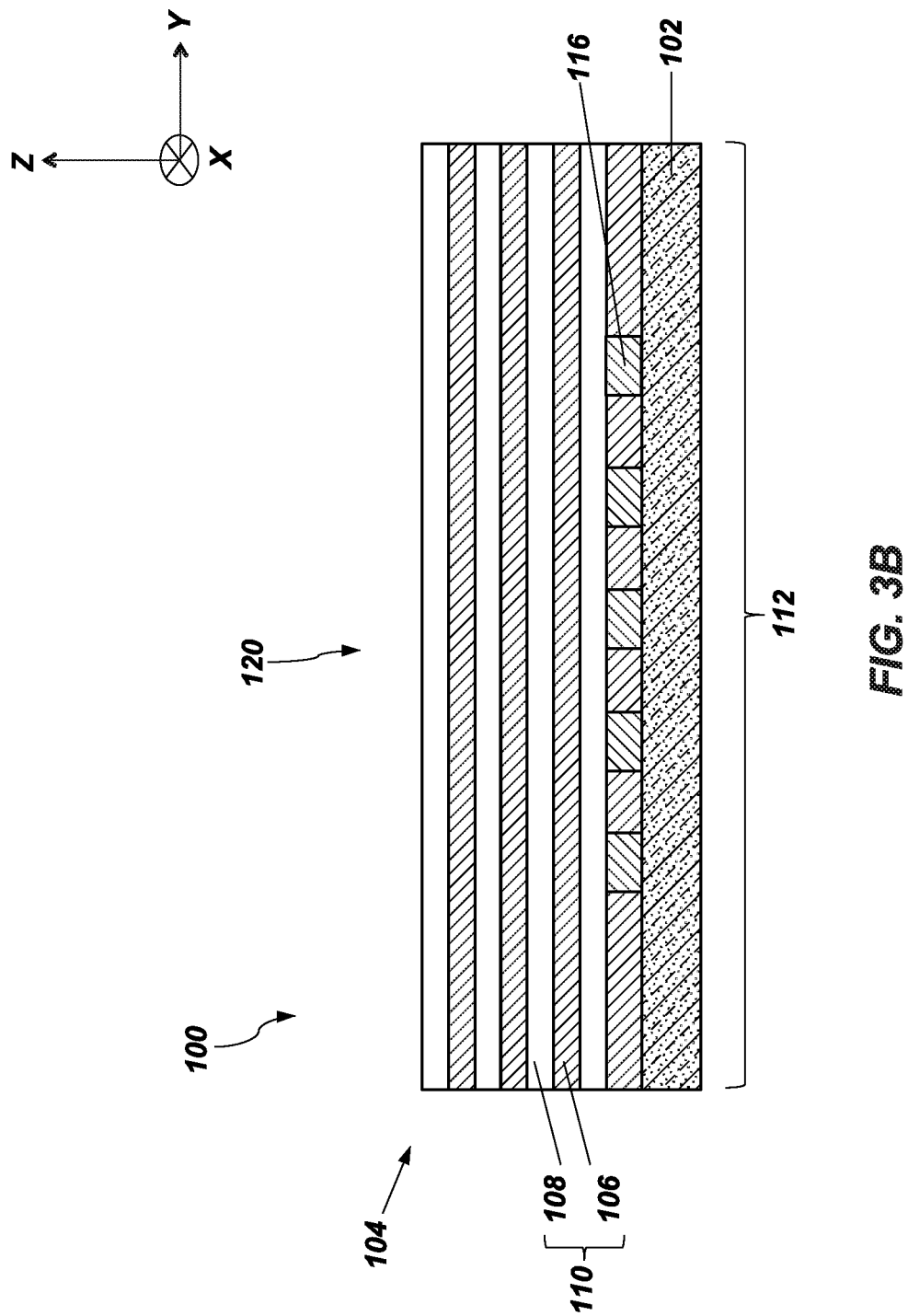

Referring next to FIG. 3A, the microelectronic device structure 100 may be subjected to a material removal process to selectively remove portions of relatively vertically higher tiers 110 (e.g., uppermost tiers) of the first preliminary stack structure 104 within the memory array region 112 of the microelectronic device structure 100. As shown in FIG. 3A, the material removal process may form a recess 120 (e.g., a trench, opening) partially vertically extending into the first preliminary stack structure 104 within the memory array region 112 of the microelectronic device structure 100. The photoresist structure 118 (FIG. 2A) may be employed as a mask during the material removal process to impede or prevent removal of additional portions of the relatively vertically higher tiers 110 of the first preliminary stack structure 104 within the staircase region 114 of the microelectronic device structure 100. Accordingly, the recess 120 may be formed to be substantially confined within the memory array region 112, such that the recess 120 does not substantially horizontally extend into the staircase region 114 of the microelectronic device structure 100. Following the formation of the recess 120, remaining (e.g., unremoved) portions of the photoresist structure 118 (FIG. 2A), if any, may be removed. FIG. 3B is a simplified partial cross-sectional view of the microelectronic device structure 100 at the processing stage depicted in FIG. 3A about the line A-A shown in FIG. 3A.

The material removal process may be controlled to remove portions (e.g., portions not protected by the photoresist structure 118 (FIG. 2A)) of a desired number of the tiers 110 of the first preliminary stack structure 104. As shown in FIG. 3A, in some embodiments, the material removal process removes portions of two (2) relatively vertically highest tiers 110 (e.g., two (2) uppermost tiers) of the first preliminary stack structure 104, including portions of the first insulative structures 106 and the second insulative structures 108 thereof. In additional embodiments, the material removal process may remove portions of a different number of relatively vertically higher tiers 110 of the first preliminary stack structure 104. As a non-limiting example, the material removal process may be controlled to remove portions of a single (e.g., only one) relatively vertically highest tier 110 (e.g., an uppermost tier) of the first preliminary stack structure 104. As another non-limiting example, the material removal process may be controlled to remove portions of more than two (2) relatively vertically highest tiers 110 of the first preliminary stack structure 104, such as portions of three (3) relatively vertically highest tiers 110 (e.g., three (3) uppermost tiers) of the first preliminary stack structure 104, portions of four (4) relatively vertically highest tiers 110 (e.g., four (4) uppermost tiers) of the first preliminary stack structure 104, or greater than or equal to five (5) relatively vertically highest tiers 110 (e.g., five (5) uppermost tiers) of the first preliminary stack structure 104.

Portions of relatively vertically higher tiers 110 of the first preliminary stack structure 104 within the memory array region 112 of the microelectronic device structure 100 may be removed using conventional material removal processes (e.g., conventional etching processes, such as a conventional anisotropic etching processes), which are not described in detail herein. For example, a portion of an uppermost tier 110 of the first preliminary stack structure 104 within the memory array region 112 of the microelectronic device structure 100 may be removed using an etching cycle that includes removing an exposed portion of the second insulative structure 108 of the uppermost tier 110 using a first etching act (e.g., a first anisotropic etching act), and then removing an exposed portion of the first insulative structure 106 of the uppermost tier 110 using a second etching act (e.g., a second anisotropic etching act). Portions of one or more additional tiers 110 of the first preliminary stack structure 104 within the memory array region 112 may then be removed using one or more additional etching cycles similar to the etching cycle to form the recess 120 to a desired vertical depth within the memory array region 112 of the microelectronic device structure 100.

Following the formation of the recess 120 vertically extending into the first preliminary stack structure 104, remaining portions to the photoresist structure 118 (FIG. 2A), if any, may be selectively removed using one or more conventional material removal processes, which are not described in detail herein. For example, the microelectronic device structure 100 may be exposes to a developer (e.g., a positive tone developer, a negative tone developer) formulated to selectively remove (e.g., develop) the remaining portions to the photoresist structure 118 (FIG. 2A). Suitable developers are known in the art, and are therefore not described in detail herein.

Figure 4A:
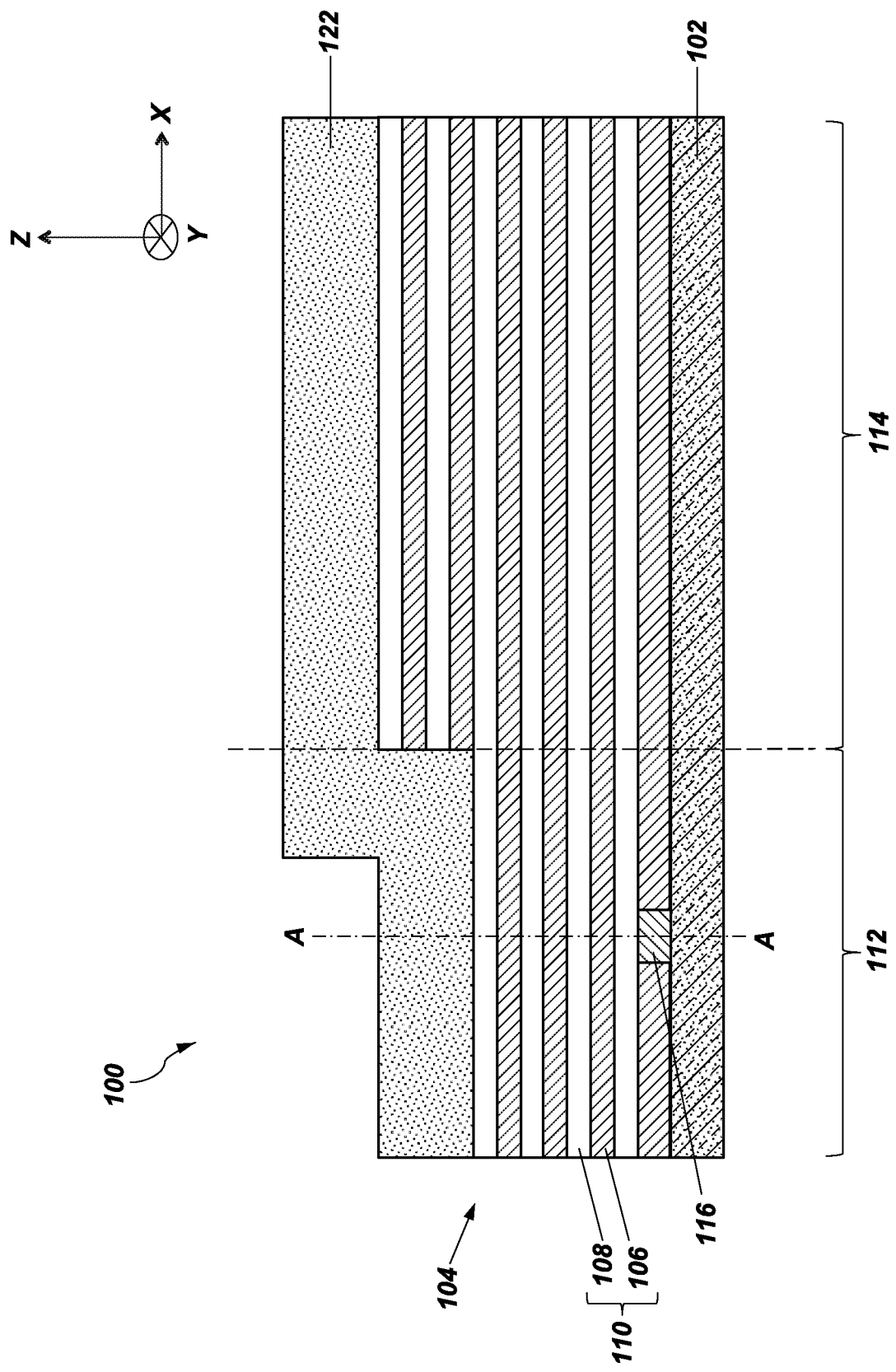
Figure 4B:
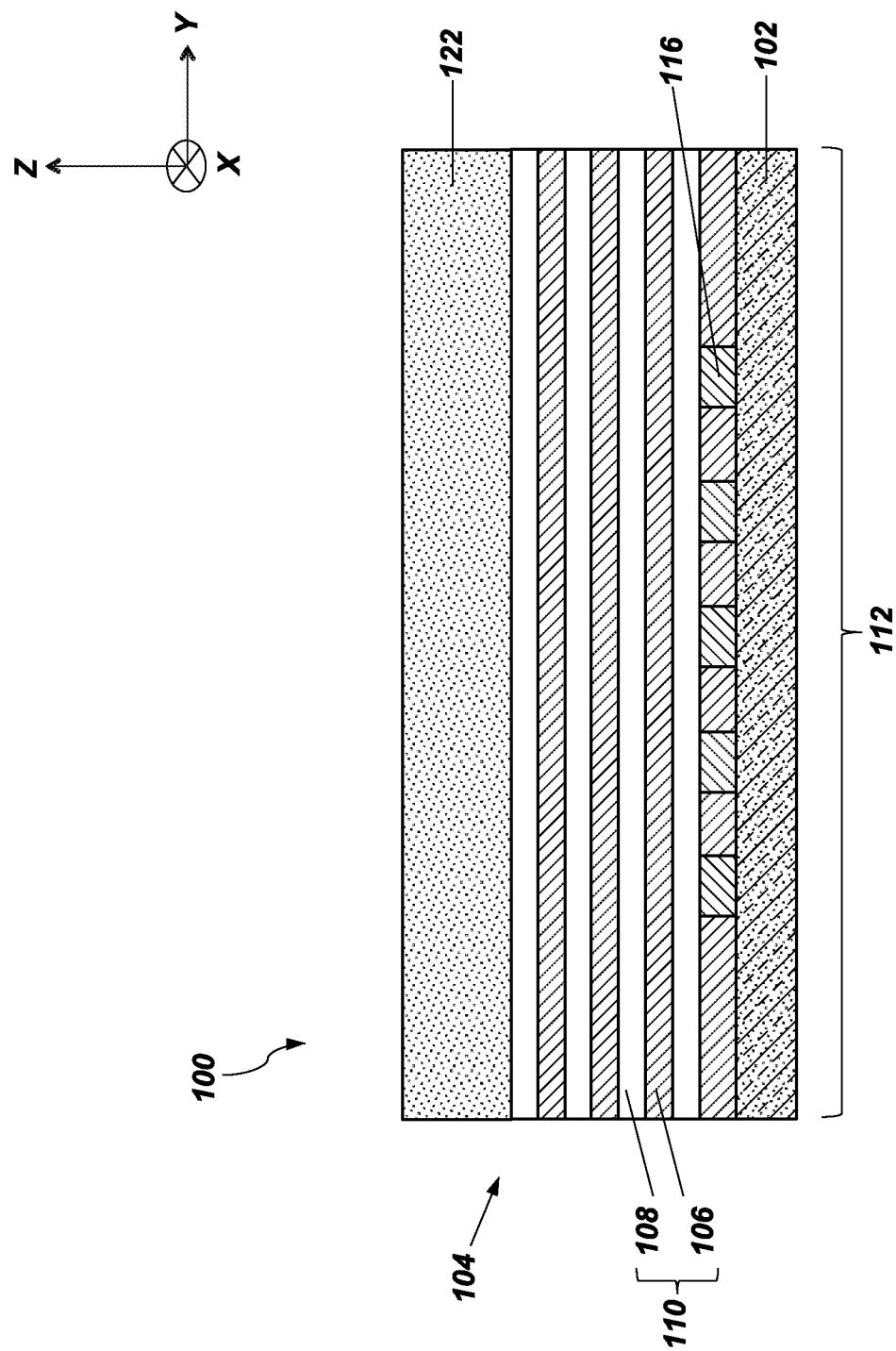

Referring next to FIG. 4A, a dielectric fill material 122 may be formed on or over exposed surfaces of the first preliminary stack structure 104 inside and outside of the recess 120 (FIG. 3A). As shown in FIG. 4A, the dielectric fill material 122 may be formed to cover and substantially extend (e.g., substantially continuously extend) across surfaces of the first preliminary stack structure 104 within the memory array region 112 and the staircase region 114 of the microelectronic device structure 100. The dielectric fill material 122 may substantially fill the recess 120 (FIG. 3A) within the memory array region 112; and may cover and substantially extend across surfaces of the first preliminary stack structure 104 at and outside of the boundaries (e.g., horizontal boundaries, vertical boundaries) of the recess 120 (FIG. 3A), such as surfaces at and within boundaries of the staircase region 114 of the microelectronic device structure 100. The dielectric fill material 122 may at least partially (e.g., substantially) conform to a topography defined by the surfaces (e.g., horizontal surfaces, vertical surfaces) upon which the dielectric fill material 122 is formed. FIG. 4B is a simplified partial cross-sectional view of the microelectronic device structure 100 at the processing stage depicted in FIG. 4A about the line A-A shown in FIG. 4A.

The dielectric fill material 122 may be formed of and include at least one dielectric material. A material composition of the dielectric fill material 122 may be selected relative to material compositions of the second insulative structures 108 of the preliminary stack structure 100 such that the second insulative structures 108 and the dielectric fill material 122 may be selectively removed relative to one another. The second insulative structures 108 may be selectively etchable relative to the dielectric fill material 122 during common (e.g., collective, mutual) exposure to a first etchant, and the dielectric fill material 122 may be selectively etchable to the second insulative structures 108 during common exposure to a second, different etchant. A material composition of the dielectric fill material 122 is different than material composition(s) of the second insulative structures 108, and may comprise one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). A material composition of the dielectric fill material 122 may be selected to be substantially the same as a material composition of one or more (e.g., each) of the first insulative structures 106 of the first preliminary stack structure 104, or may be selected to be different than material compositions of the first insulative structures 106 of the first preliminary stack structure 104. In some embodiments, the dielectric fill material 122 is formed of and includes a dielectric oxide material (e.g., $SiO_x$, such as $SiO_2$). The dielectric fill material 122 may include a substantially homogeneous distribution of dielectric material, or a substantially heterogeneous distribution of dielectric material. In some embodiments, the dielectric fill material 122 exhibits a substantially homogeneous distribution of dielectric material. In additional embodiments, the dielectric fill material 122 exhibits a substantially heterogeneous distribution of dielectric material. The dielectric fill material 122 may, for example, be formed of and include a stack (e.g., laminate) of at least two different dielectric materials.

The dielectric fill material 122 may be formed (e.g., conformally formed) using conventional processes (e.g., conventional conformal deposition processes), which are not described in detail herein. By way of non-limiting example, the dielectric fill material 122 may be formed by way of one or more of a conventional CVD process (e.g., a conventional PECVD process) and a conventional ALD process. In some embodiments, the dielectric fill material 122 is formed on exposed surfaces of the first preliminary stack structure 104 using a PECVD process.

Figure 5A:
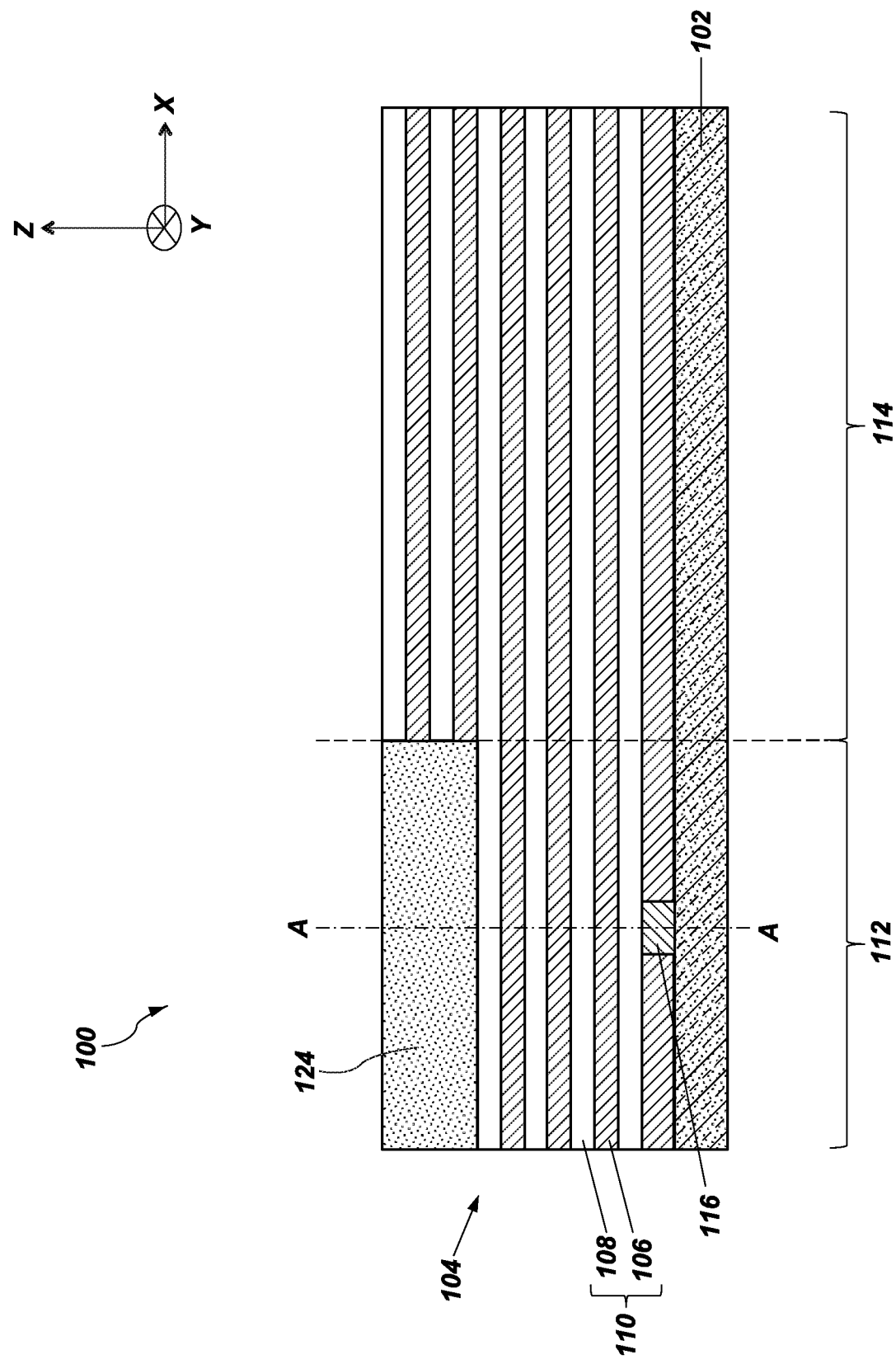

Referring next to FIG. 5A, portions of the dielectric fill material 122 (FIG. 4A) outside of the boundaries (e.g., horizontal boundaries, vertical boundaries) of the recess 120 (FIG. 3A) may be removed while retaining additional portions of the dielectric fill material 122 (FIG. 4A) inside of the boundaries of the recess 120 (FIG. 3A) to form at least one interdeck dielectric structure 124. As shown in FIG. 5A, the removal process may expose uppermost surfaces of the first preliminary stack structure 104 within the staircase region 114 of the microelectronic device structure 100. An uppermost boundary (e.g., an uppermost surface) of the interdeck dielectric structure 124 within the memory array region 112 of the microelectronic device structure 100 may be substantially coplanar with an uppermost boundary (e.g., an uppermost surface) of the first preliminary stack structure 104 within the staircase region 114 of the microelectronic device structure 100. FIG. 5B is a simplified partial cross-sectional view of the microelectronic device structure 100 at the processing stage depicted in FIG. 5A about the line A-A shown in FIG. 5A.

As shown in FIG. 5A, the interdeck dielectric structure 124 may be substantially confined within horizontal boundaries of the memory array region 112 of the microelectronic device structure 100. Put another way, the interdeck dielectric structure 124 is formed such that the interdeck dielectric structure 124 does not substantially horizontally extend into the staircase region 114 of the microelectronic device structure 100. Substantially confining the interdeck dielectric structure 124 within horizontal boundaries of the memory array region 112 may for example, alleviate conventional problems and complexities with the formation of staircase structures within the staircase region 114 of the microelectronic device structure 100, as described in further detail below.

Portions of the dielectric fill material 122 (FIG. 4A) outside of the boundaries (e.g., horizontal boundaries, vertical boundaries) of the recess 120 (FIG. 3A) may be removed to form the interdeck dielectric structure 124 using conventional processes (e.g., conventional planarization processes), which are not describe in detail herein. For example, portions of the dielectric fill material 122 (FIG. 4A) outside of the boundaries of the recess 120 (FIG. 3A) may be removed using at least one chemical-mechanical planarization (CMP) process to form the interdeck dielectric structure 124.

Figure 6A:
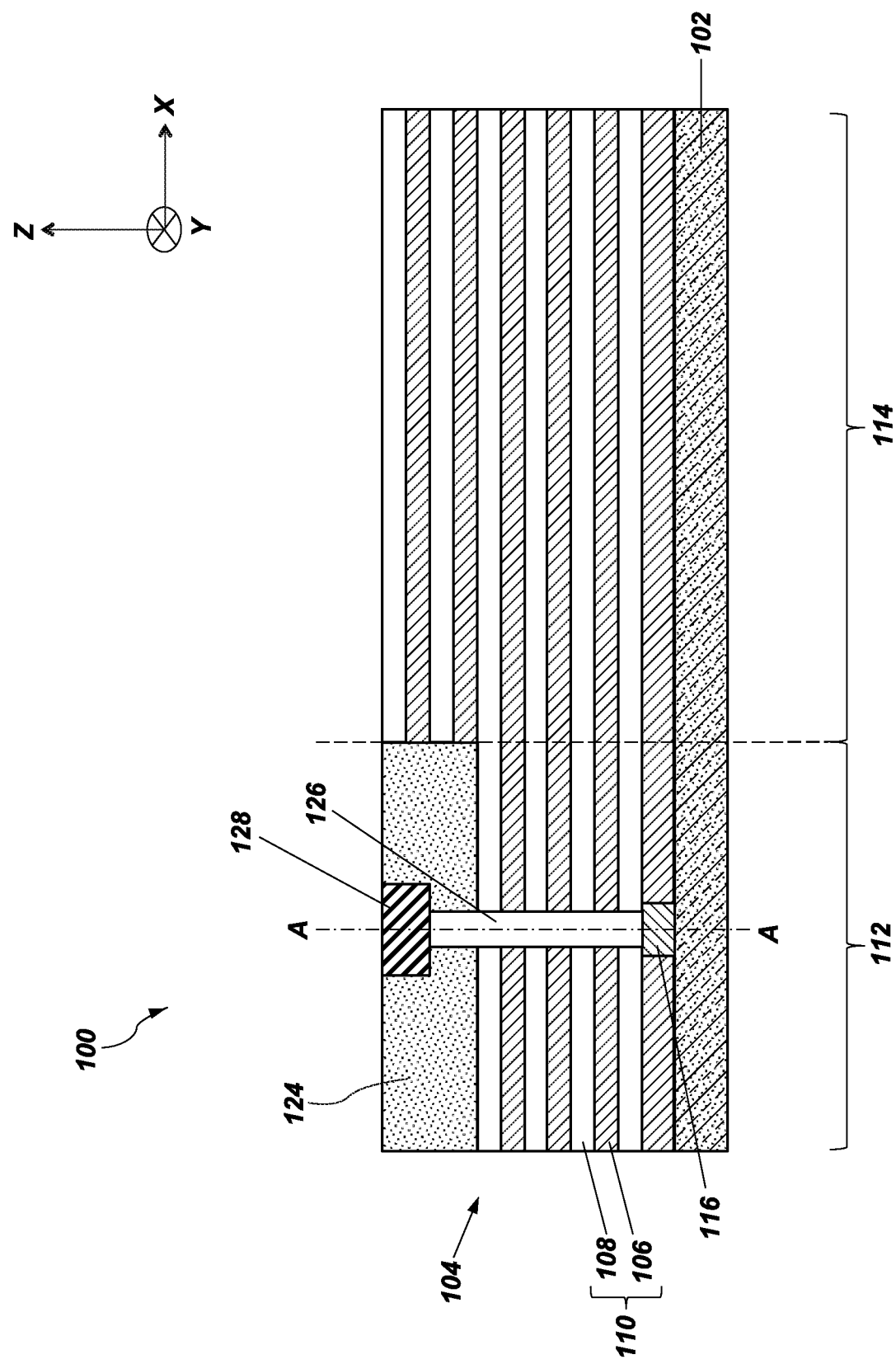

Referring next to FIG. 6A, openings 126 (e.g., vias) may be formed within the memory array region 112 of the microelectronic device structure 100, and plug structures 128 may be formed at upper vertical boundaries (e.g., in the Z-direction) of the openings 126 to substantially plug (e.g., cover) the openings 126. FIG. 6B is a simplified partial cross-sectional view of the microelectronic device structure 100 at the processing stage depicted in FIG. 6A about the line A-A shown in FIG. 6A.

As shown in FIG. 6B, the openings 126 may vertically extend (e.g., in the Z-direction) through the interdeck dielectric structure 124 and portions of the first preliminary stack structure 104 vertically underlying interdeck dielectric structure 124 to the contact structures 116 within the memory array region 112 of the microelectronic device structure 100. Each of the openings 126 may be at least partially (e.g., substantially) horizontally aligned (e.g., in the X-direction and in the Y-direction) with one of the contact structures 116 vertically thereunder. Lower vertical boundaries of the openings 126 may be defined by surfaces (e.g., upper surfaces) of the contact structures 116, and horizontal boundaries of the openings 126 may be defined by surfaces (e.g., side surfaces) of the first preliminary stack structure 104 (e.g., surfaces of the first insulative structures 106 and the second insulative structures 108 of the tiers 110 thereof) and the interdeck dielectric structure 124. The openings 126 may subsequently be filled with material to form pillar structures within the memory array region 112 of the microelectronic device structure 100, as described in further detail below.

Each of the openings 126 may individually be formed to exhibit a desired geometric configuration (e.g., a desired shape, and desired dimensions). In some embodiments, each of the openings 126 is individually formed to exhibit a columnar shape (e.g., a circular column shape, a rectangular column shape, an ovular column shape, a pillar shape), and is sized and positioned to expose a single (e.g., only one) contact structure 116. For example, each of the openings 126 may individually exhibit a circular column shape having a substantially circular horizontal cross-sectional area sized and positioned to at least partially (e.g., substantially) be located within horizontal boundaries of the contact structure 116 at least partially exposed thereby. In some embodiments, each of the openings 126 is substantially confined within horizontal boundaries of the contact structure 116 defining a lower vertical boundary of the opening 126. In additional embodiments, one or more of the openings 126 horizontally extends (e.g., in the X-direction and/or the Y-direction) past horizontal boundaries of the contact structure 116 defining a portion of a lower vertical boundary of the opening 126.

A desired quantity of the openings 126 may be formed in the memory array region 112 of the microelectronic device structure 100. In some embodiments, a quantity of the openings 126 formed in the memory array region 112 is the same as a quantity of the contact structures 116 within the memory array region 112. In additional embodiments, a quantity of the openings 126 formed in the memory array region 112 is different than a quantity of the contact structures 116 within the memory array region 112. For example, a quantity of the openings 126 may be less than a quantity of the contact structures 116, such that less than all of the contact structures 116 are exposed by the openings 126.

The openings 126 may be formed using conventional processes (e.g., conventional photolithographic patterning processes, conventional etching processes) and conventional processing equipment, which are not described in detail herein.

With continued reference to FIG. 6B, the plug structures 128 may vertically extend (e.g., in the Z-direction) into the interdeck dielectric structure 124 and may plug the openings 126. The plug structures 128 may be configured and positioned to protect the openings 126 from being filled with material during additional processing acts to form an additional preliminary stack structure over the first preliminary stack structure 104, as described in further detail below. Each of the plug structures 128 may be at least partially (e.g., substantially) horizontally aligned (e.g., in the X-direction and in the Y-direction) with one of the openings 126 vertically thereunder. Lower vertical boundaries of the plug structures 128 may be defined by upper vertical boundaries of remaining, unfilled portions of the openings 126 and horizontally extending surfaces of interdeck dielectric structure 124 vertically above a lowermost vertical boundary of the interdeck dielectric structure 124. The plug structures 128 may be confined within vertical boundaries (e.g., upper vertical boundaries, lower vertical boundaries) of the interdeck dielectric structure 124. For example, the plug structures 128 may not vertically extend into portions of the first preliminary stack structure 104 vertically underlying the interdeck dielectric structure 124. Horizontal boundaries of the plug structures 128 may be defined by vertically extending surfaces (e.g., side surfaces) of the interdeck dielectric structure 124.

Each of the plug structures 128 may individually be formed to exhibit a desired geometric configuration (e.g., a desired shape, and desired dimensions) facilitating plugging (e.g., enclosing) at least one of the openings 126 thereunder. In some embodiments, each of the plug structures 128 is individually formed to exhibit a columnar shape (e.g., a circular column shape, a rectangular column shape, an ovular column shape, a pillar shape), and is sized and positioned to plug a single (e.g., only one) opening 126. For example, each of the plug structures 128 may individually exhibit a circular column shape having a substantially circular horizontal cross-sectional area sized and positioned to completely cover a horizontal cross-sectional area of the opening 126 plugged thereby. Each of the plug structures 128 may extend beyond horizontal boundaries of the opening 126 plugged thereby. In additional embodiments, one or more of the plug structures 128 may exhibit a different shape and/or a different size so long as the one or more of the plug structures 128 plug the openings 126 operatively associated therewith (e.g., within horizontal boundaries thereof).

The plug structures 128 may each individually be formed of and include at least one material able to bridge an upper portion of the opening 126 operatively associated therewith (e.g., plugged thereby) within the interdeck dielectric structure 124, and able to protect a lower portion of the opening 126 within the first preliminary stack structure 104 from begin filled with material during additional processing acts to form a second preliminary stack structure over the first preliminary stack structure 104. The plug structures 128 may, for example, comprise one or more of at least one semiconductive material (e.g., a silicon material, such as polysilicon), at least one conductive material (e.g., at least one metal, such as one or more of W, Ti, Mo, Nb, V, Hf, Ta, Cr, Zr, Fe, Ru, Os, Co, Rh, Ir, Ni, Pa, Pt, Cu, Ag, Au, and Al; at least one alloy, such as one or more of a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, and stainless steel; at least one conductive metal-containing material, such as one or more of a conductive metal nitride, a conductive metal silicide, a conductive metal carbide, and a conductive metal oxide; and at least one conductively doped semiconductor material, such as one or more of conductively doped silicon, conductively doped germanium, and conductively doped silicon-germanium), and at least one dielectric material (e.g., one or more of a dielectric oxide, a dielectric nitride, a dielectric oxynitride, and a dielectric carboxynitride). In some embodiments, the plug structures 128 are formed of and include polysilicon. In additional embodiments, the plug structures 128 are formed of and include tungsten (W). In further embodiments, the plug structures 128 are formed of and include titanium nitride (TiN).

The plug structures 128 may be formed using conventional processes (e.g., conventional material removal processes, such as conventional etching processes and conventional planarization processes; conventional deposition processes, such as conventional non-conformal deposition processes) and conventional processing equipment, which are not described in detail herein. By way of non-limiting example, following the formation of the openings 126, the interdeck dielectric structure 124 may be subjected to an etching process to expand (e.g., increase) horizontal dimensions of upper portions of the openings 126 vertically positioned within the interdeck dielectric structure 124; a plug material may be non-conformally formed inside and outside of the horizontally expanded, upper portions of the openings 126, and may bridge and close off the openings 126 without vertically extending into and filling portions of the openings 126 vertically below the interdeck dielectric structure 124; and then portions of the plug material overlying upper vertical boundaries of the interdeck dielectric structure 124 may be removed (e.g., by way of a planarization process, such as a CMP process) to form the plug structures 128.

Figure 7A:
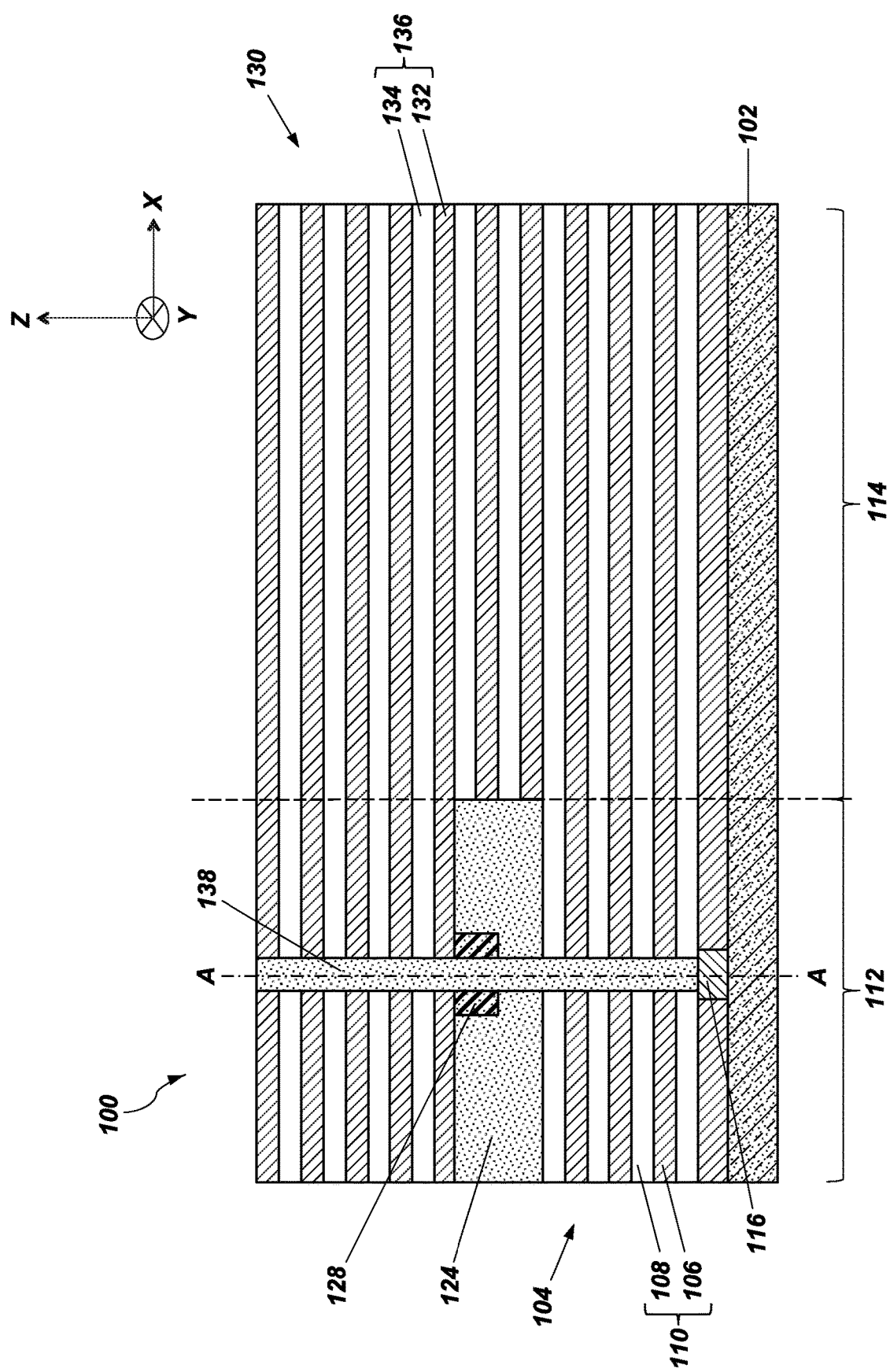

Referring next to FIG. 7A, a second preliminary stack structure 130 may be formed on or over the first preliminary stack structure 104, the interdeck dielectric structure 124, and the plug structures 128; and then pillar structures 138 may be formed to vertically extend through the second preliminary stack structure 130, the plug structures 128, the interdeck dielectric structure 124, and the first preliminary stack structure 104 within the memory array region 112 of the microelectronic device structure 100. As shown in FIG. 7A, the second preliminary stack structure 130 may horizontally extend through the memory array region 112 and the staircase region 114 of the microelectronic device structure 100, and the pillar structures 138 may be horizontally confined within the memory array region 112 of the microelectronic device structure 100. FIG. 7B is a simplified partial cross-sectional view of the microelectronic device structure 100 at the processing stage depicted in FIG. 7A about the line A-A shown in FIG. 7A.

The second preliminary stack structure 130 may be formed to include a vertically alternating (e.g., in the Z-direction) sequence of additional first insulative structures 132 and additional second insulative structures 134 arranged in additional tiers 136. Each of the additional tiers 136 of the second preliminary stack structure 130 may include at least one of the additional first insulative structures 132 vertically neighboring at least one of the additional second insulative structures 134. The second preliminary stack structure 130 may include a desired quantity of the additional tiers 136. For example, the second preliminary stack structure 130 may include greater than or equal to ten (10) of the additional tiers 136, greater than or equal to twenty-five (25) of the additional tiers 136, greater than or equal to fifty (50) of the additional tiers 136, greater than or equal to one hundred (100) of the additional tiers 136, greater than or equal to one hundred and fifty (150) of the additional tiers 136, or greater than or equal to two hundred (200) of the additional tiers 136 of the additional first insulative structures 132 and the additional second insulative structures 134. A quantity of the additional tiers 136 of the second preliminary stack structure 130 may be equal to (e.g., the same as) a quantity of the tiers 110 of the first preliminary stack structure 104, or a quantity of the additional tiers 136 of the second preliminary stack structure 130 may be different than (e.g., less than, greater than) a quantity of the tiers 110 of the first preliminary stack structure 104.

The additional first insulative structures 132 of the second preliminary stack structure 130 may have an etch selectivity substantially similar to an etch selectivity of the first insulative structures 106 of the first preliminary stack structure 104. For example, a material composition of the additional first insulative structures 132 may be substantially the same as a material composition of the first insulative structures 106. The etch selectivity of the additional first insulative structures 132 may also be substantially similar to an etch selectivity of the interdeck dielectric structure 124. For example, the material composition of the additional first insulative structures 132 may be substantially the same as the material composition of the interdeck dielectric structure 124. In some embodiments, each of the additional first insulative structures 132 of the second preliminary stack structure 130 is formed of and includes a dielectric oxide material, such as $SiO_x$ (e.g., $SiO_2$).

The additional second insulative structures 134 of the second preliminary stack structure 130 may have an etch selectivity substantially similar to an etch selectivity of the second insulative structures 108 of the first preliminary stack structure 104. For example, a material composition of the additional second insulative structures 134 may be substantially the same as a material composition of the second insulative structures 108. The etch selectivity of the additional second insulative structures 134 may be different than etch selectivities of the first insulative structures 106 of the first preliminary stack structure 104, the interdeck dielectric structure 124, and the additional first insulative structures 132 of the second preliminary stack structure 130. The additional second insulative structures 134 and the second insulative structures 108 may be selectively etchable relative to the first insulative structures 106, the interdeck dielectric structure 124, and the additional first insulative structures 132 during common (e.g., collective, mutual) exposure to a first etchant; and the first insulative structures 106, the interdeck dielectric structure 124, and the additional first insulative structures 132 may be selectively etchable to the additional second insulative structures 134 and the second insulative structures 108 during common exposure to a second, different etchant. In some embodiments, each of the additional second insulative structures 134 of the second preliminary stack structure 130 is formed of and includes a dielectric nitride material, such as $SiN_y$ (e.g., $Si_3N_4$).

The second preliminary stack structure 130, including the additional tiers 136 of the additional first insulative structures 132 and the additional second insulative structures 134 thereof, may be formed using conventional processes (e.g., conventional material deposition processes), and conventional processing equipment, which are not described in detail herein.

As shown in FIG. 7B, within the memory array region 112 of the microelectronic device structure 100, the pillar structures 138 may be formed to vertically extend from an upper surface of the second preliminary stack structure 130 to upper surfaces of the contact structures 116. The pillar structures 138 may at least partially (e.g., substantially) land on and physically contact the contact structures 116. The pillar structures 138 may be formed to substantially fill remaining portions of the openings 126 (FIGS. 6A and 6B) vertically extending through the interdeck dielectric structure 124 and the first preliminary stack structure 104, as well as additional openings formed to vertically extend through the second preliminary stack structure 130 and the plug structures 128 to connect to the openings 126 (FIGS. 6A and 6B). Put another way, the pillar structures 138 may be formed to substantially fill relatively larger openings each individually formed from a combination of one of the openings 126 (FIGS. 6A and 6B) and an additional opening formed to vertically extend through the second preliminary stack structure 130 and the plug structures 128 to an unfilled portion of the one of the openings 126 (FIGS. 6A and 6B).

The pillar structures 138 may each individually be formed of and include one or more materials facilitating the formation of vertical strings of memory cells within the memory array region 112 for the microelectronic device structure 100 following subsequent processing (e.g., so called "replacement gate" or "gate last" processing) of the microelectronic device structure 100, as described in further detail below. By way of non-limiting example, each of the pillar structures 138 may individually be formed to include a semiconductive structure (e.g., a semiconductive pillar) at least partially horizontally surrounded by at least one charge storage structure. The semiconductive structure may, for example, comprise a polysilicon structure (e.g., a polysilicon pillar) or a silicon-germanium structure (e.g., a silicon-germanium pillar). The charge storage structure may, for example, comprise a charge trapping structure (e.g., a charge trapping structure comprising an oxide-nitride-oxide ("ONO") material).

The pillar structures 138, including the semiconductive structures and the charge storage structures thereof, may be formed using conventional processes (e.g., conventional material deposition processes, conventional material removal processes), and conventional processing equipment, which are not described in detail herein.

Figure 8A:
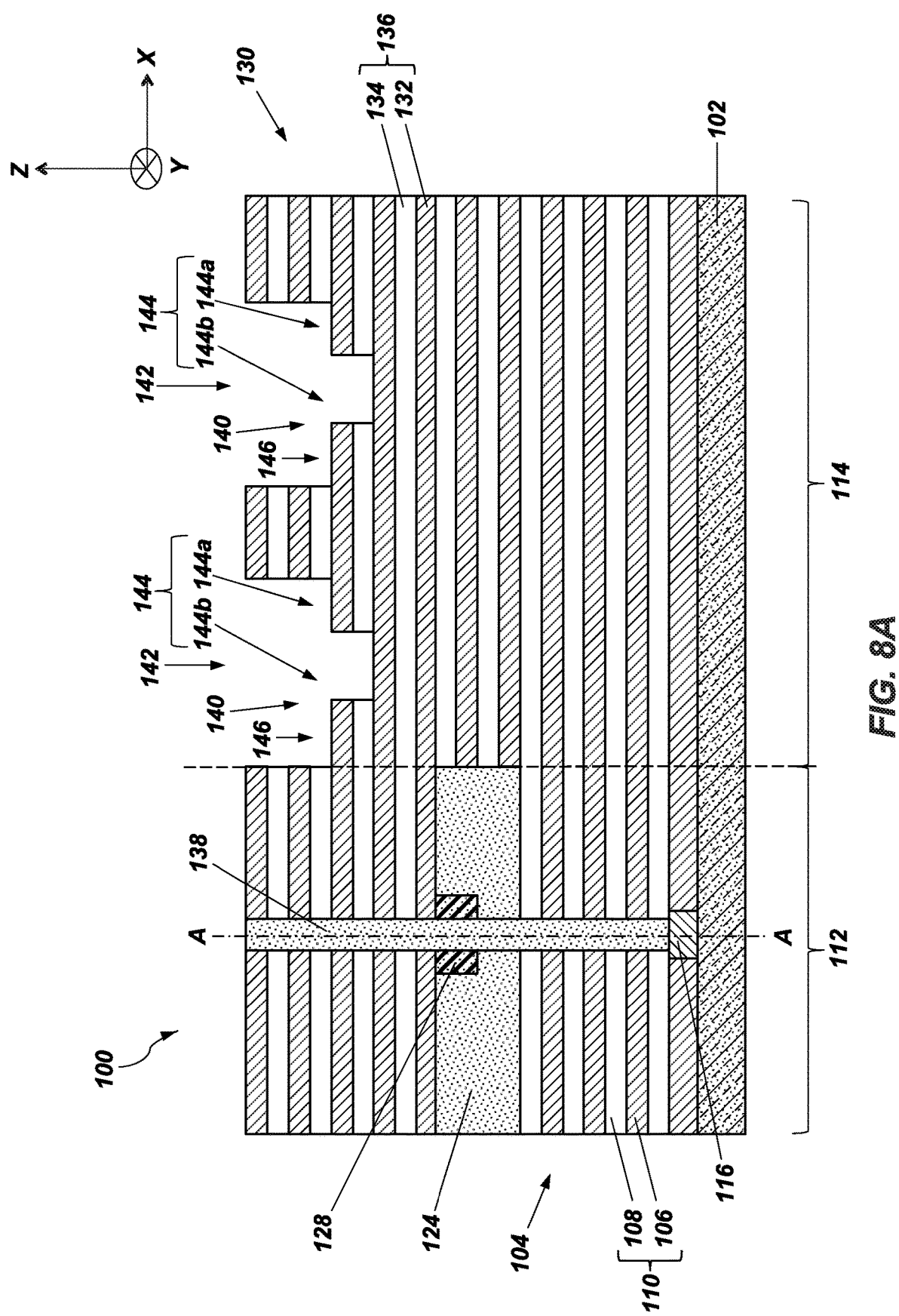
Figure 8B:
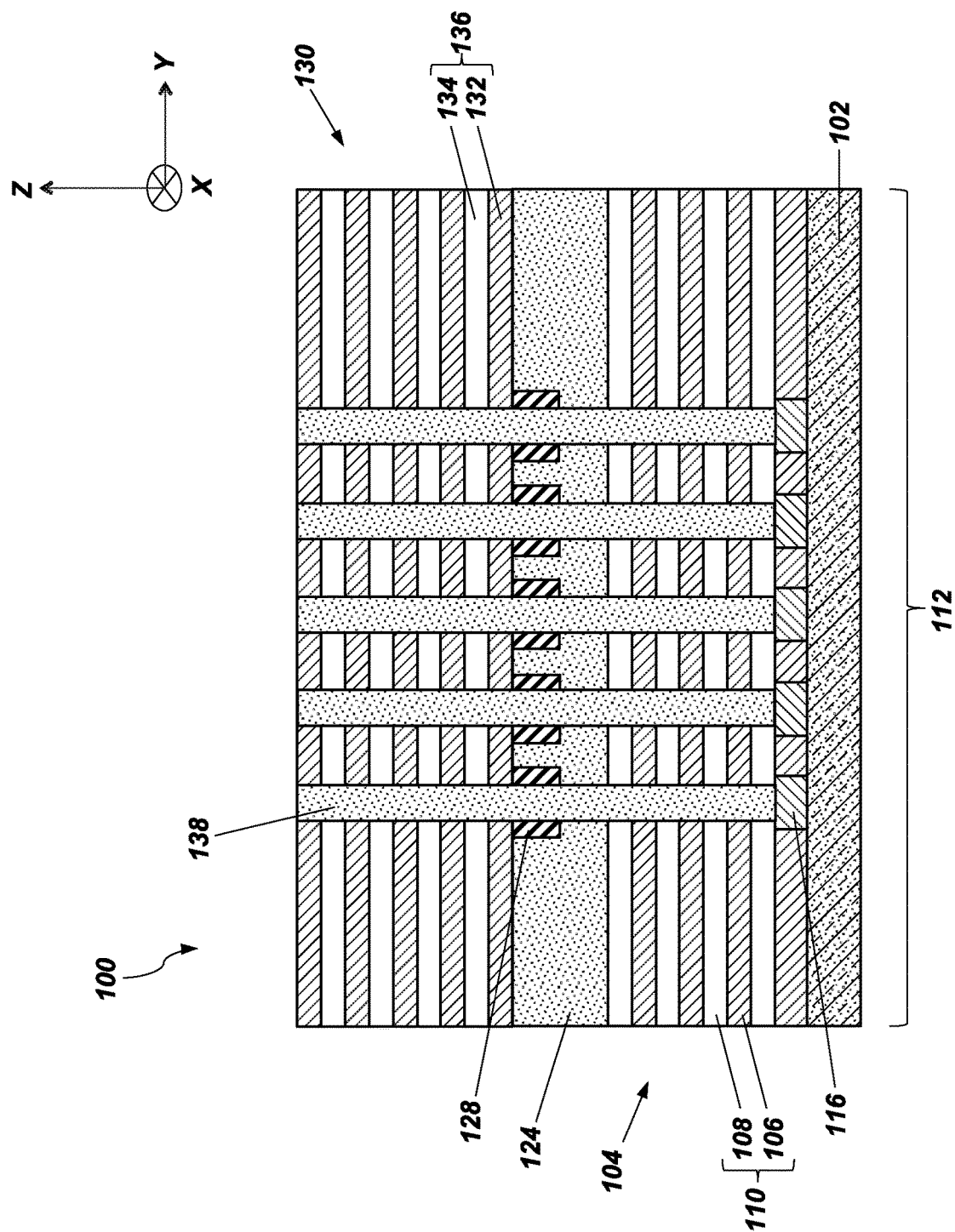

Referring next to FIG. 8A, upper stadium structures 140 may be formed within portions of the second preliminary stack structure 130 within horizontal boundaries of the staircase region 114 of the microelectronic device structure 100. The upper stadium structures 140 may each individually include opposing staircase structures 144 each having steps 146 defined by horizontal ends of the additional tiers 136 of the second preliminary stack structure 130. Boundaries (e.g., vertical boundaries, horizontal boundaries) of trenches 142 (e.g., openings) formed to vertically extend into the second preliminary stack structure 130 may be at least partially defined by the upper stadium structures 140. The trenches 142 may each individually horizontally intervene between the opposing staircase structures 144 of one of the upper stadium structures 140. FIG. 8B is a simplified partial cross-sectional view of the microelectronic device structure 100 at the processing stage depicted in FIG. 8A about the line A-A shown in FIG. 8A.

As shown in FIG. 8A, multiple (e.g., more than one) upper stadium structures 140 may be formed to be positioned at substantially the same elevations (e.g., vertical locations) as one another within the second preliminary stack structure 130. In some embodiments, vertical boundaries (e.g., uppermost vertical boundaries, lowermost vertical boundaries) at least one of the upper stadium structures 140 are substantially the same as vertical boundaries (e.g., uppermost vertical boundaries, lowermost vertical boundaries) of at least one other of the upper stadium structures 140. In additional embodiments, at least one of the upper stadium structures 140 is formed to be positioned at one or more different elevations (e.g., vertical locations) within the second preliminary stack structure 130 than at least one other of the upper stadium structures 140. For example, at least one of the upper stadium structures 140 may be formed to exhibit at least one different vertical boundary (e.g., a different uppermost vertical boundary, a different lowermost vertical boundary) than at least one other of the upper stadium structures 140.

Any desired quantity and distribution (e.g., spacing and arrangement) of the upper stadium structures 140 may be formed in portions of the second preliminary stack structure 130 within the staircase region 114 of the microelectronic device structure 100. As shown in FIG. 8A, in some embodiments, two (2) of the upper stadium structures 140 are formed in portions of the second preliminary stack structure 130 within the staircase region 114 of the microelectronic device structure 100. In additional embodiments, more than two (2) (e.g., greater than or equal to three (3), greater than or equal to four (4), greater than or equal to five (5), greater than or equal to ten (10), greater than or equal to twenty-five (25)) of the upper stadium structures 140 are formed in portions of the second preliminary stack structure 130 within the staircase region 114 of the microelectronic device structure 100. In such embodiment, the upper stadium structures 140 may be substantially uniformly (e.g., equally, even) spaced, such that each of the upper stadium structures 140 is separated from at each other of the upper stadium structures 140 horizontally neighboring (e.g., in the X-direction) the stadium structure 12 substantially the same distance; or the upper stadium structures 140 may be at least partially non-uniformly (e.g., non-equally, non-evenly) spaced, such that at least one of the upper stadium structures 140 is separated from at least two other of the upper stadium structures 140 horizontally neighboring (e.g., in the X-direction) the upper stadium structure 140 by different (e.g., non-equal) distances.

As shown in FIG. 8A, the opposing staircase structure 144 of each of the upper stadium structures 140 may individually include a forward staircase structure 144a and a reverse staircase structure 144b that mirrors the forward staircase structure 144a. A phantom line extending from a top of the forward staircase structure 144a to a bottom of the forward staircase structure 144a may have a positive slope, and another phantom line extending from a top of the reverse staircase structure 144b to a bottom of the reverse staircase structure 144b may have a negative slope. In additional embodiments, one or more (e.g., each) of the upper stadium structures 140 may be modified to include a forward staircase structure 144a but not a reverse staircase structure 144b (e.g., the reverse staircase structure 144b may be absent). In additional embodiments, one or more (e.g., each) of the upper stadium structures 140 may be modified to include a reverse staircase structure 144b but not a forward staircase structure 144a (e.g., the forward staircase structure 144a may be absent).

Each of the upper stadium structures 140 may individually be formed to include a desired quantity of the steps 146. Each of the upper stadium structures 140 may include substantially the same quantity of steps 146 as each other of the upper stadium structures 140, or at least one of the upper stadium structures 140 may include a different quantity of steps 146 than at least one other of the upper stadium structures 140. In some embodiments, the steps 146 of each of the upper stadium structures 140 are arranged in order, such that steps 146 horizontally neighboring (e.g., in the X-direction) one another correspond to additional tiers 136 of the second preliminary stack structure 130 vertically neighboring (e.g., in the Z-direction) one another. In additional embodiments, the steps 146 of one or more of the upper stadium structures 140 are arranged out of order, such that at least some steps 146 of upper stadium structures 140 horizontally neighboring (e.g., in the X-direction) one another correspond to tiers 136 of the second preliminary stack structure 130 not vertically neighboring (e.g., in the Z-direction) one another.

The upper stadium structures 140 may be formed in portions of the second preliminary stack structure 130 within the staircase region 114 of the microelectronic device structure 100 using conventional processes (e.g., conventional photolithographic patterning processes, conventional material removal processes), and conventional processing equipment, which are not described in detail herein.

Figure 9A:
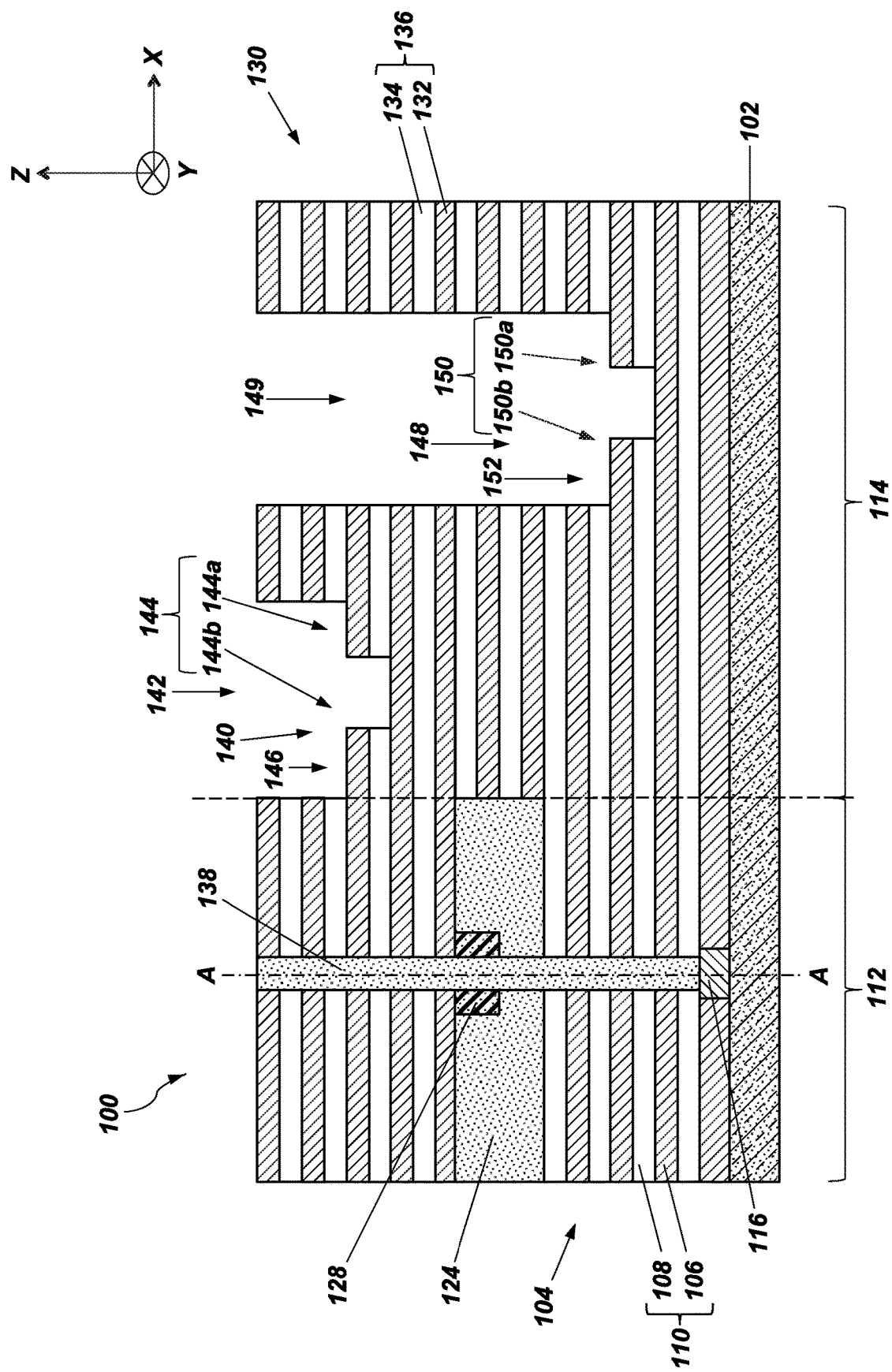
Figure 9B:
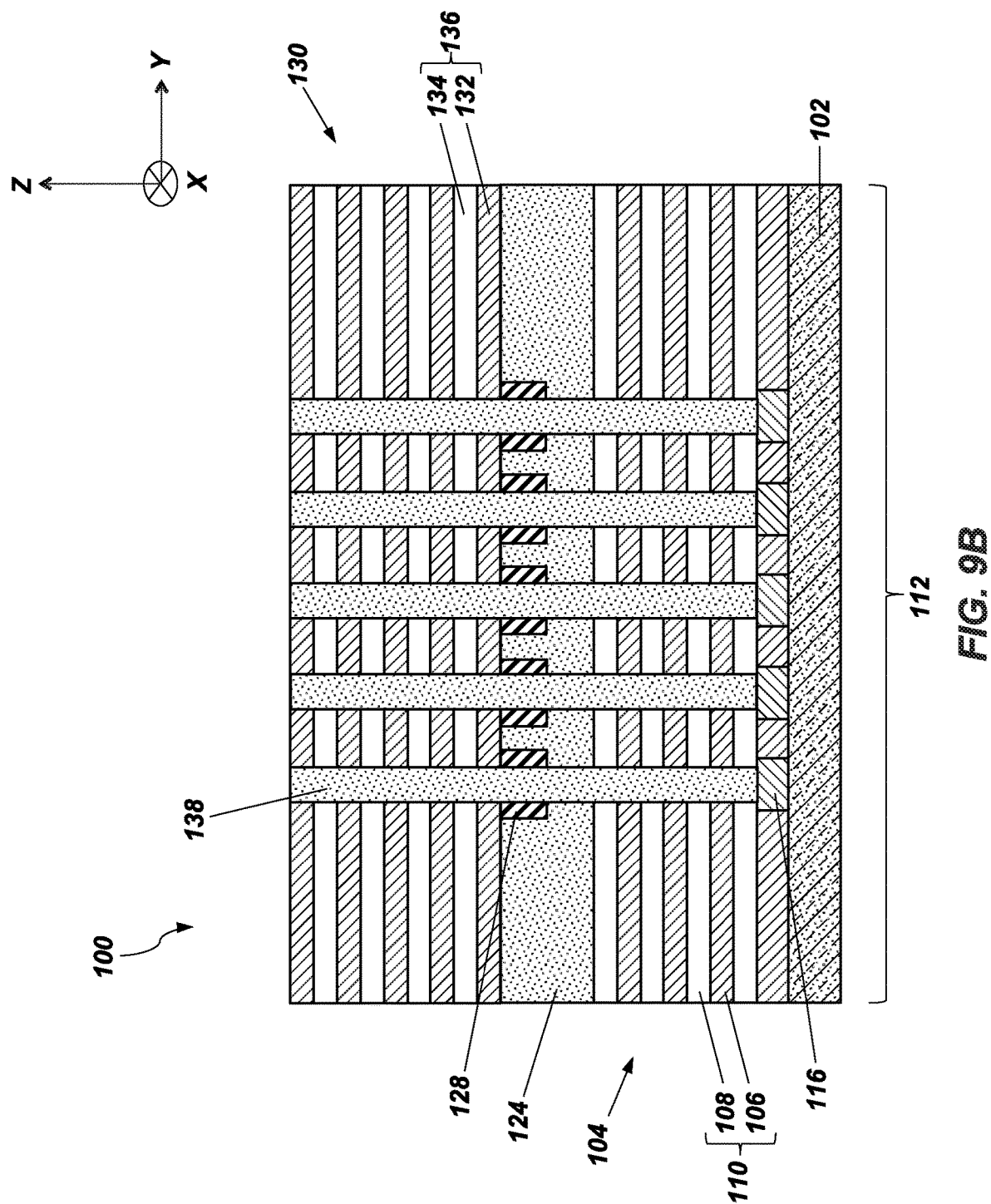

Referring next to FIG. 9A, the microelectronic device structure 100 may be subjected to one or more material removal processes (e.g., one or more chopping processes) to increase the depth(s) (e.g., in the Z-direction) of one or more the upper stadium structures 140 relative to one or more other of the upper stadium structures 140 and form at least one lower stadium structure 148. As shown in FIG. 9A, the lower stadium structure(s) 148 may be formed to be vertically positioned within the first preliminary stack structure 104, while the upper stadium structure(s) 140 may remain vertically positioned within the second preliminary stack structure 130. FIG. 9B is a simplified partial cross-sectional view of the microelectronic device structure 100 at the processing stage depicted in FIG. 9A about the line A-A shown in FIG. 9A.

The lower stadium structure(s) 148 may be substantially similar to the upper stadium structure(s) 140 used to form the lower stadium structure(s) 148, except located at relatively lower vertical position(s) within the microelectronic device structure 100 (e.g., within the first preliminary stack structure 104 rather than the second preliminary stack structure 130). As shown in FIG. 9A, each of the lower stadium structure(s) 148 may include opposing staircase structures 150 (e.g., a forward staircase structure 150a and a reverse staircase structure 150b that mirrors the forward staircase structure 150a) each having steps 152 defined by horizontal ends of the tiers 110 of the first preliminary stack structure 110. Boundaries (e.g., vertical boundaries, horizontal boundaries) of one or more additional trenches 149 (e.g., additional openings) formed to vertically extend through the second preliminary stack structure 130 and into the first preliminary stack structure 104 may be partially defined by the lower stadium structure(s) 148. The additional trench(es)

149 may each individually horizontally intervene between the opposing staircase structures 150 of one of the lower stadium structure(s) 148. Aside from being located at the horizontal ends of the tiers 110 of the first preliminary stack structure 104, the opposing staircase structures 150 (including the configurations of the steps 152 thereof) of the lower stadium structure(s) 148 may be formed to be substantially similar to the opposing staircase structures 144 (including the configurations of the steps 146 thereof) of the upper stadium structure(s) 140 utilized to form the lower stadium structure(s) 148.

As shown in FIG. 9A, tiers 110 of the first preliminary stack structure 104 at the same vertical position (e.g., in the Z-direction) as at least a portion of the interdeck dielectric structure 124 may be substantially free of portions (e.g., steps 152) of the lower stadium structure(s) 148 therein. For example, all of the steps 152 of the lower stadium structure(s) 148 may be positioned vertically below the tiers 110 of the first preliminary stack structure 104 located at the same vertical position (e.g., in the Z-direction) as at least a portion of the interdeck dielectric structure 124. The tiers 110 of the first preliminary stack structure 104 at the same vertical position (e.g., in the Z-direction) as at least a portion of the interdeck dielectric structure 124 may form an inactive (e.g., dummy) region a stack structure subsequently formed from the first preliminary stack structure 104 and the second preliminary stack structure 130, as described in further detail below. In additional embodiments, one or more of the tiers 110 of the first preliminary stack structure 104 at the same vertical position (e.g., in the Z-direction) as at least a portion of the interdeck dielectric structure 124 may include a portion (e.g., one or more steps 152) of the lower stadium structure(s) 148 therein.

The lower stadium structure(s) 148 may be formed by disposing a masking material in at least one of the trenches 142 formed in the second preliminary stack structure 130, while leaving at least one other of the trenches 142 formed in the second preliminary stack structure 130 free of (e.g., unfilled by) the masking material. Thereafter, the at least one other of the trenches 142 may be vertically extended into the first preliminary stack structure 104 using at least one material removal process (e.g., at least one chopping process) to terminate vertically below lower vertical boundaries of the interdeck dielectric structure 124. Vertically extending the at least one other of the trenches 142 may form the additional trench(es) 149 and the lower stadium structure(s) 148. The masking material may substantially protect portions of the second preliminary stack structure 130 and the first preliminary stack structure 104 vertically underlying and within horizontal boundaries of the at least one of the trenches 142 filled therewith from being removed during the material removal process.

Figure 10A:
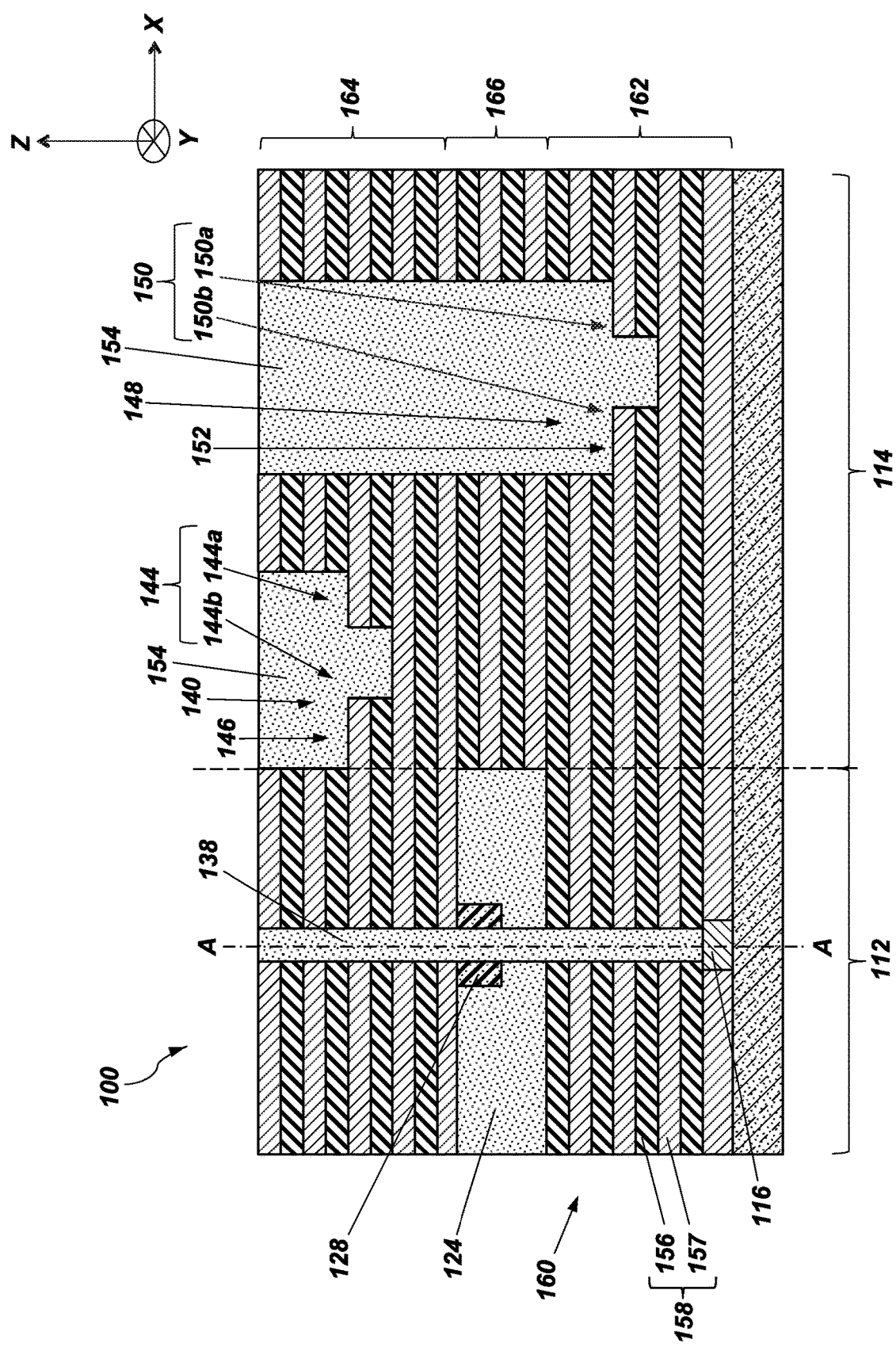
Figure 10B:
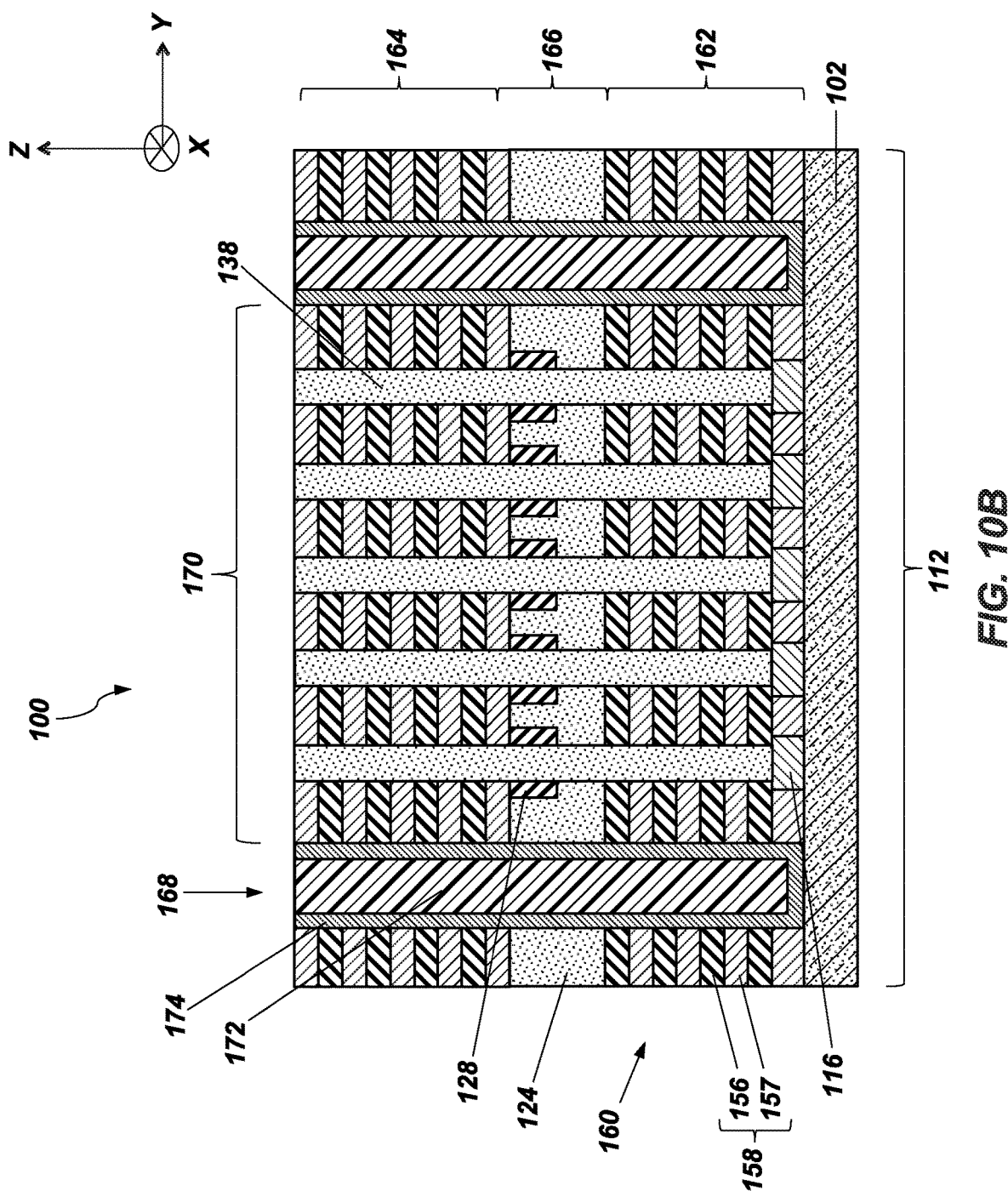

Referring next to FIG. 10A, isolation material 154 may be formed within the trench(es) 142 (FIG. 9A) and the additional trench(es) 149 (FIG. 9A), and the microelectronic device structure 100 may be subjected to so called "replacement gate" or "gate last" processing acts to at least partially replace the second insulative structures 108 (FIG. 9A) of the first preliminary stack structure 104 (FIG. 9A) and the additional second insulative structures 134 (FIG. 9A) of the second preliminary stack structure 130 (FIG. 9A) with conductive structures 156 and form a stack structure 160. The stack structure 160 includes a vertically alternating (e.g., in the Z-direction) sequence of the conductive structures 156 and insulative structures 157 arranged in tiers 158. The insulative structures 157 may correspond to remainders (e.g., remaining portions) of the first insulative structures 106 (FIG. 9A) of the first preliminary stack structure 104 (FIG. 9A) and the additional first insulative structures 132 (FIG. 9A) of the second preliminary stack structure 130 (FIG. 9A). Each of the tiers 158 of the stack structure 160 includes at least one of the conductive structures 156 vertically neighboring at least one of the insulative structures 157. FIG. 10B is a simplified partial cross-sectional view of the microelectronic device structure 100 at the processing stage depicted in FIG. 10A about the line A-A shown in FIG. 10A.

The isolation material 154 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). The isolation material 154 may include a substantially homogeneous distribution or a substantially heterogeneous distribution of the at least one dielectric material. In some embodiments, the isolation material 154 is formed of and includes $SiO_x$ (e.g., $SiO_2$). The isolation material 154 may be formed using conventional processes (e.g., conventional material deposition processes) and conventional processing equipment, which are not described in detail herein.

The conductive structures 156 of the tiers 158 of the stack structure 160 may be formed of and include at least one electrically conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). In some embodiments, the conductive structures 156 are formed of and include tungsten (W).

Referring to FIG. 10B, to form the conductive structures 156 (and, hence, the stack structure 160 including the tiers 158 of the conductive structures 156 and the insulative structures) slots 168 (e.g., slits, trenches) may be formed to vertically extend through the second preliminary stack structure 130 (FIGS. 9A and 9B), the interdeck dielectric structure 124, and the first preliminary stack structure 104 (FIGS. 9A and 9B) to form discrete blocks 170. Thereafter, portions of the second insulative structures 108 (FIGS. 9A and 9B) of the first preliminary stack structure 104 (FIGS. 9A and 9B) and portions of the additional second insulative structures 134 (FIGS. 9A and 9B) of the second preliminary stack structure 130 (FIGS. 9A and 9B) may be selectively removed (e.g., selectively etched and exhumed) through the slots 168, and replaced with electrically conductive material to form the conductive structures 156. Some of the conductive structures 156 may function as access line structures (e.g., word line structures) for the microelectronic device structure 100, and other of the conductive structures 156 may function as select gate structures for the microelectronic device structure 100. Following the formation of the conductive structures 156 the slots 168 may be filled with at least one dielectric fill material 172, and, optionally, at least one dielectric liner material 174, as depicted in FIG. 10B.

The dielectric fill material 172 formed within and at least partially filling the slots 168 may comprise at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). The dielectric fill material 172 may include a substantially homogeneous distribution or a substantially heterogeneous distribution of the at least one dielectric material. In some embodiments, the dielectric fill material 172 exhibits a substantially homogeneous distribution of dielectric material. In further embodiments, the dielectric fill material 172 exhibits a substantially heterogeneous distribution of at least one dielectric material. The dielectric fill material 172 may, for example, be formed of and include a stack (e.g., laminate) of at least two different dielectric materials. In some embodiments, the dielectric fill material 172 is formed of and includes Sift. In addition, if formed, the dielectric liner material 174 may be formed to intervene between the dielectric fill material 172 and the conductive structures 156 of the stack structure 160. The dielectric liner material may, for example, comprise a non-oxide dielectric material (e.g., a dielectric nitride material, such as $SiN_y$) employed to impede or prevent oxidation of the conductive structures 156 during the formation of the dielectric fill material 172 (e.g., if the dielectric fill material 172 is formed to comprise a dielectric oxide material, such as Sift).

Referring again to FIG. 10A, following the formation of the stack structure 160, the microelectronic device structure 100 may include a lower deck 162, an upper deck 164 vertically overlying the lower deck 162, and interdeck section 166 vertically intervening between the lower deck 162 and the upper deck 164. The lower deck 162 may comprise tiers 158 of the stack structure 160 vertically underlying the interdeck dielectric structure 124. The upper deck 164 may comprise tiers 158 of the stack structure 160 vertically overlying the interdeck dielectric structure 124. The interdeck section 166 may comprise the interdeck dielectric structure 124 and tiers 158 of the stack structure 160 horizontally neighboring and within the vertical boundaries of the interdeck dielectric structure 124. Within the interdeck section 166, the tiers 158 of the stack structure 160 may be horizontally confined within the staircase region 114 of the microelectronic device structure 100, and the interdeck dielectric structure 124 may be horizontally confined within the memory array region 112 of the microelectronic device structure 100. The tiers 158 of the stack structure 160 within the interdeck section 166 may comprise so-called "dummy tiers" that do not facilitate electrical communication between two of more components (e.g., memory cells, string drivers) of a microelectronic device including the microelectronic device structure 100. Conversely, at least some of the tiers 158 of the stack structure 160 within the lower deck 162 and the upper deck 164 of the microelectronic device structure 100 comprise so-called "active tiers" that facilitate electrical communication between two of more components (e.g., memory cells, string drivers) of a microelectronic device including the microelectronic device structure 100. Optionally, one or more of the tiers 158 of the stack structure 160 within the lower deck 162 vertically proximate (e.g., vertically neighboring) the interdeck section 166 may comprise dummy tiers, so long as one or more other of the tiers 158 of the stack structure 160 within the lower deck 162 comprise active tiers; and/or one or more of the tiers 158 of the stack structure 160 within the upper deck 164 vertically proximate (e.g., vertically neighboring) the interdeck section 166 may comprise dummy tiers, so long as one or more other of the tiers 158 of the stack structure 160 within the upper deck 164 comprise active tiers.

Thus, in accordance with embodiments of the disclosure, a microelectronic device comprises a microelectronic device structure having a memory array region and a staircase region. The microelectronic device structure comprises a stack structure, staircase structures, and semiconductive pillar structures. The stack structure has tiers each comprising a conductive structure and an insulative structure vertically neighboring the conductive structure. The stack structure comprises a deck comprising a group of the tiers, an additional deck vertically overlying the deck and comprising an additional group of the tiers, an interdeck section vertically between the deck and the additional deck. The interdeck section comprises a dielectric structure horizontally confined within the memory array region, and another group of the tiers within vertical boundaries of the dielectric structure and horizontally confined within of the staircase region. The staircase structures are horizontally confined within the staircase region and have steps comprising edges of the tiers of the stack structure within the deck and the additional deck. The semiconductive pillar structures are horizontally confined within the memory array region and vertically extend through the stack structure.

Furthermore, in accordance with embodiments of the disclosure, a method of forming a microelectronic device comprises forming a microelectronic device structure having a memory array region and a staircase region. The microelectronic device structure is formed to comprise a first preliminary stack structure comprising a vertically alternating sequence of first insulative structures and second insulative structures arranged in tiers. A dielectric structure is formed within an upper portion of the first preliminary stack structure and is substantially confined within horizontal boundaries of the memory array region. A second preliminary stack structure is formed over the first preliminary stack structure and the dielectric structure. The second preliminary stack structure comprises a vertically alternating sequence of additional first insulative structures and additional second insulative structures arranged in additional tiers. Semiconductive pillar structures are formed to vertically extend through portions of the second preliminary stack structure, the dielectric structure, and the first preliminary stack structure within the memory array region. Staircase structures are formed within the portions of the second preliminary stack structure and the first preliminary stack structure within the staircase region. Some of the staircase structures have steps comprising horizontal ends of the tiers of the first preliminary stack structure. Other of the staircase structures have additional steps comprising horizontal ends of the additional tiers of the second preliminary stack structure. The second insulative structures and the additional second insulative structures are at least partially replaced with conductive structures.

FIGS. 11A through 20B are simplified partial cross-sectional views illustrating embodiments of another method of forming a microelectronic device (e.g., a memory device, such as a 3D NAND Flash memory device). FIGS. 11B, 12B, 13B, 14B, 15B, 16B, 17B, 18B, 19B, and 20B are partial cross-sectional views about the line B-B depicted in FIGS. 11A, 12A, 13A, 14A, 15A, 16A, 17A, 18A, 19A, and 20A, respectively. Throughout FIGS. 11A through 20B and the associated description below, features (e.g., structures, materials, regions) functionally similar to features of the microelectronic device structure 100 previously described with reference to FIGS. 1A through 20B are referred to with similar reference numerals incremented by 100. To avoid repetition, not all features shown in FIGS. 11A through 20B are described in detail herein. Rather, unless described otherwise below, in FIGS. 11A through 20B, a feature designated by a reference numeral that is a 100 increment of the reference numeral of a previously described feature (whether the previously described feature is first described before the present paragraph, or is first described after the present paragraph) will be understood to be substantially similar to and formed in substantially the same manner as the previously-described feature.

Figure 11A:
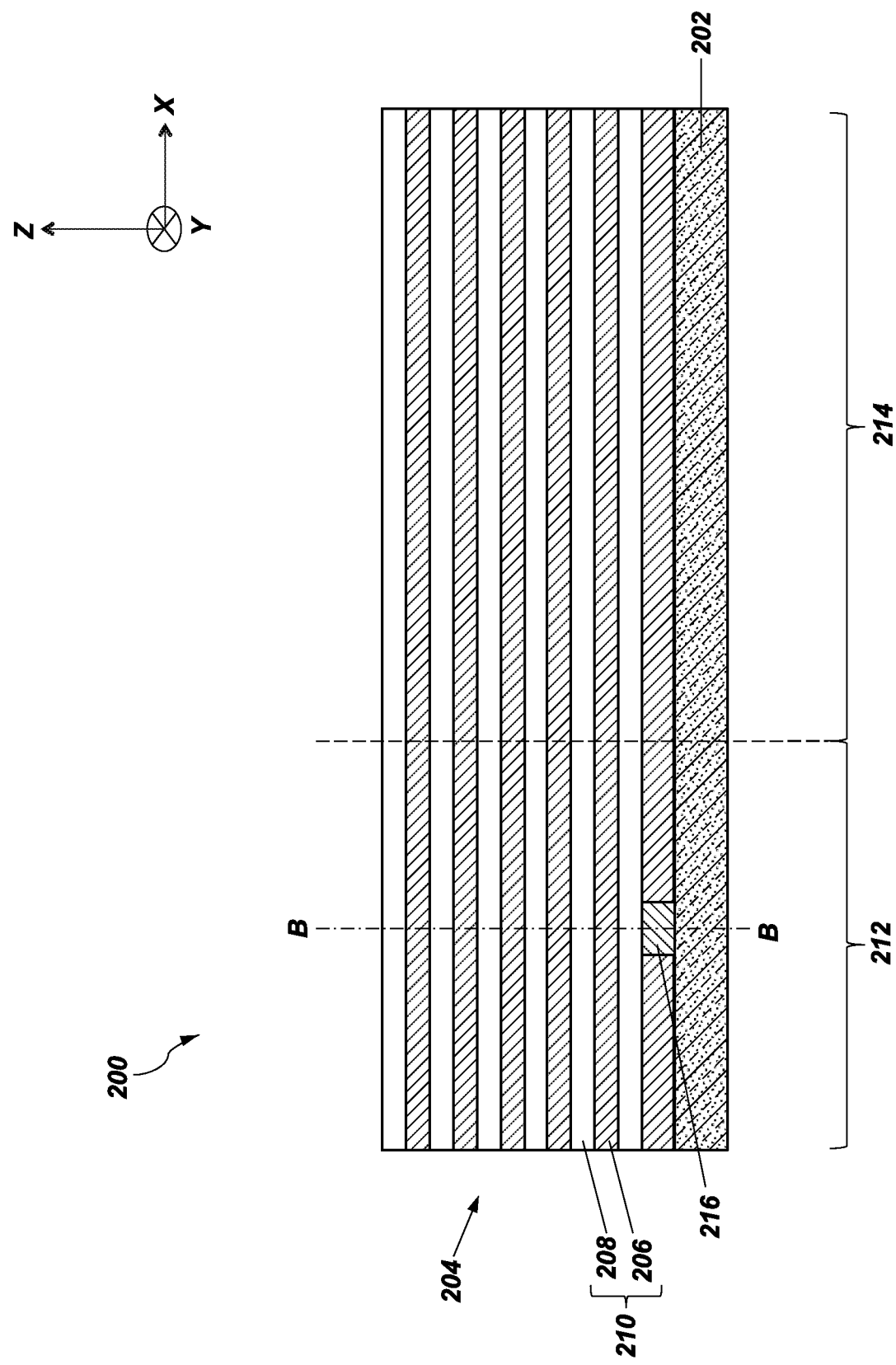
Figure 11B:
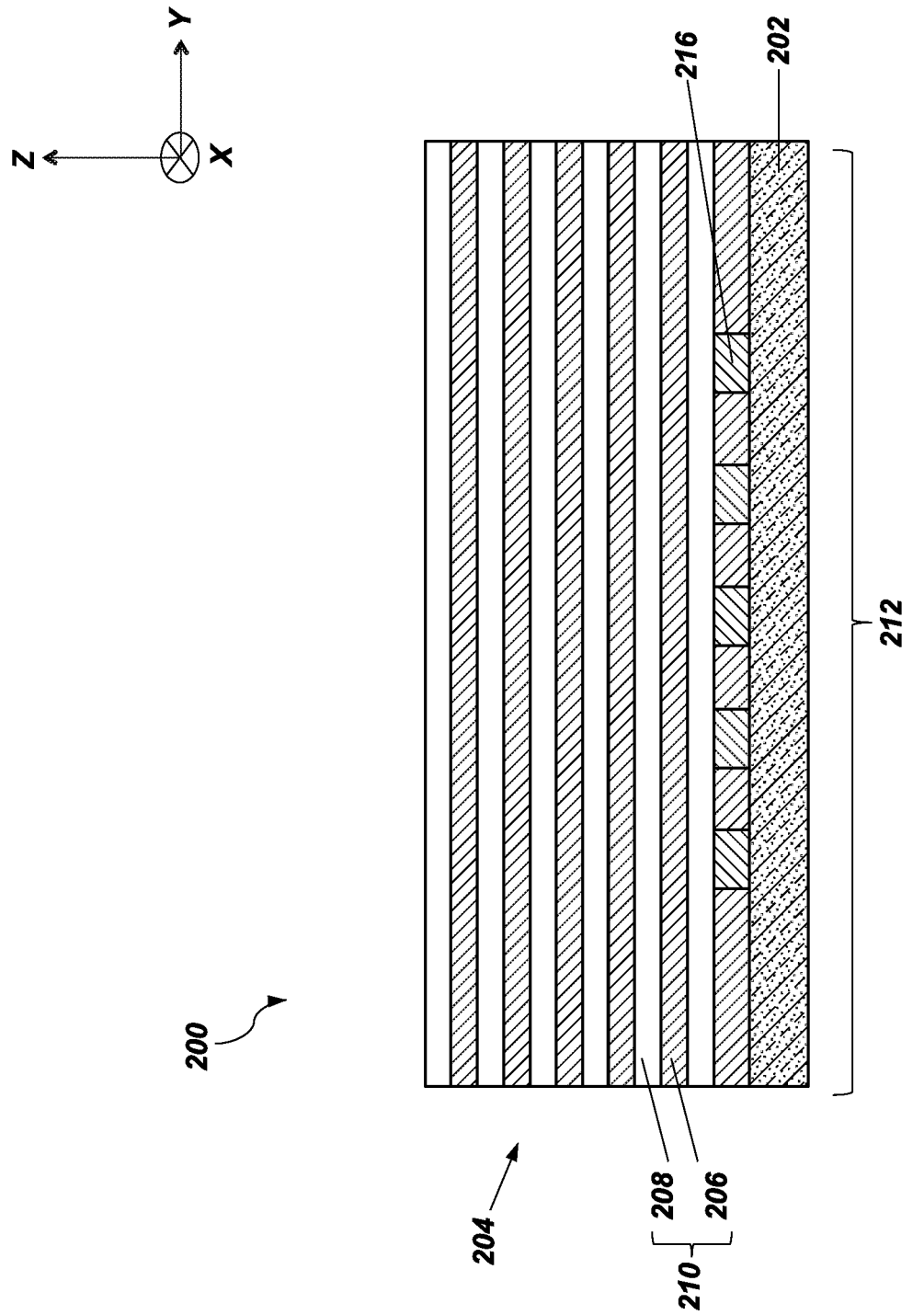

Referring to FIG. 11A, a microelectronic device structure 200 may be formed to include a base structure 202, contact structures 216 on or over the base structure 202, and a first preliminary stack structure 204 on or over the base structure 202 and the contact structures 216. The first preliminary stack structure 204 includes a vertically alternating (e.g., in the Z-direction) sequence of first insulative structures 206 and second insulative structures 208 arranged in tiers 210. As shown in FIG. 11A, the microelectronic device structure 200 includes a memory array region 212, and a staircase region 214 horizontally neighboring (e.g., in the X-direction) a first horizontal boundary of the memory array region 212. The base structure 202 and the first preliminary stack structure 204 horizontally extend through the memory array region 212 and the staircase region 214. The base structure 202, the contact structures 216, the first preliminary stack structure 204 (including the tiers 210 of first insulative structures 206 and second insulative structures 208 thereof), the memory array region 212 of the microelectronic device structure 200, and the staircase region 214 of the microelectronic device structure 200 may respectively be formed to be substantially similar to the base structure 102, the contact structures 116, the first preliminary stack structure 104 (including the tiers 110 of first insulative structures 106 and second insulative structures 108 thereof), the memory array region 112 of the microelectronic device structure 100, and the staircase region 114 of the microelectronic device structure 100 previously described with reference to FIG. 1A. FIG. 11B is a simplified partial cross-sectional view of the microelectronic device structure 200 at the processing stage depicted in FIG. 11A about the line B-B shown in FIG. 11A.

Figure 12A:
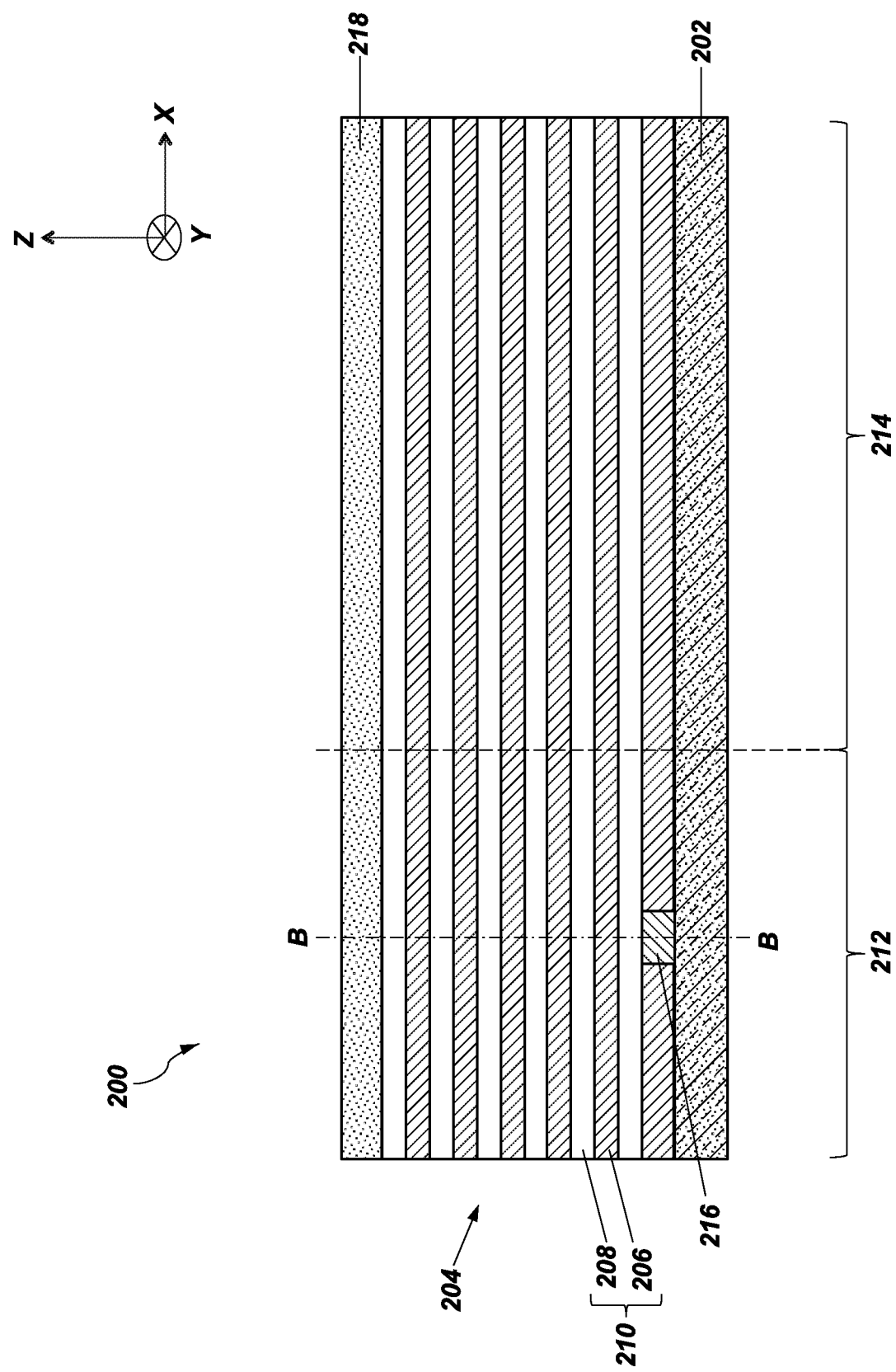
Figure 12B:
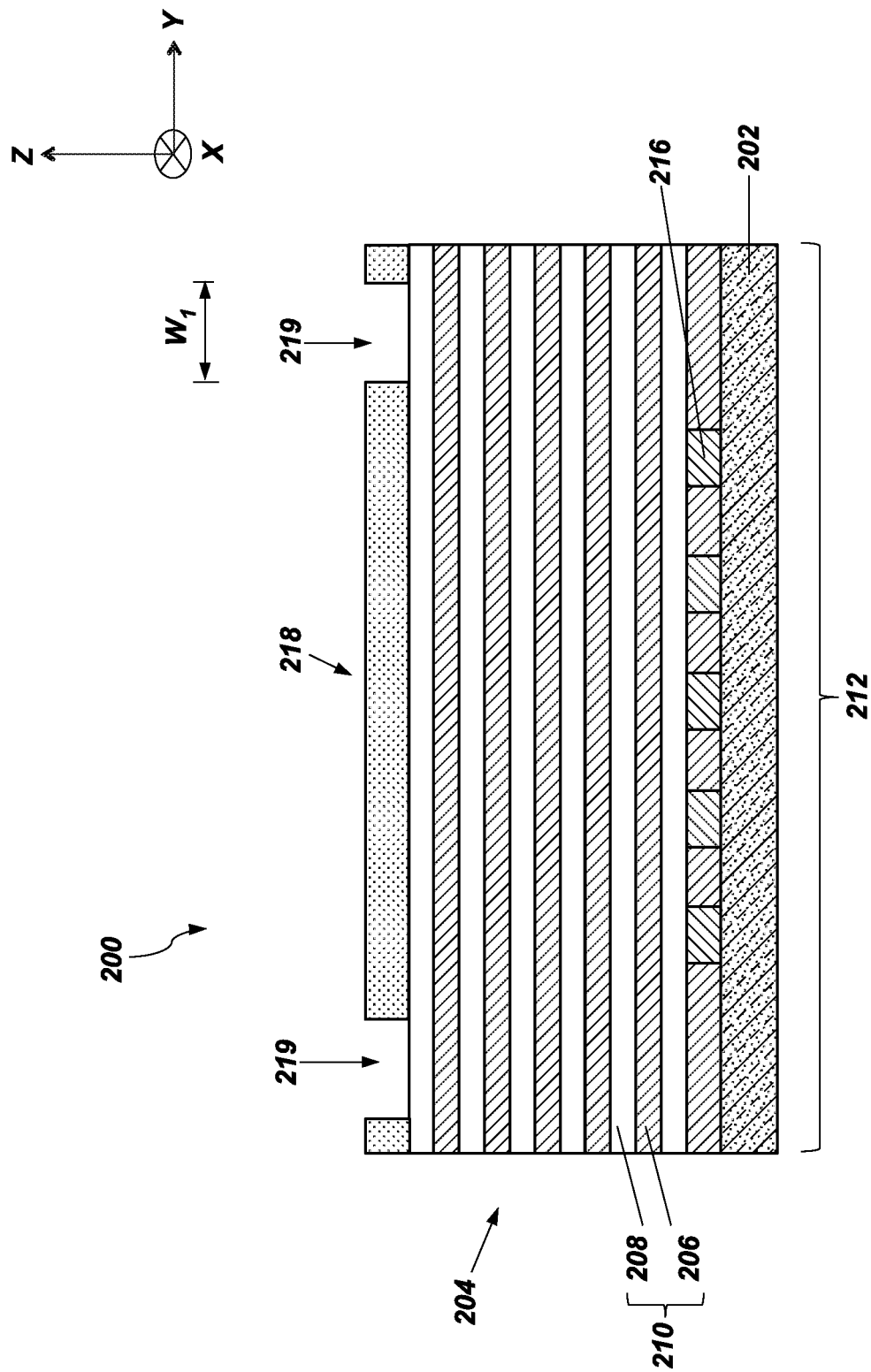

Referring next to FIG. 12A, a photoresist structure 218 may be formed on or over the first preliminary stack structure 204. The photoresist structure 218 may horizontally extend over portions of the first preliminary stack structure 204 within the memory array region 212 of the microelectronic device structure 200 and the staircase region 214 of the microelectronic device structure 200. FIG. 12B is a simplified partial cross-sectional view of the microelectronic device structure 100 at the processing stage depicted in FIG. 12A about the line B-B shown in FIG. 12A.

Referring to FIG. 12B, the photoresist structure 218 may be formed to include openings 219 vertically extending therethrough. The openings 219 may each individually vertically extend to and expose a portion of an upper surface of the first preliminary stack structure 204, and may each individually horizontally extend substantially linearly through the memory array region 212 of the microelectronic device structure 200 and the staircase region 214 of the microelectronic device structure 200. As shown in FIG. 12B, the openings 219 may be horizontally positioned (e.g., in the Y-direction) outside of horizontal boundaries (e.g., in the Y-direction) of the contact structures 216. The horizontal positions of the openings 219 may correspond to horizontal positions of slots to be formed through the first preliminary stack structure 204 (and a second preliminary stack structure to be formed over the first preliminary stack structure 204), as described in further detail below. The openings 219 may each individually be formed to have a width $W_1$ (e.g., horizontal dimension in the Y-direction) greater than a predetermined width of the slot to be subsequently formed in the first preliminary stack structure 204 at the horizontal position of the opening 219.

The photoresist structure 218 may serve as a mask to protect portions of the first preliminary stack structure 204 (e.g., including the tiers 210 of the first insulative structures 206 and the second insulative structures 208 thereof) vertically thereunder from removal during subsequent processing, as described in further detail below. The photoresist structure 218 may be formed of and include a photoresist material, such as a positive tone photoresist material, or a negative tone photoresist material. Suitable photoresist materials (e.g., positive tone photoresist materials, negative tone photoresist materials) are known in the art, and are, therefore, not described in detail herein. The photoresist structure 118 may, for example, be compatible with 13.7 nm, 157 nm, 193 nm, 248 nm, or 365 nm wavelength systems; with 193 nm wavelength immersion systems; and/or with electron beam lithographic systems. In addition, the photoresist structure 218, including the openings 219 extending therethrough, may be formed using conventional processes (e.g., conventional deposition processes, such as one or more PVD, CVD, ALD, and spin-coating; conventional photolithography processes; conventional material removal processes). Such processes are known in the art and, therefore, are not described in detail herein.

Figure 13A:
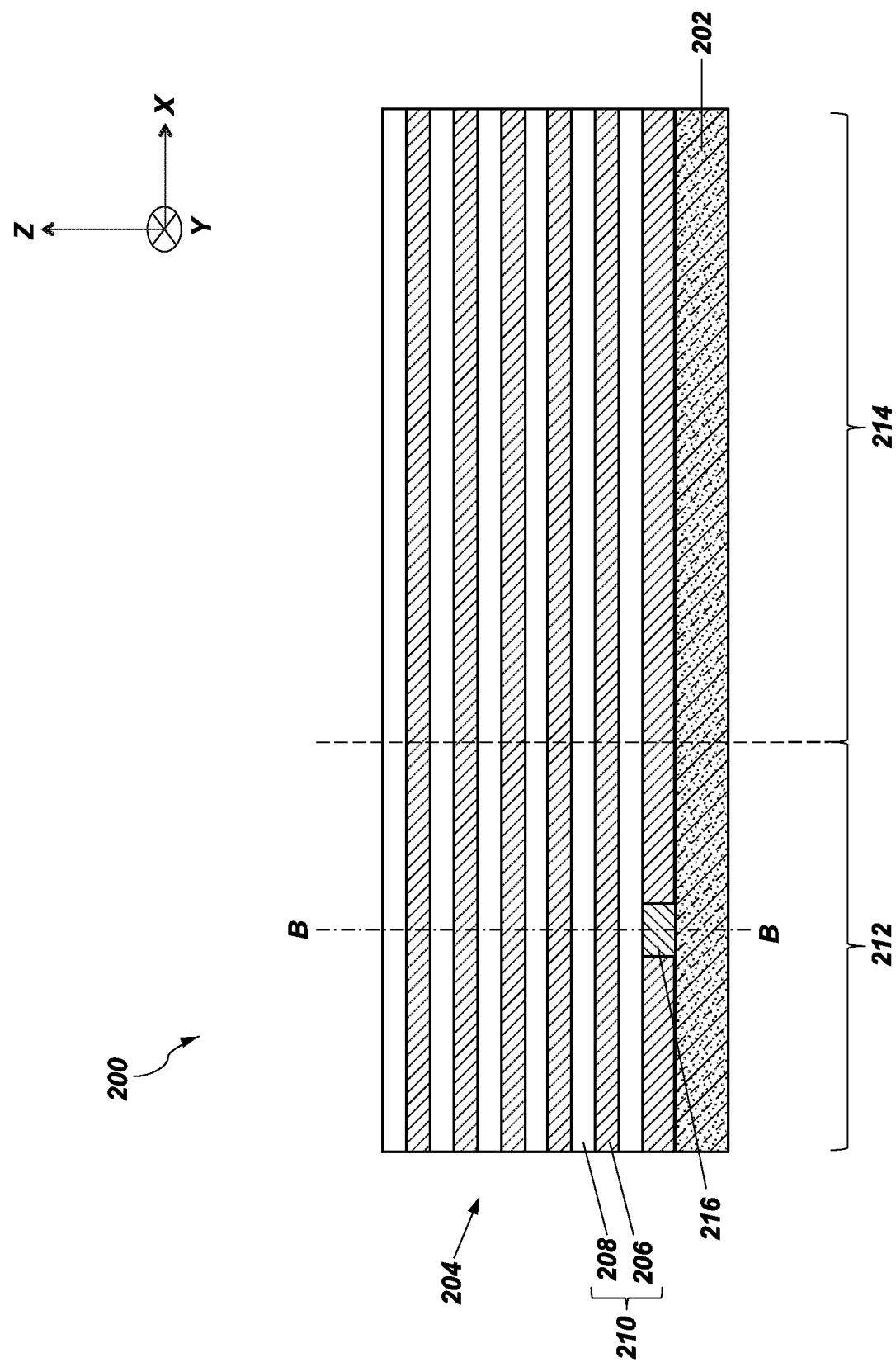
Figure 13B:
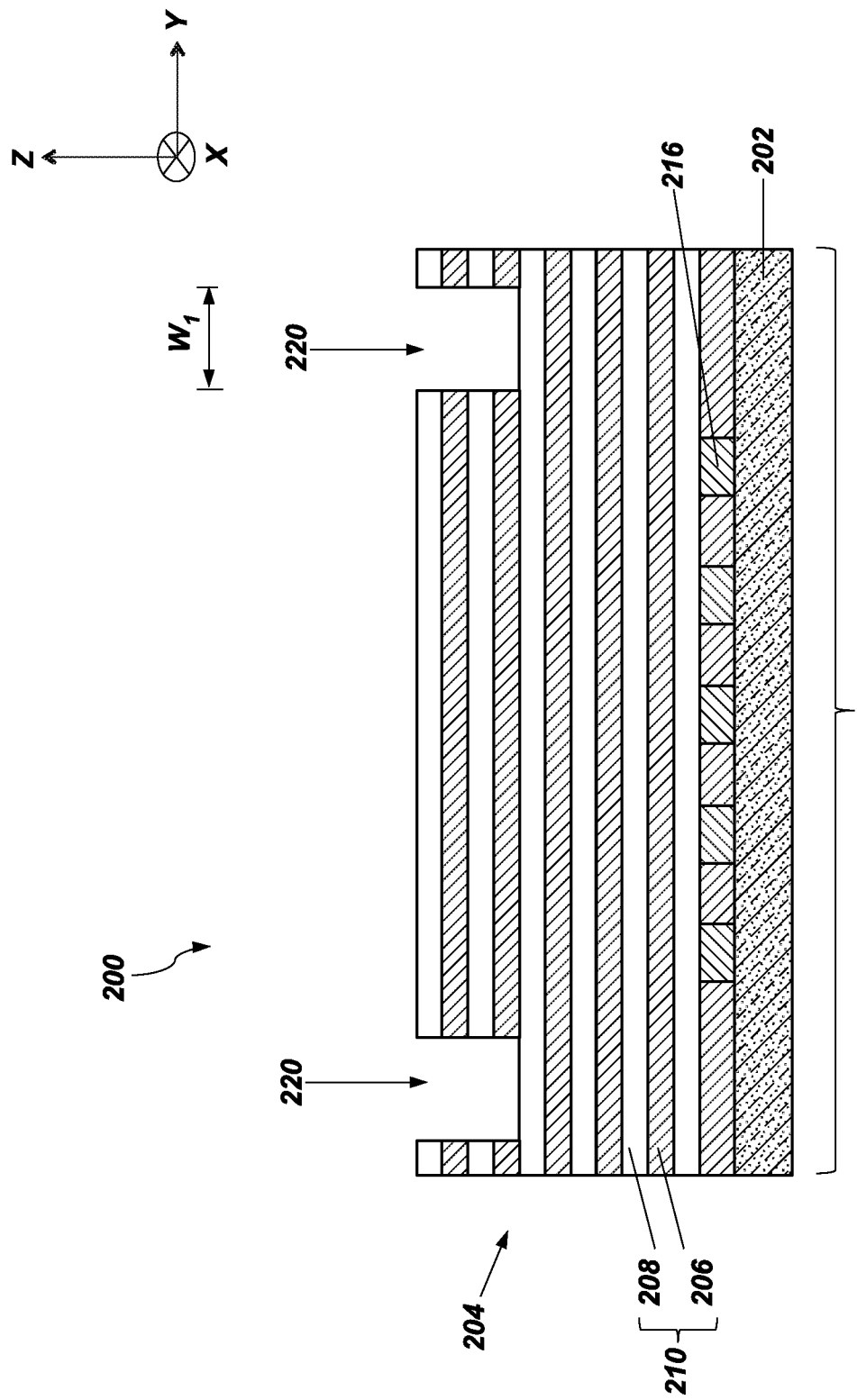

Referring next to FIG. 13A, the microelectronic device structure 200 may be subjected to a material removal process to selectively remove portions of relatively vertically higher tiers 210 (e.g., uppermost tiers) of the first preliminary stack structure 204 vertically underlying and within horizontal boundaries of the openings 219 (FIG. 12B) in the photoresist structure 218 (FIGS. 12A and 12B). FIG. 13B is a simplified partial cross-sectional view of the microelectronic device structure 200 at the processing stage depicted in FIG. 13A about the line B-B shown in FIG. 13A. As shown in FIG. 13B, the material removal process may form recesses 220 (e.g., trenches, openings) partially vertically extending into the first preliminary stack structure 104. The recesses 220 may each individually horizontally extend substantially linearly through the memory array region 212 of the microelectronic device structure 200 and the staircase region 214 of the microelectronic device structure 200. Each of the recesses 220 may individually have substantially the horizontal position (e.g., in the Y-direction) and horizontal dimensions (e.g., width $W_1$ in the Y-direction, length in the X-direction) as the opening 219 (FIG. 12B) in the photoresist structure 218 (FIGS. 12A and 12B) employed to form the recess 220. Following the formation of the recesses 220, remaining (e.g., unremoved) portions of the photoresist structure 218 (FIGS. 12A and 12B), if any, may be removed.

The material removal process may be controlled to remove portions (e.g., portions not protected by photoresist material of the photoresist structure 218 (FIGS. 12A and 12B)) of a desired number of the tiers 210 of the first preliminary stack structure 204. As shown in FIG. 13B, in some embodiments, the material removal process removes portions of two (2) relatively vertically highest tiers 210 (e.g., two (2) uppermost tiers) of the first preliminary stack structure 204, including portions of the first insulative structures 206 and the second insulative structures 208 thereof. In additional embodiments, the material removal process may remove portions of a different number of relatively vertically higher tiers 210 of the first preliminary stack structure 204. As a non-limiting example, the material removal process may be controlled to remove portions of a single (e.g., only one) relatively vertically highest tier 210 (e.g., an uppermost tier) of the first preliminary stack structure 204. As another non-limiting example, the material removal process may be controlled to remove portions of more than two (2) relatively vertically highest tiers 210 of the first preliminary stack structure 204, such as portions of three (3) relatively vertically highest tiers 210 (e.g., three (3) uppermost tiers) of the first preliminary stack structure 204, portions of four (4) relatively vertically highest tiers 210 (e.g., four (4) uppermost tiers) of the first preliminary stack structure 204, or greater than or equal to five (5) relatively vertically highest tiers 210 (e.g., five (5) uppermost tiers) of the first preliminary stack structure 204.

Portions of relatively vertically higher tiers 210 of the first preliminary stack structure 204 vertically underlying and within horizontal boundaries of the openings 219 (FIG. 12B) in the photoresist structure 218 (FIGS. 12A and 12B) may be removed using conventional material removal processes (e.g., conventional etching processes, such as a conventional anisotropic etching processes), which are not described in detail herein. For example, portions of an uppermost tier 210 of the first preliminary stack structure 204 vertically underlying and within horizontal boundaries of the openings 219 (FIG. 12B) in the photoresist structure 218 (FIGS. 12A and 12B) may be removed using an etching cycle that includes removing exposed portions of the second insulative structure 208 of the uppermost tier 210 using a first etching act (e.g., a first anisotropic etching act), and then removing an exposed portion of the first insulative structure 206 of the uppermost tier 210 using a second etching act (e.g., a second anisotropic etching act). Portions of one or more additional tiers 210 of the first preliminary stack structure 204 vertically underlying and within horizontal boundaries of the openings 219 (FIG. 12B) in the photoresist structure 218 (FIGS. 12A and 12B) may then be removed using one or more additional etching cycles similar to the etching cycle to form the recesses 220 to desired vertical depths within the first preliminary stack structure 204.

Figure 14A:
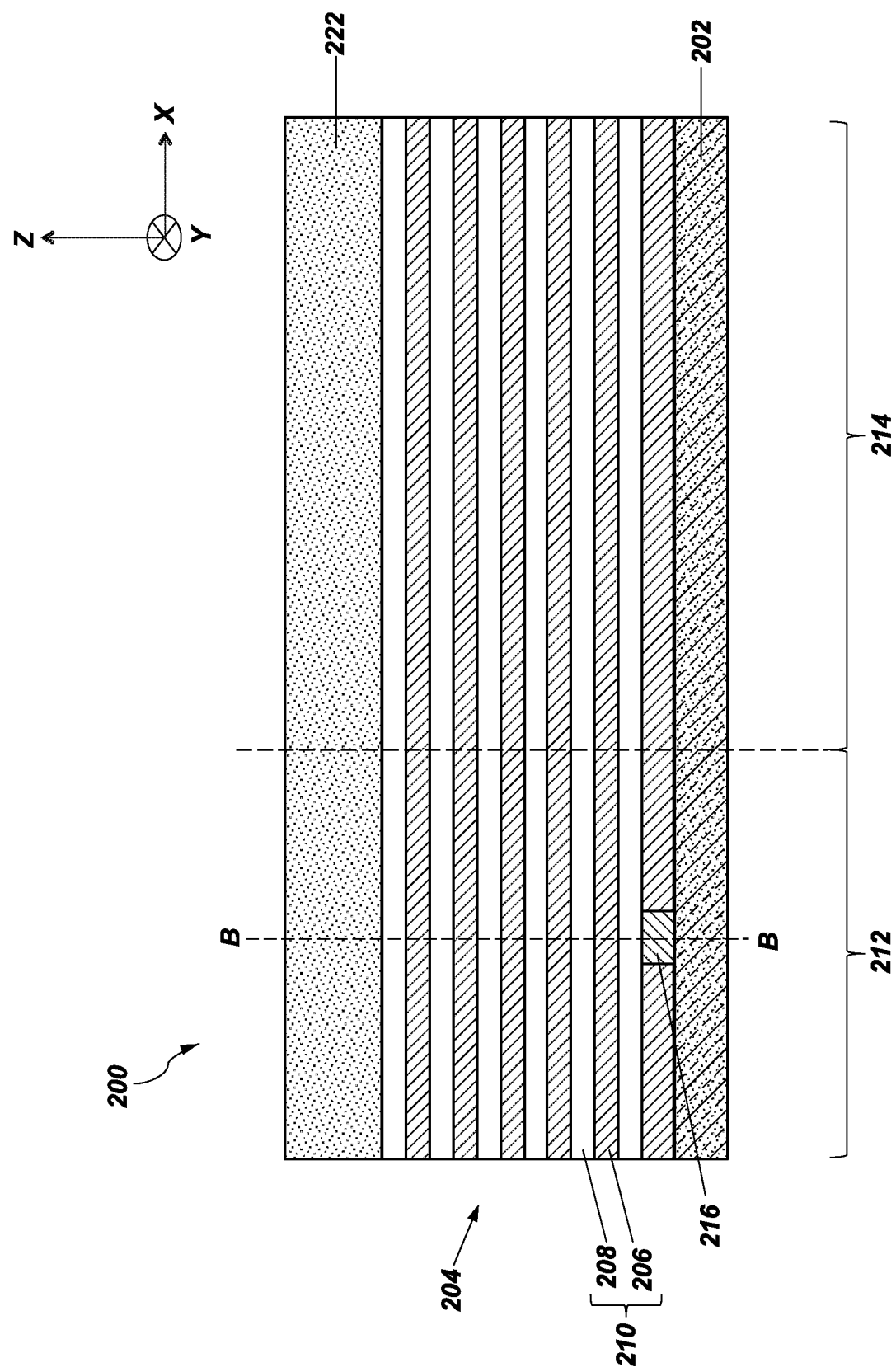
Figure 14B:
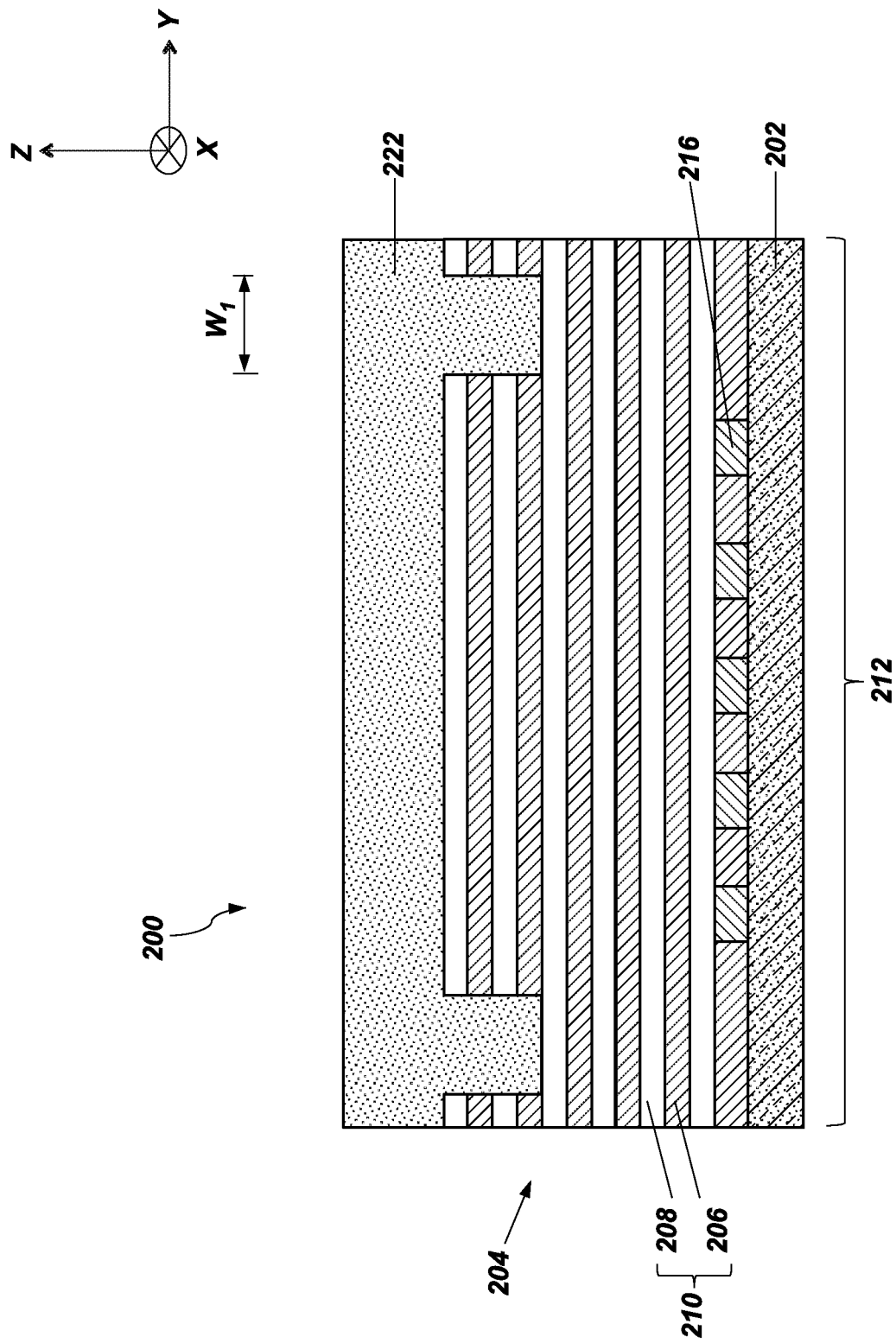

Referring next to FIG. 14A, a dielectric fill material 222 may be formed on or over exposed surfaces of the first preliminary stack structure 204 inside and outside of the recesses 220 (FIG. 13B). FIG. 14B is a simplified partial cross-sectional view of the microelectronic device structure 200 at the processing stage depicted in FIG. 14A about the line B-B shown in FIG. 14A. As shown in FIG. 14A, the dielectric fill material 222 may be formed to cover and substantially extend (e.g., substantially continuously extend) across surfaces of the first preliminary stack structure 204 within the memory array region 212 of the microelectronic device structure 200 and the staircase region 214 of the microelectronic device structure 200. As shown in FIG. 14B, the dielectric fill material 222 may substantially fill the recesses 220 (FIG. 13B) vertically extending into the first preliminary stack structure 204; and may cover and substantially extend across surfaces of the first preliminary stack structure 204 at and outside of the boundaries (e.g., horizontal boundaries, vertical boundaries) of the recesses 220 (FIG. 13B). The dielectric fill material 222 may at least partially (e.g., substantially) conform to a topography defined by the surfaces (e.g., horizontal surfaces, vertical surfaces) upon which the dielectric fill material 222 is formed.

A material composition of the dielectric fill material 222 may be substantially similar to the material composition of the dielectric fill material 122 previously described with reference to FIGS. 13A and 13B. In some embodiments, the dielectric fill material 222 is formed of and includes a dielectric oxide material (e.g., $SiO_x$, such as $SiO_2$). In addition, the dielectric fill material 222 may be formed using conventional processes (e.g., conventional material deposition processes) and conventional processing equipment, which are not described in detail herein.

Figure 15A:
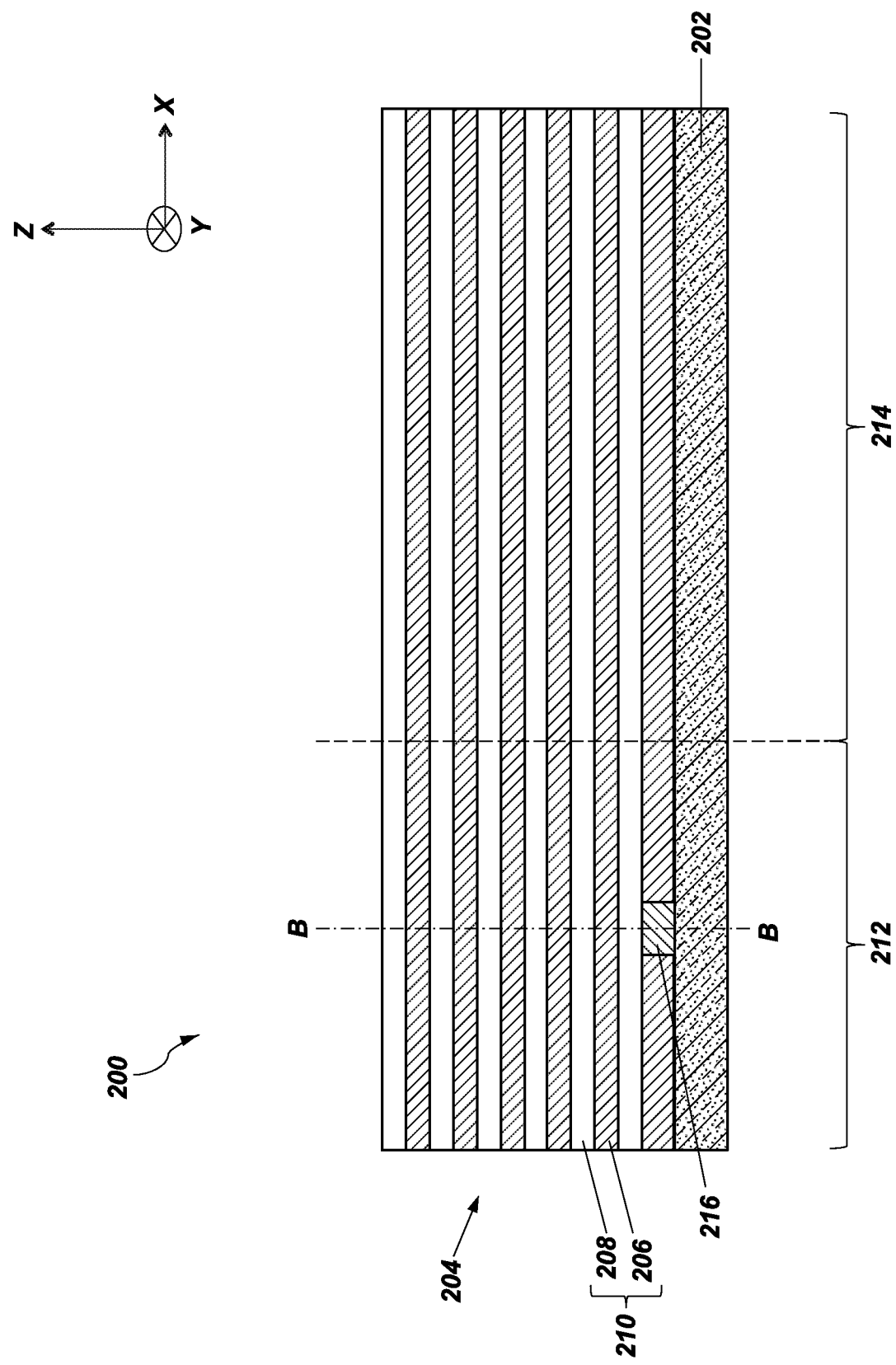
Figure 15B:
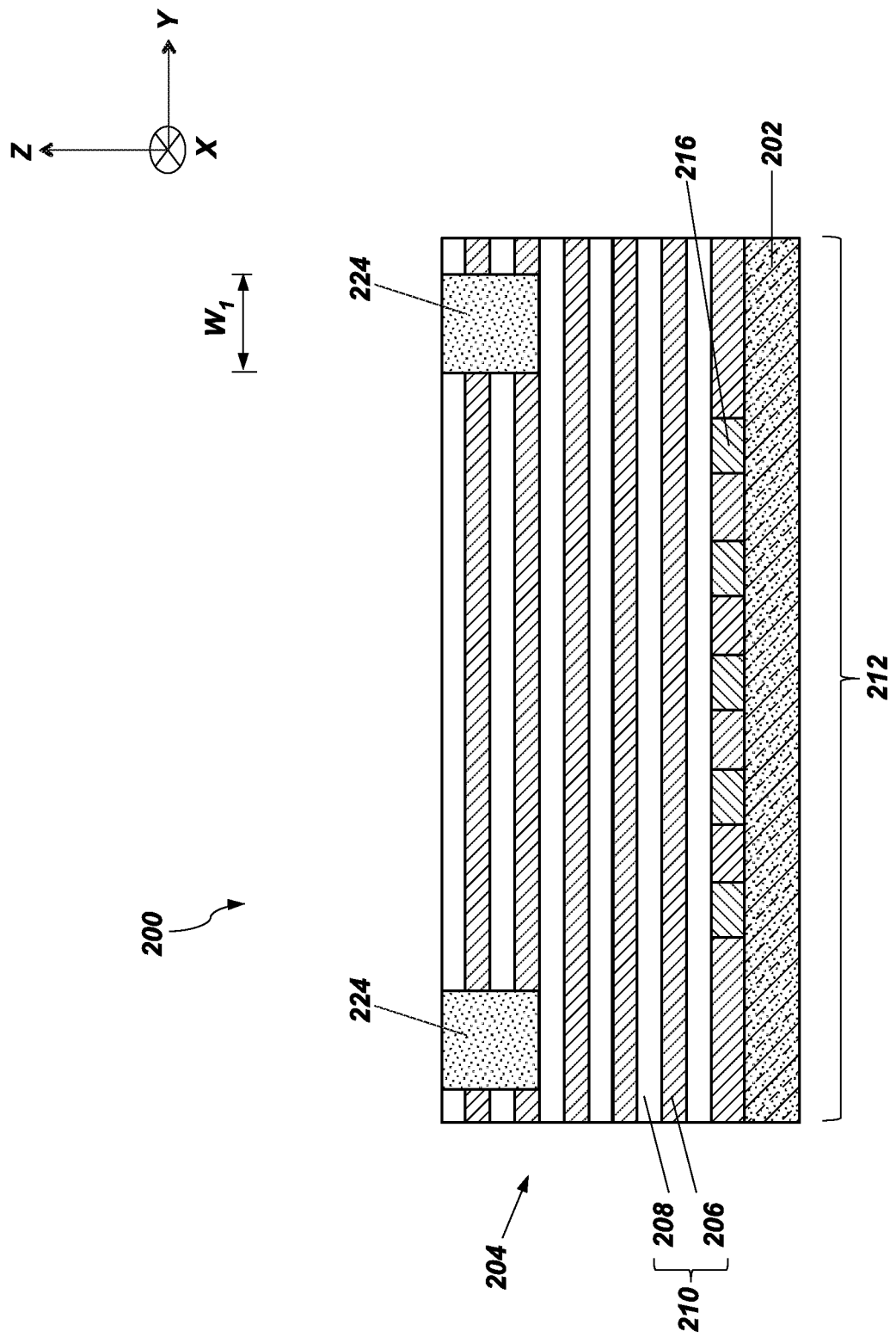

Referring next to FIGS. 15A and 15B (which is a simplified partial cross-sectional view of the microelectronic device structure 200 at the processing stage depicted in FIG. 15A about the line B-B shown in FIG. 15A), portions of the dielectric fill material 222 (FIGS. 14A and 14B) outside of the boundaries (e.g., horizontal boundaries, vertical boundaries) of the recesses 220 (FIG. 13B) may be removed while retaining additional portions of the dielectric fill material 222 (FIGS. 14A and 14B) inside of the boundaries of the recesses 220 (FIG. 13B) to form at interdeck dielectric structures 224 (FIG. 15B). The removal process may expose uppermost surfaces of the first preliminary stack structure 204 within memory array region 212 of the microelectronic device structure 200 and the staircase region 214 of the microelectronic device structure 200. Uppermost boundaries (e.g., uppermost surfaces) of the interdeck dielectric structures 224 may be substantially coplanar with uppermost boundaries (e.g., an uppermost surfaces) of the first preliminary stack structure 204.

Portions of the dielectric fill material 122 (FIGS. 14A and 14B) outside of the boundaries (e.g., horizontal boundaries, vertical boundaries) of the recesses 220 (FIG. 13B) may be removed to form the interdeck dielectric structures 224 using conventional processes (e.g., conventional planarization processes), which are not describe in detail herein. For example, portions of the dielectric fill material 222 (FIGS. 14A and 14B) outside of the boundaries of the recesses 220 (FIG. 13B) may be removed using at least one CMP process to form the interdeck dielectric structures 224.

Figure 16A:
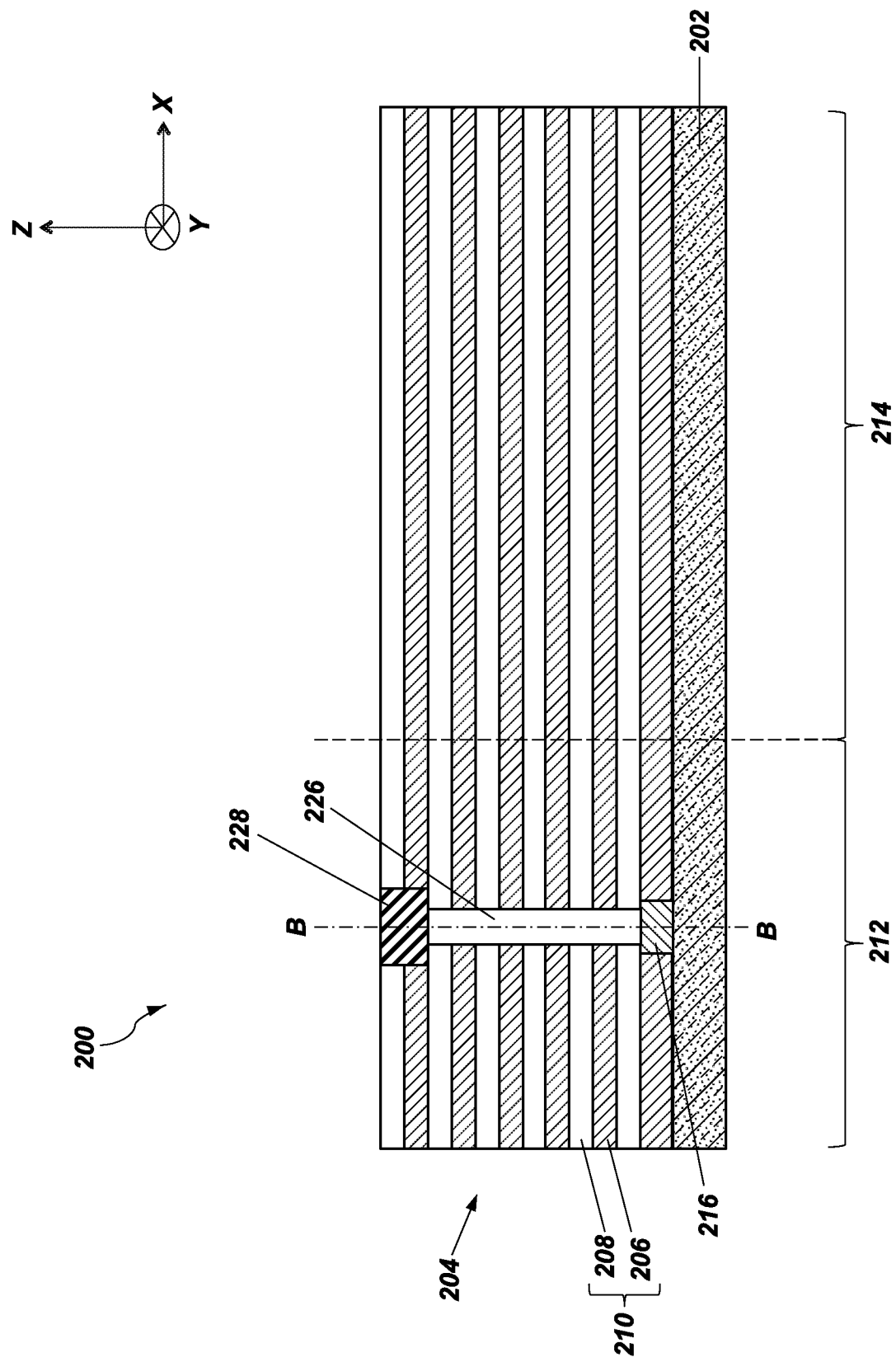

Referring next to FIG. 16A, openings 226 (e.g., vias) may be formed within the memory array region 212 of the microelectronic device structure 200, and plug structures 228 may be formed at upper vertical boundaries (e.g., in the Z-direction) of the openings 226 to substantially plug (e.g., cover) the openings 226. FIG. 16B is a simplified partial cross-sectional view of the microelectronic device structure 200 at the processing stage depicted in FIG. 16A about the line B-B shown in FIG. 16A.

As shown in FIG. 16B, the openings 226 may vertically extend (e.g., in the Z-direction) through portions of the first preliminary stack structure 204 within the memory array region 212 of the microelectronic device structure 200. The openings 226 may positioned horizontally between (e.g., in the Y-direction) portions of the interdeck dielectric structures 224 within the memory array region 212 of the microelectronic device structure 200. The openings 226 may each individually be at least partially (e.g., substantially) horizontally aligned (e.g., in the X-direction and in the Y-direction) with one of the contact structures 216 vertically thereunder. Lower vertical boundaries of the openings 226 may be defined by surfaces (e.g., upper surfaces) of the contact structures 216, and horizontal boundaries of the openings 226 may be defined by surfaces (e.g., side surfaces) of the first preliminary stack structure 204 (e.g., surfaces of the first insulative structures 206 and the second insulative structures 208 of the tiers 210 thereof). The openings 226 may subsequently be filled with material to form pillar structures within the memory array region 212 of the microelectronic device structure 200, as described in further detail below.

Geometric configurations (e.g., shapes, dimensions) and quantities of the openings 226 may be substantially similar to the geometric configurations and quantities of the openings 126 previously described with reference to FIGS. 6A and 6B. In addition, the openings 226 may be formed using conventional processes (e.g., conventional photolithographic patterning processes, conventional etching processes) and conventional processing equipment, which are not described in detail herein.

With continued reference to FIG. 16B, the plug structures 228 may vertically extend (e.g., in the Z-direction) into the first preliminary stack structure 204 and may plug the openings 226. The plug structures 228 may be configured and positioned to protect the openings 226 from being filled with material during additional processing acts to form an additional preliminary stack structure over the first preliminary stack structure 204, as described in further detail below. Each of the plug structures 228 may be at least partially (e.g., substantially) horizontally aligned (e.g., in the X-direction and in the Y-direction) with one of the openings 226 vertically thereunder. Lower vertical boundaries of the plug structures 228 may be defined by upper vertical boundaries of remaining, unfilled portions of the openings 126 and horizontally extending surfaces of the first preliminary stack structure 204 vertically above lowermost vertical boundaries of the interdeck dielectric structures 224. As shown in FIG. 16B, in some embodiments, lower vertical boundaries of the plug structures 228 are substantially coplanar with lower vertical boundaries of a vertically uppermost tier 210 of the first preliminary stack structure 204. In some embodiments, lower vertical boundaries of the plug structures 228 are vertically offset from (e.g., vertically above, vertically below) lower vertical boundaries of a vertically uppermost tier 210 of the first preliminary stack structure 204. Horizontal boundaries of the plug structures 228 may be defined by vertically extending surfaces (e.g., side surfaces) of the first preliminary stack structure 204. The plug structures 228 may positioned horizontally between (e.g., in the Y-direction) portions of the interdeck dielectric structures 224 within the memory array region 212 of the microelectronic device structure 200.

Geometric configurations (e.g., shapes, dimensions) and material compositions of the plug structures 228 may respectively be substantially similar to the geometric configurations and material compositions of the plug structures 128 previously described with reference to FIGS. 6A and 6B. In addition, the plug structures 228 may be formed using conventional processes (e.g., conventional material removal processes, such as conventional etching processes and conventional planarization processes; conventional deposition processes, such as conventional non-conformal deposition processes) and conventional processing equipment, which are not described in detail herein.

Figure 17A:
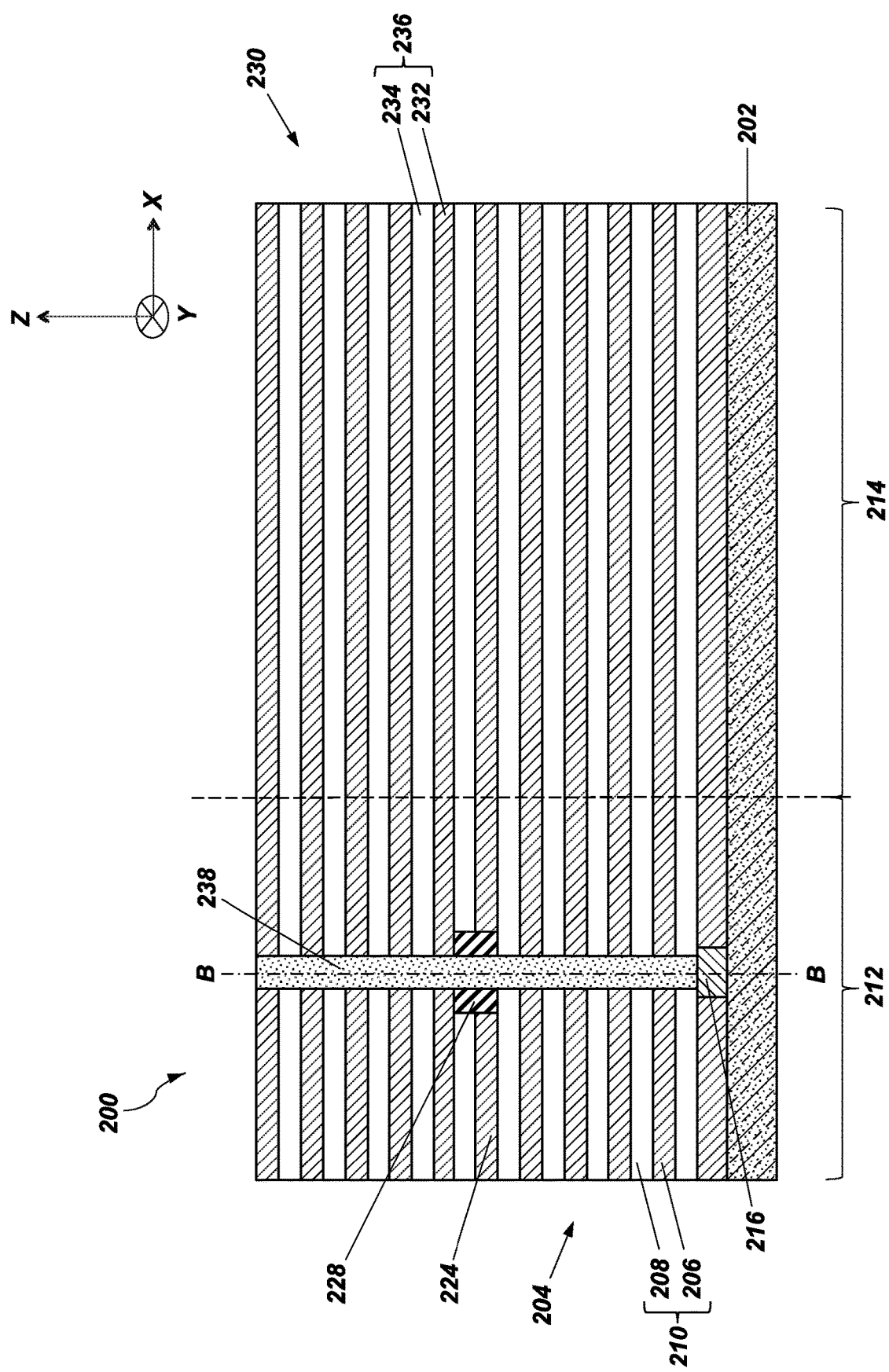

Referring next to FIG. 17A, a second preliminary stack structure 230 may be formed on or over the first preliminary stack structure 204, the interdeck dielectric structures 224, and the plug structures 228; and then pillar structures 238 may be formed to vertically extend through the second preliminary stack structure 230, the plug structures 228, and the first preliminary stack structure 204 within the memory array region 212 of the microelectronic device structure 200.

Figure 17B:
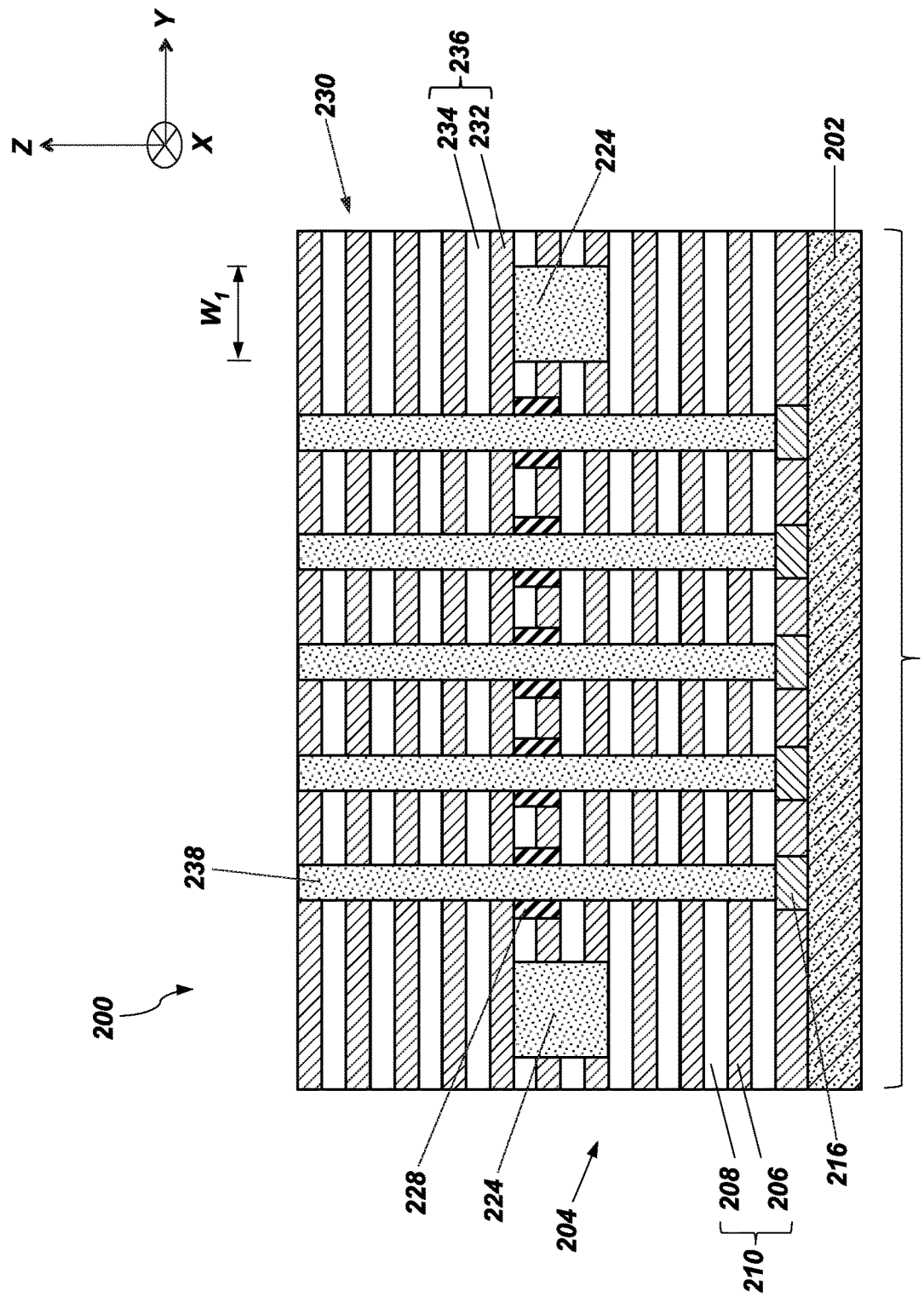

As shown in FIG. 17A, the second preliminary stack structure 230 may horizontally extend through the memory array region 212 and the staircase region 214 of the microelectronic device structure 200, and the pillar structures 238 may be horizontally confined within the memory array region 212 of the microelectronic device structure 200. FIG. 17B is a simplified partial cross-sectional view of the microelectronic device structure 100 at the processing stage depicted in FIG. 17A about the line B-B shown in FIG. 17A.

The second preliminary stack structure 230 may be formed to include a vertically alternating (e.g., in the Z-direction) sequence of additional first insulative structures 232 and additional second insulative structures 234 arranged in additional tiers 236. The second preliminary stack structure 230 (including the additional tiers 236 of the additional first insulative structures 232 and additional second insulative structures 234) may be substantially similar to the second preliminary stack structure 130 (including the additional tiers 136 of the additional first insulative structures 132 and additional second insulative structures 134) previously described with reference to FIGS. 7A and 7B. The second preliminary stack structure 230 may be formed using conventional processes (e.g., conventional material deposition processes), and conventional processing equipment, which are not described in detail herein.

Within the memory array region 212 of the microelectronic device structure 200, the pillar structures 238 may be formed to vertically extend from an upper surface of the second preliminary stack structure 230 to upper surfaces of the contact structures 216. The pillar structures 238 may be substantially similar to the pillar structures 138 previously described with reference to FIGS. 7A and 7B. In addition, the pillar structures 238 may be formed using conventional processes (e.g., conventional material deposition processes, conventional material removal processes), and conventional processing equipment, which are not described in detail herein.

Figure 18B:
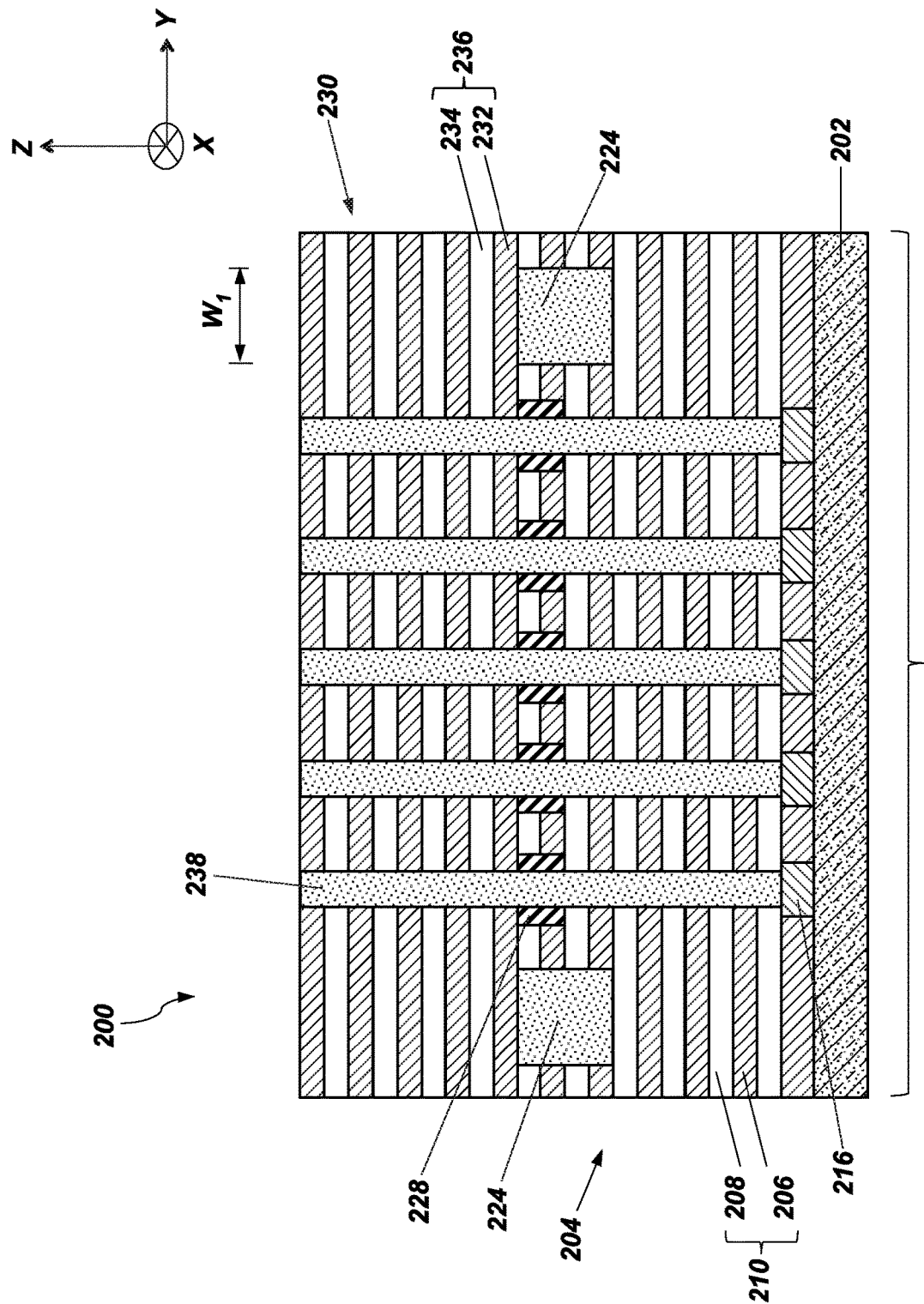

Referring next to FIG. 18A, upper stadium structures 240 may be formed within portions of the second preliminary stack structure 230 within horizontal boundaries of the staircase region 214 of the microelectronic device structure 200. The upper stadium structures 240 may each individually include opposing staircase structures 244 (e.g., a forward staircase structure 244a and a reverse staircase structure 244b mirroring the forward staircase structure 244a) each having steps 246 defined by horizontal ends of the additional tiers 236 of the second preliminary stack structure 230. Boundaries (e.g., vertical boundaries, horizontal boundaries) of trenches 242 (e.g., openings) formed to vertically extend into the second preliminary stack structure 230 may be at least partially defined by the upper stadium structures 240. The trenches 242 may each individually horizontally intervene between the opposing staircase structures 244 of one of the upper stadium structures 240. FIG. 18B is a simplified partial cross-sectional view of the microelectronic device structure 200 at the processing stage depicted in FIG. 18A about the line B-B shown in FIG. 18A.

The upper stadium structures 240 (including the opposing staircase structures 244 and the steps 246 thereof) and the trenches 242 may respectively be substantially similar to the upper stadium structures 140 (including the opposing staircase structures 144 and the steps 146 thereof) and the trenches 142 previously described with reference to FIGS. 8A and 8B. The upper stadium structures 240 may be formed using conventional processes (e.g., conventional photolithographic patterning processes, conventional material removal processes), and conventional processing equipment, which are not described in detail herein.

Figure 19A:
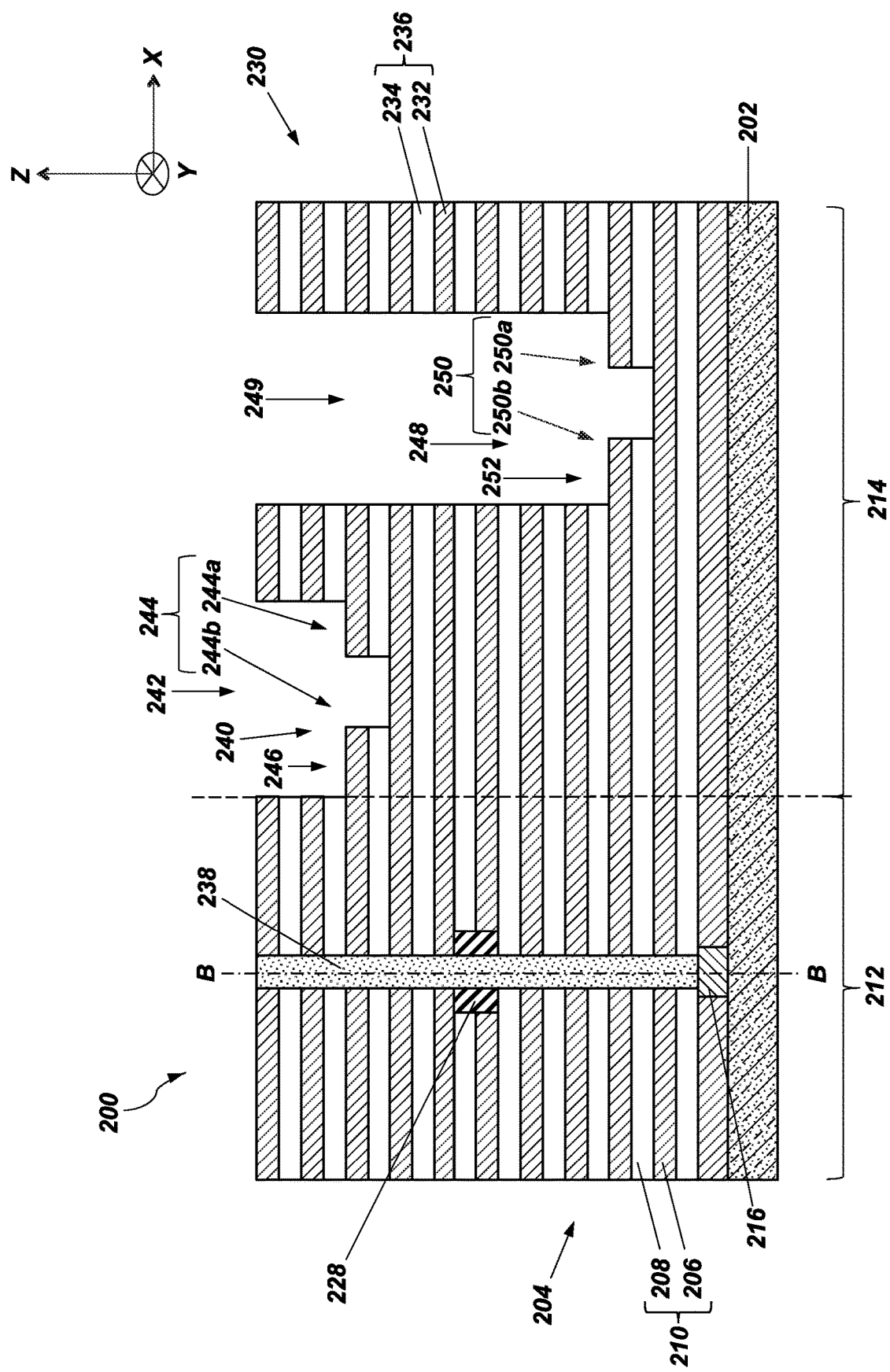
Figure 19B:
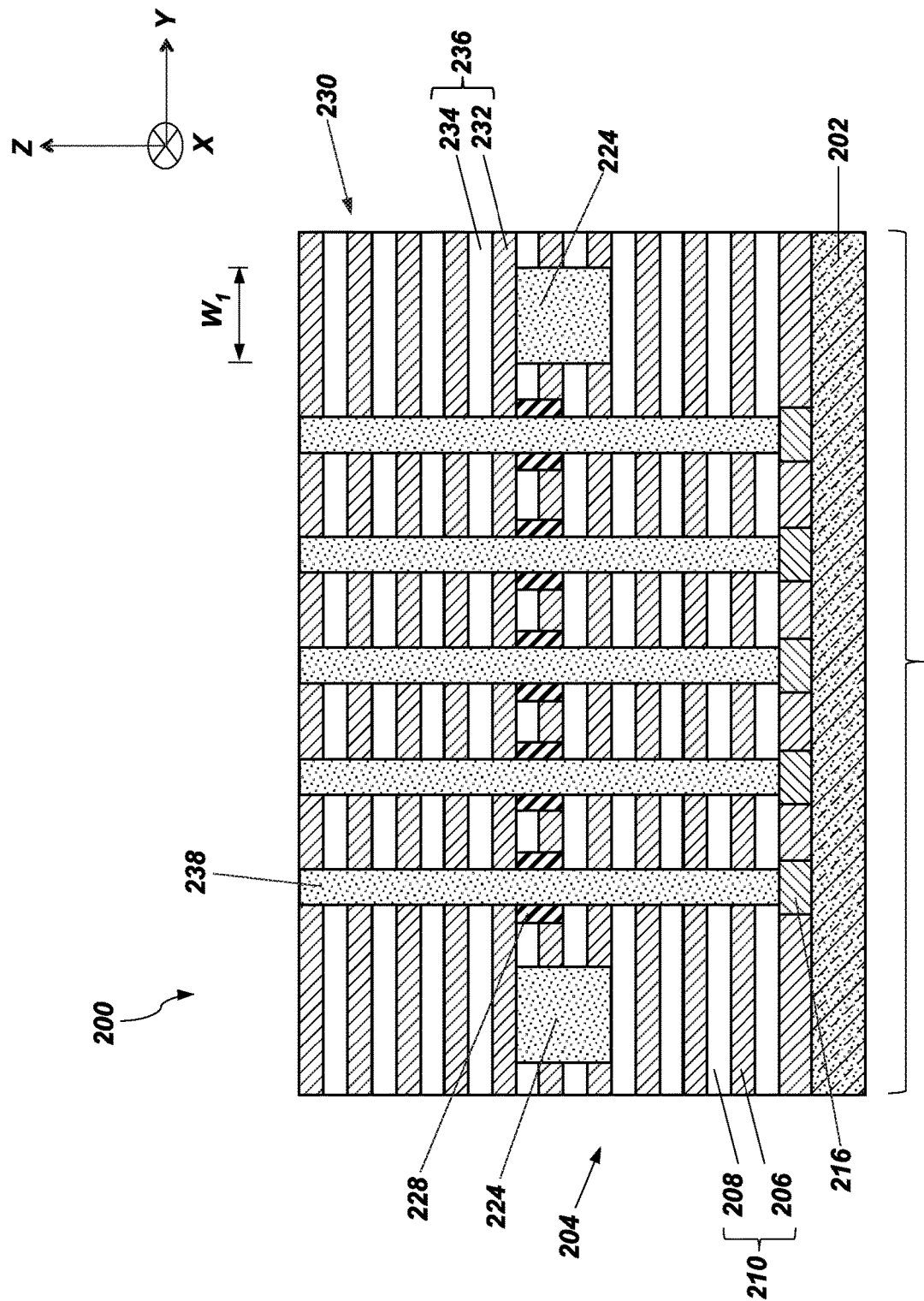

Referring next to FIG. 19A, the microelectronic device structure 200 may be subjected to one or more material removal processes (e.g., one or more chopping processes) to increase the depth(s) (e.g., in the Z-direction) of one or more the upper stadium structures 240 relative to one or more other of the upper stadium structures 240 and form at least one lower stadium structure 248. As shown in FIG. 19A, the lower stadium structure(s) 248 may be formed to be vertically positioned within the first preliminary stack structure 204, while the upper stadium structure(s) 240 may remain vertically positioned within the second preliminary stack structure 230. FIG. 19B is a simplified partial cross-sectional view of the microelectronic device structure 200 at the processing stage depicted in FIG. 19A about the line B-B shown in FIG. 19A.

As shown in FIG. 19A, each of the lower stadium structure(s) 248 may include opposing staircase structures 250 (e.g., a forward staircase structure 250a and a reverse staircase structure 250b that mirrors the forward staircase structure 250a) each having steps 252 defined by horizontal ends of the tiers 210 of the first preliminary stack structure 204. Boundaries (e.g., vertical boundaries, horizontal boundaries) of one or more additional trenches 249 (e.g., additional openings) formed to vertically extend through the second preliminary stack structure 230 and into the first preliminary stack structure 204 may be partially defined by the lower stadium structure(s) 248. The additional trench(es) 249 may each individually horizontally intervene between the opposing staircase structures 250 of one of the lower stadium structure(s) 248. Aside from being located at the horizontal ends of the tiers 210 of the first preliminary stack structure 204, the opposing staircase structures 250 (including the configurations of the steps 252 thereof) of the lower stadium structure(s) 248 may be formed to be substantially similar to the opposing staircase structures 244 (including the configurations of the steps 246 thereof) of the upper stadium structure(s) 240 utilized to form the lower stadium structure(s) 248.

As shown in FIG. 19A, tiers 210 of the first preliminary stack structure 204 at the same vertical positions (e.g., in the Z-direction) as portions of the interdeck dielectric structures 134 may be substantially free of portions (e.g., steps 152) of the lower stadium structure(s) 248 therein. For example, all of the steps 252 of the lower stadium structure(s) 248 may be positioned vertically below the tiers 210 of the first preliminary stack structure 204 located at the same vertical positions (e.g., in the Z-direction) as portions of the interdeck dielectric structures 224. The tiers 210 of the first preliminary stack structure 204 at the same vertical positions (e.g., in the Z-direction) as portions of the interdeck dielectric structures 224 may form an inactive (e.g., dummy) region a stack structure subsequently formed from the first preliminary stack structure 204 and the second preliminary stack structure 230, as described in further detail below. In additional embodiments, one or more of the tiers 210 of the first preliminary stack structure 204 at the same vertical position(s) (e.g., in the Z-direction) as at portion(s) of the interdeck dielectric structures 224 may include portion(s) (e.g., one or more steps 252) of the lower stadium structure(s) 248 therein.

The lower stadium structure(s) 248 (including the opposing staircase structures 250 and the steps 252 thereof) and the additional trench(es) 249 may be formed in using a process substantially similar that previously described with reference to FIGS. 9A and 9B for the formation of the lower stadium structure(s) 148 (including the opposing staircase structures 150 and the steps 152 thereof) and the additional trench(es) 149.

Figure 20A:
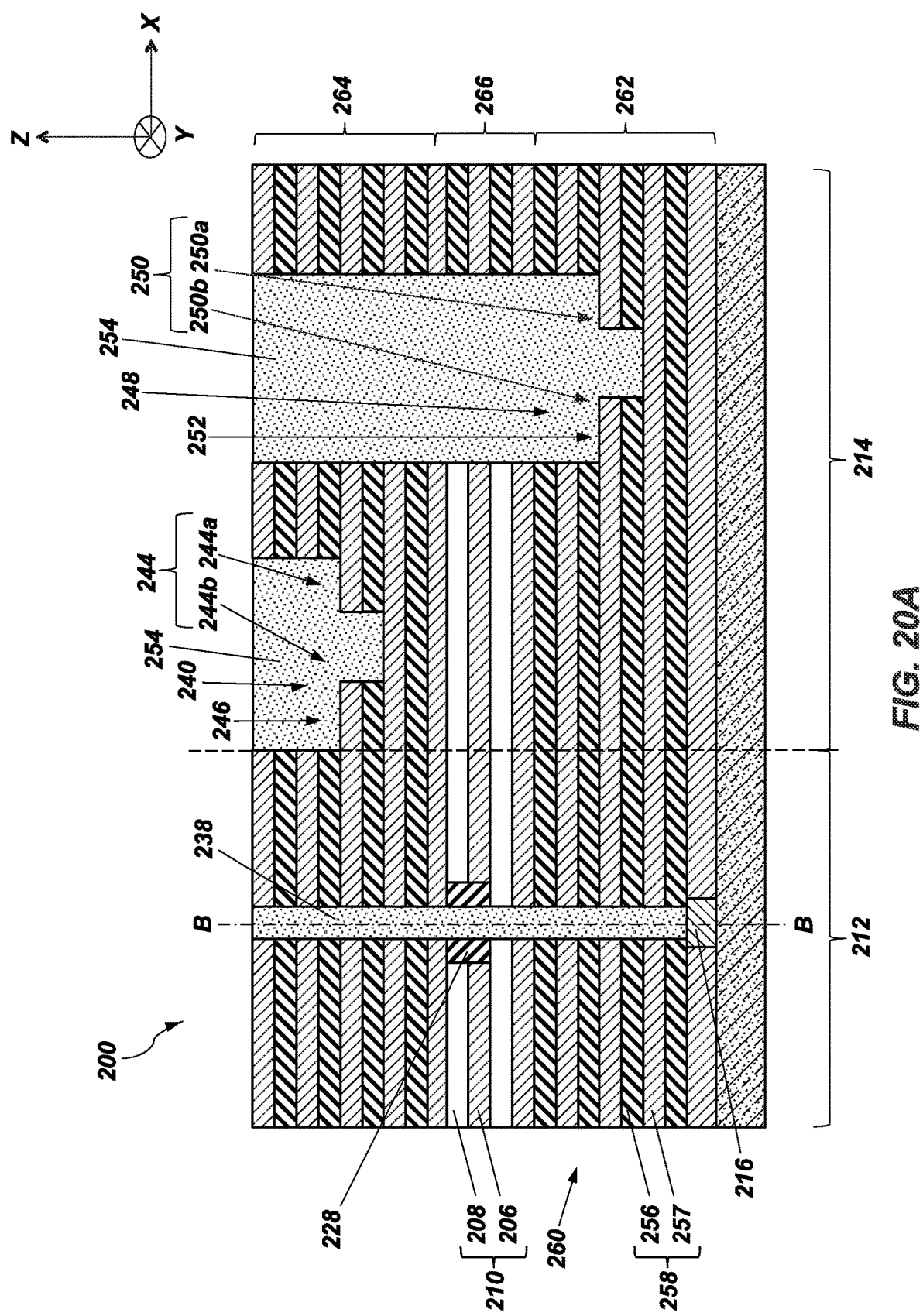
Figure 20B:
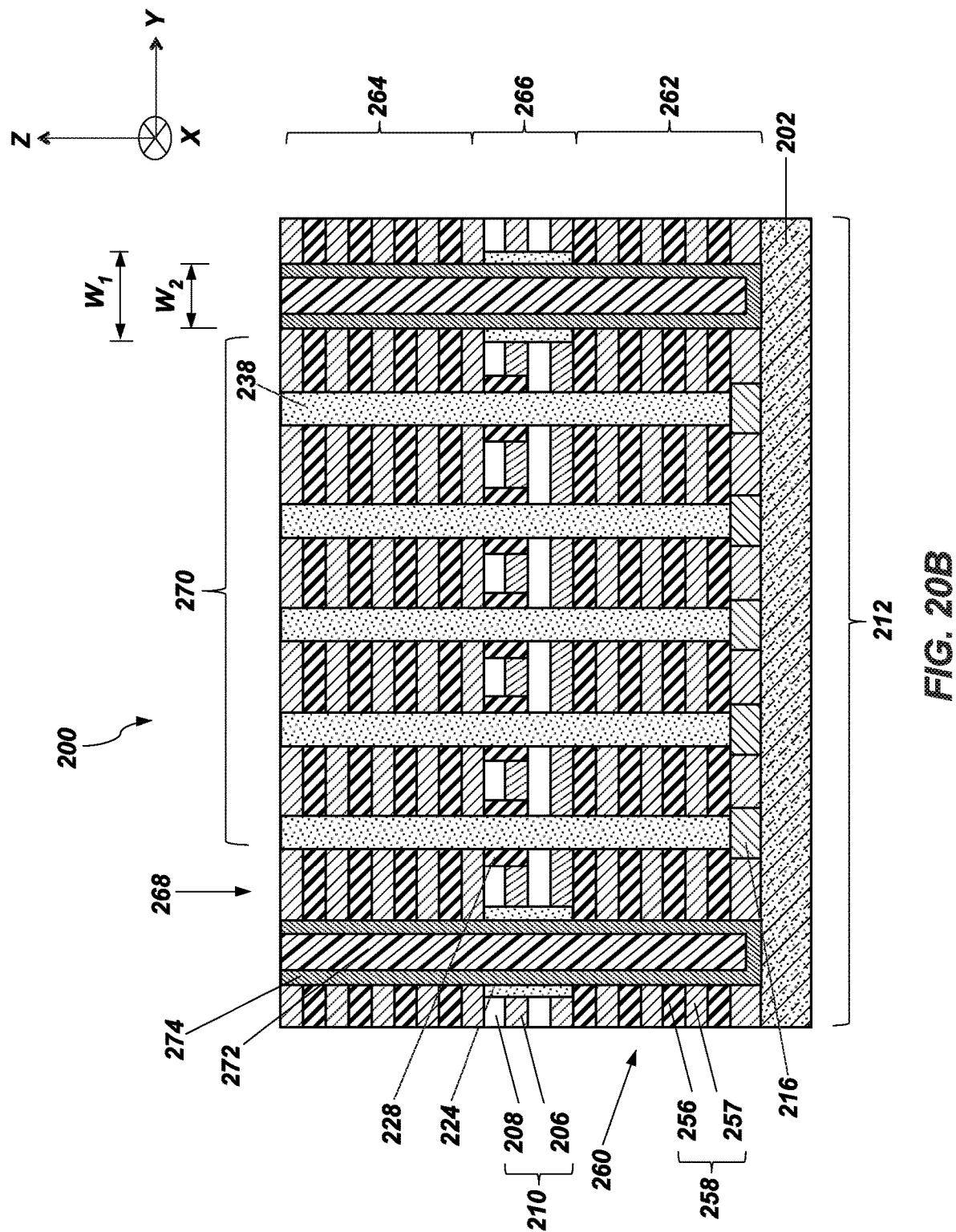

Referring next to FIG. 20A, isolation material 254 may be formed within the trench(es) 242 (FIG. 19A) and the additional trench(es) 249 (FIG. 19A), and the microelectronic device structure 200 may be subjected to so called "replacement gate" or "gate last" processing acts to at least partially replace some (e.g., less than all) of the second insulative structures 208 (FIG. 19A) of the first preliminary stack structure 204 (FIG. 19A) and the additional second insulative structures 234 (FIG. 19A) of the second preliminary stack structure 230 (FIG. 19A) with conductive structures 256 and form a stack structure 260. The isolation material 254 and the conductive structures 256 may respectively be substantially similar to the isolation material 154 and the conductive structures 156 previously described with reference to FIGS. 10A and 10B. FIG. 20B is a simplified partial cross-sectional view of the microelectronic device structure 200 at the processing stage depicted in FIG. 20A about the line B-B shown in FIG. 20A.

Referring to FIG. 20B, the stack structure 260 includes a vertically alternating (e.g., in the Z-direction) sequence of the conductive structures 256 and insulative structures 257 arranged in tiers 258 positioned vertically above and vertically below the interdeck dielectric structures 224; and also includes tiers 210 of the first insulative structures 206 and the second insulative structures 208 at vertical positions within vertical boundaries of the interdeck dielectric structures 224. The insulative structures 257 may correspond to remainders (e.g., remaining portions) of the first insulative structures 206 (FIG. 9A) of the first preliminary stack structure 204 (FIG. 9A) and the additional first insulative structures 232 (FIG. 9A) of the second preliminary stack structure 230 (FIG. 9A) at vertical positions outside of (e.g., beyond) the vertical boundaries of interdeck dielectric structures 224. Each of the tiers 258 of the stack structure 260 includes at least one of the conductive structures 256 vertically neighboring at least one of the insulative structures 257.

With continued reference to FIG. 20B, to form the stack structure 260, slots 268 (e.g., slits, trenches) may be formed to vertically extend through the second preliminary stack structure 230 (FIGS. 19A and 19B), the interdeck dielectric structures 224, and the first preliminary stack structure 204 (FIGS. 9A and 9B) to form discrete blocks 270. Each of the slots 268 may be formed to have a width $W_2$ (e.g., dimension in the Y-direction) less that the width $W_1$ of the interdeck dielectric structure 224 through which the slot 268 vertically extends. Thereafter, portions of the portions of the additional second insulative structures 234 (FIGS. 19A and 19B) of the second preliminary stack structure 230 (FIGS. 9A and 9B) and portions of second insulative structures 208 (FIGS. 9A and 9B) of the first preliminary stack structure 204 (FIGS. 19A and 19B) outside of the vertical boundaries of the interdeck dielectric structures 224 may be selectively removed (e.g., selectively etched and exhumed) through the slots 268, and replaced with electrically conductive material to form the conductive structures 256. Remaining portions of the interdeck dielectric structures 224 may substantially prevent portions of the second insulative structures 208 within the vertical boundaries of the interdeck dielectric structures 224 from being removed through the slots 268 and replaced with the electrically conductive material. Some of the conductive structures 256 may function as access line structures (e.g., word line structures) for the microelectronic device structure 200, and other of the conductive structures 256 may function as select gate structures for the microelectronic device structure 200. Following the formation of the conductive structures 256 the slots 268 may be filled with at least one dielectric fill material 272, and, optionally, at least one dielectric liner material 274, as depicted in FIG. 20B. The dielectric fill material 272 and the dielectric liner material 274 (if formed) may respectively be substantially similar to the dielectric fill material 172 and the dielectric liner material 174 previously described with reference to FIG. 10B.

Referring again to FIG. 20A, the following the formation of the stack structure 260, the microelectronic device structure 200 may include a lower deck 262, an upper deck 264 vertically overlying the lower deck 262, and interdeck section 266 vertically intervening between the lower deck 262 and the upper deck 264. The lower deck 262 may comprise tiers 258 (including the conductive structures 256 and the insulative structures 257 thereof) of the stack structure 260 vertically underlying the interdeck dielectric structures 224. The upper deck 264 may comprise tiers 258 (including the conductive structures 256 and the insulative structures 257 thereof) of the stack structure 260 vertically overlying the interdeck dielectric structures 224. The interdeck section 266 may comprise the interdeck dielectric structures 224 and tiers 210 (including the first insulative structures 206 and the second insulative structures 208 thereof) of the stack structure 260 horizontally neighboring and within the vertical boundaries of the interdeck dielectric structures 224. The tiers 210 of the stack structure 260 within the interdeck section 266 may comprise so-called "dummy tiers" that do not facilitate electrical communication between two of more components (e.g., memory cells, string drivers) of a microelectronic device including the microelectronic device structure 200. Conversely, at least some of the tiers 258 of the stack structure 260 within the lower deck 262 and the upper deck 264 of the microelectronic device structure 200 comprise so-called "active tiers" that facilitate electrical communication between two of more components (e.g., memory cells, string drivers) of a microelectronic device including the microelectronic device structure 200. Optionally, one or more of the tiers 258 of the stack structure 260 within the lower deck 262 vertically proximate (e.g., vertically neighboring) the interdeck section 266 may comprise dummy tiers, so long as one or more other of the tiers 258 of the stack structure 260 within the lower deck 262 comprise active tiers; and/or one or more of the tiers 258 of the stack structure 260 within the upper deck 264 vertically proximate (e.g., vertically neighboring) the interdeck section 266 may comprise dummy tiers, so long as one or more other of the tiers 258 of the stack structure 260 within the upper deck 264 comprise active tiers.

Thus, in accordance with embodiments of the disclosure, a microelectronic device comprises a microelectronic device structure comprising a stack structure, staircase structures, and semiconductive pillar structures. The stack structure has tiers each comprising a conductive structure and an insulative structure vertically neighboring the conductive structure. The stack structure comprises a lower deck comprising some of the tiers, an upper deck overlying the deck and comprising other of the tiers, and an interdeck section between the lower deck and the upper deck. The interdeck section comprises interdeck dielectric structures, and additional tiers horizontally between the interdeck dielectric structures. The additional tiers each comprise an additional insulative structure and a further insulative structure vertically neighboring the additional insulative structure. The staircase structures have steps comprising edges of the tiers of the stack structure within the lower deck and the upper deck. The semiconductive pillar structures vertically extend through the stack structure.

Furthermore, in accordance with embodiments of the disclosure, a method of forming a microelectronic device comprises forming a microelectronic device structure comprising a first preliminary stack structure comprising a vertically alternating sequence of first insulative structures and second insulative structures arranged in tiers. Dielectric structures are formed to vertically extend into the first preliminary stack structure. The dielectric structures are horizontally spaced apart from one another in a first direction and substantially linearly horizontally extend in a second direction orthogonal to the first direction. A second preliminary stack structure is formed over the first preliminary stack structure and the dielectric structures. The second preliminary stack structure comprises a vertically alternating sequence of additional first insulative structures and additional second insulative structures arranged in additional tiers. Semiconductive pillar structures are formed to vertically extend through portions of the second preliminary stack structure and the first preliminary stack structure positioned horizontally between the dielectric structures. Staircase structures are formed within the second preliminary stack structure and the first preliminary stack structure. Some of the staircase structures having steps comprise edges of the tiers of the first preliminary stack structure. Other of the staircase structures have additional steps comprising edges of the additional tiers of the second preliminary stack structure. The additional second insulative structures of the second preliminary stack structure and the second insulative structures of the first preliminary stack structure positioned outside of vertical boundaries of the dielectric structures are replaced with conductive structures.

Figure 21:
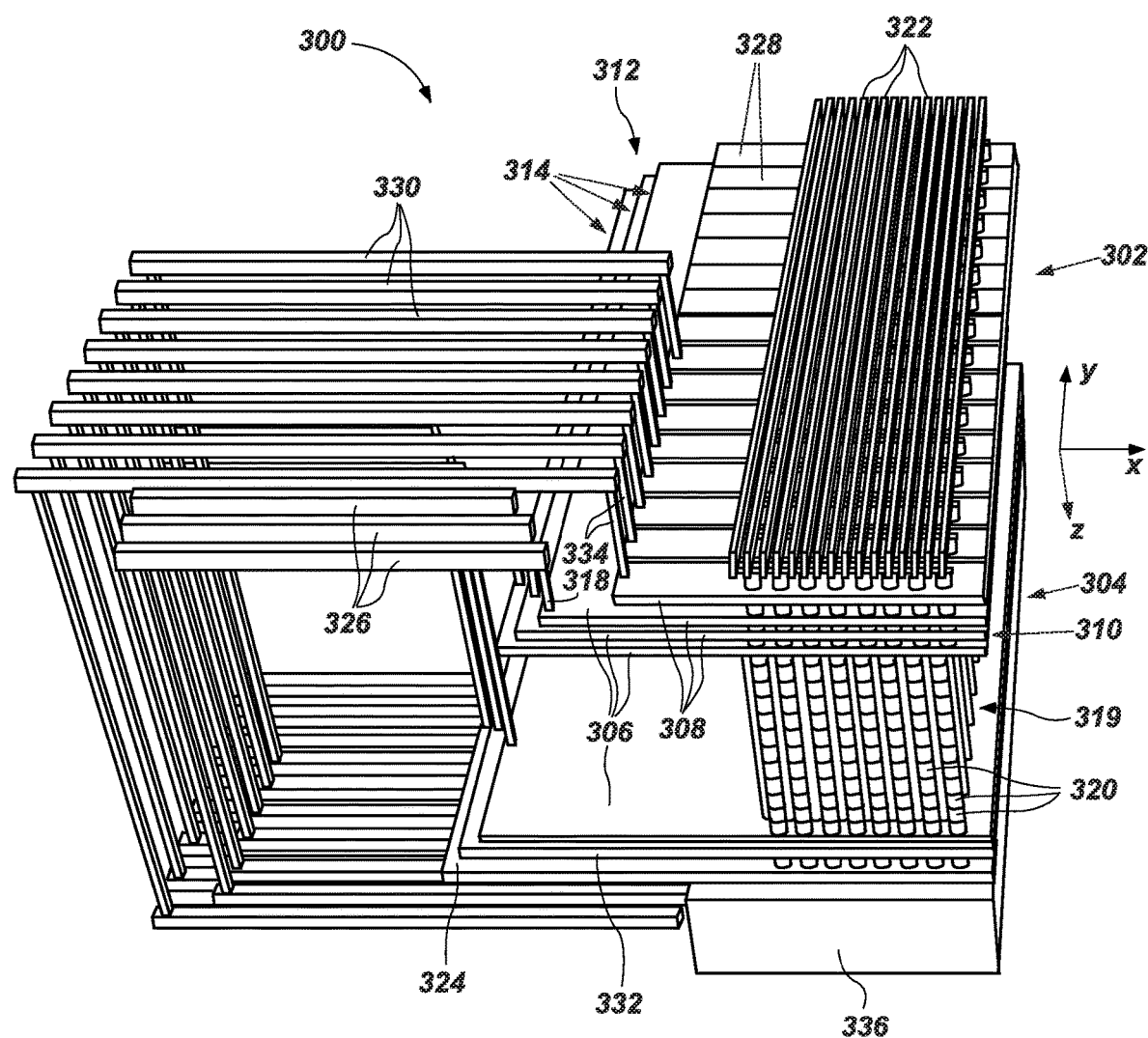
FIG. 21 is a simplified partial cutaway perspective view of a microelectronic device, in accordance with embodiments of the disclosure.

FIG. 21 illustrates a partial cutaway perspective view of a portion of a microelectronic device 300 (e.g., a memory device, such as a 3D NAND Flash memory device) including a microelectronic device structure 302. The microelectronic device structure 302 may be substantially similar to the microelectronic device structure 100 at the processing stage previously described with reference to FIGS. 10A and 10B, or the microelectronic device structure 302 may be substantially similar the microelectronic device structure 200 at the processing stage previously described with reference to FIGS. 20A and 20B. In some embodiments, the microelectronic device structure 302 is formed through the processes previously described with reference to FIGS. 1A through 10B. In additional embodiments, the microelectronic device structure 302 is formed through the processes previously described with reference to FIGS. 11A through 20B. As shown in FIG. 21, the microelectronic device structure 302 may include a stack structure 304 including a vertically alternating (e.g., in the Z-direction) sequence of conductive structures 306 and insulative structures 308 arranged in tiers 310; staircase structures 312 having steps 314 defined by edges (e.g., horizontal ends in the X-direction) of the tiers 310. In some embodiments, the stack structure 304, the conductive structures 306, the insulative structures 308, the tiers 310, the staircase structures 312, and the steps 314 are respectively substantially similar to the stack structure 160, the conductive structures 156, the insulative structures 157, the tiers 158, the staircase structures 144 and 150, and the steps 146 and 152 previously described with reference to FIGS. 10A and 10B. In such embodiments, the microelectronic device structure 302 further includes an interdeck dielectric structure substantially similar to the interdeck dielectric structure 124 previously described with reference to the microelectronic device structure 100 at the process stage depicted in FIGS. 10A and 10B. In additional embodiments, the stack structure 304, the conductive structures 306, the insulative structures 308, the tiers 310, the staircase structures 312, and the steps 314 are respectively substantially similar to the stack structure 260, the conductive structures 256, the insulative structures 257, the tiers 258, the staircase structures 244 and 250, and the steps 246 and 252 previously described with reference to FIGS. 20A and 20B. In such embodiments, the microelectronic device structure 302 further includes interdeck dielectric structures and additional tiers substantially similar to the interdeck dielectric structures 224 and the tiers 210 (including the first insulative structures 206 and the second insulative structures 208 thereof) previously described with reference to the microelectronic device structure 200 at the process stage depicted in FIGS. 20A and 20B. The microelectronic device 300 also includes additional features (e.g., structures, devices) operatively associated with the microelectronic device structure 302, as described in further detail below.

The microelectronic device 300 may further include vertical strings 319 of memory cells 320 coupled to each other in series, data lines 322 (e.g., bit lines), a source structure 324, access lines 326, first select gates 328 (e.g., upper select gates, drain select gates (SGDs)), select lines 330, second select gates 332 (e.g., lower select gates, source select gate (SGSs)), contact structures 318, and additional contact structures 334. The vertical strings 319 of memory cells 320 extend vertically and orthogonal to conductive lines and tiers (e.g., the data lines 322, the source structure 324, the tiers 310 of the stack structure 304, the access lines 326, the first select gates 328, the select lines 330, the second select gates 332). The contact structures 318 and the additional contact structures 334 may electrically couple components to each other as shown (e.g., the select lines 330 to the first select gates 328, the access lines 326 to the tiers 310 of the stack structure 304 of the microelectronic device structure 302).

With continued reference to FIG. 21, the microelectronic device 300 may also include a control unit 336 (e.g., a control device) positioned vertically below the vertical strings 319 of memory cells 320, which may include one or more of string driver circuitry, pass gates, circuitry for selecting gates, circuitry for selecting conductive lines (e.g., the access lines 326, the select lines 330, the data lines 322, additional access lines, additional select lines, additional data lines), circuitry for amplifying signals, and circuitry for sensing signals. In some embodiments, the control unit 336 is at least partially (e.g., substantially) positioned within horizontal boundaries (e.g., in the X-direction and the Y-direction) of a horizontal area occupied by the vertical strings 319 of memory cells 320. The control unit 336 may, for example, be electrically coupled to the data lines 322, the source structure 324, the access lines 326, and select lines 330. In some embodiments, the control unit 336 includes CMOS (complementary metal-oxide-semiconductor) circuitry. In such embodiments, the control unit 336 may be characterized as having a "CMOS under Array" ("CuA") configuration.

Figure 22:
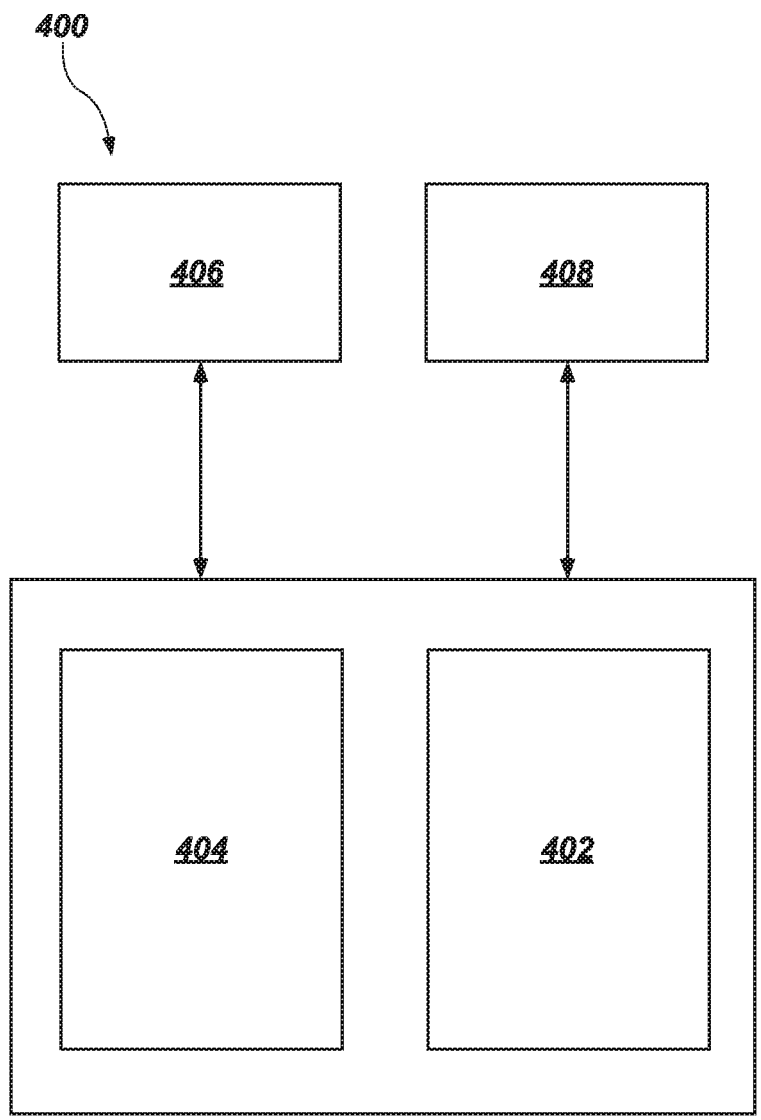
FIG. 22 is a schematic block diagram illustrating an electronic system, in accordance with embodiments of the disclosure.

Microelectronic device structures (e.g., the microelectronic device structure 100 previously described with reference to FIGS. 10A and 10B; the microelectronic device structure 200 previously described with reference to FIGS. 20A and 20B) and microelectronic devices (e.g., the microelectronic device 300 previously described with reference to FIG. 21) in accordance with embodiments of the disclosure may be used in embodiments of electronic systems of the disclosure. For example, FIG. 22 is a block diagram of an illustrative electronic system 400 according to embodiments of disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 400 includes at least one memory device 402. The memory device 402 may comprise, for example, an embodiment of one or more of a microelectronic device structure and a microelectronic device previously described herein. The electronic system 400 may further include at least one electronic signal processor device 404 (often referred to as a "microprocessor"). The electronic signal processor device 404 may, optionally, include an embodiment of one or more of a microelectronic device structure and a microelectronic device previously described herein. While the memory device 402 and the electronic signal processor device 404 are depicted as two (2) separate devices in FIG. 22, in additional embodiments, a single (e.g., only one) memory/processor device having the functionalities of the memory device 402 and the electronic signal processor device 404 is included in the electronic system 400. In such embodiments, the memory/processor device may include one or more of a microelectronic device structure and a microelectronic device previously described herein. The electronic system 400 may further include one or more input devices 406 for inputting information into the electronic system 400 by a user, such as, for example, a mouse or other pointing device, a keyboard, a touchpad, a button, or a control panel. The electronic system 400 may further include one or more output devices 408 for outputting information (e.g., visual or audio output) to a user such as, for example, one or more of a monitor, a display, a printer, an audio output jack, and a speaker. In some embodiments, the input device 406 and the output device 408 may comprise a single touchscreen device that can be used both to input information to the electronic system 400 and to output visual information to a user. The input device 406 and the output device 408 may communicate electrically with one or more of the memory device 402 and the electronic signal processor device 404.

Thus, in accordance with embodiments of the disclosure, an electronic system comprises an input device, an output device, a processor device operably coupled to the input device and the output device, and a memory device operably coupled to the processor device and comprising at least one microelectronic device structure having a memory array region and a staircase region. The at least one microelectronic device structure comprises a stack structure, staircase structures, and semiconductive pillar structures. The stack structure has tiers each comprising a conductive structure and an insulative structure vertically neighboring the conductive structure. The stack structure comprises a deck comprising some of the tiers, an additional deck vertically overlying the deck and comprising other of the tiers, and an interdeck section vertically between the deck and the additional deck. The interdeck section comprises at least one dielectric structure within horizontal boundaries of the memory array region and either substantially absent from or less than completely extending across a horizontal area of the staircase region. The staircase structures are within the staircase region and have steps comprising edges of the tiers of the stack structure within the deck and the additional deck. The semiconductive pillar structures are within the memory array region and vertically extend through the stack structure.

The methods, structures (e.g., the microelectronic device structures 100, 200, 302), devices (e.g., the microelectronic device 300), and systems (e.g., the electronic system 400) of the disclosure advantageously facilitate one or more of improved performance, reliability, and durability, lower costs, increased miniaturization of components, improved pattern quality, and greater packaging density as compared to conventional structures, conventional devices, and conventional systems. The methods and structures of the disclosure may alleviate problems related to the formation and processing of conventional microelectronic devices including stack structures having staircase structures at edges thereof. For example, the methods and structures of the disclosure may permit staircase structure configurations formed in one or more relatively vertically higher preliminary stack structures (e.g., the second preliminary stack structures 130, 230) to be efficiently transferred into one or more relatively vertically lower preliminary stack structures (e.g., the first preliminary stack structures 104, 204) using simple chopping processes, thereby avoiding complex, inefficient, and costly processes (e.g., separate staircase formation processes each including a series of masking and etching acts) conventionally associated with forming staircase structures within different decks of a conventional microelectronic device structure.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
   a microelectronic device structure having a memory array region and a staircase region, the microelectronic device structure comprising:
      a stack structure having tiers each comprising a conductive structure and an insulative structure vertically neighboring the conductive structure, the stack structure comprising:
         a deck comprising a group of the tiers;
         an additional deck vertically overlying the deck and comprising an additional group of the tiers; and
         an interdeck section vertically between the deck and the additional deck, the interdeck section comprising:
            a dielectric structure horizontally confined within the memory array region; and
            another group of the tiers within vertical boundaries of the dielectric structure and horizontally confined within of the staircase region;
      staircase structures horizontally confined within the staircase region and having steps comprising edges of the tiers of the stack structure within the deck and the additional deck; and
      semiconductive pillar structures horizontally confined within the memory array region and vertically extending through the stack structure.

2. The microelectronic device of claim 1, further comprising plug structures within dielectric structure and horizontally surrounding the semiconductive pillar structures.

3. The microelectronic device of claim 1, wherein the other group of the tiers within the interdeck section of the stack structure comprises at least two of the tiers of the stack structure.

4. The microelectronic device of claim 1, wherein the dielectric structure and the insulative structure of each of the tiers of the stack structure comprise at least one dielectric oxide material.

5. The microelectronic device of claim 1, wherein the interdeck section of the stack structure is free of any portions of the staircase structures within vertical boundaries thereof.

6. The microelectronic device of claim 1, wherein the staircase structures comprise:
   a first stadium structure within the deck of the stack structure and comprising:
      a first staircase structure having positive slope, as defined by a first phantom line extending from a top of the first staircase structure to a bottom of the first staircase structure; and
      a second staircase structure opposing the first staircase structure and having negative slope, as defined by a second phantom line extending from a top of the second staircase structure to a bottom of the second staircase structure; and
   a second stadium structure within the additional deck of the stack structure and comprising:
      a third staircase structure having additional positive slope, as defined by a third phantom line extending from a top of the third staircase structure to a bottom of the third staircase structure; and
      a fourth staircase structure opposing the third staircase structure and having additional negative slope, as defined by a fourth phantom line extending from a top of the fourth staircase structure to a bottom of the fourth staircase structure.

7. An electronic system, comprising:
   an input device;
   an output device;
   a processor device operably coupled to the input device and the output device; and
   a memory device operably coupled to the processor device and comprising at least one microelectronic device structure having a memory array region and a staircase region, the at least one microelectronic device structure comprising:
      a stack structure having tiers each comprising a conductive structure and an insulative structure vertically neighboring the conductive structure, the stack structure comprising:
         a deck comprising some of the tiers;
         an additional deck vertically overlying the deck and comprising other of the tiers; and
         an interdeck section vertically between the deck and the additional deck, the interdeck section comprising:
            a dielectric structure horizontally confined within the memory array region; and
            some other of the tiers within vertical boundaries of the dielectric structure and horizontally confined within of the staircase region;
      staircase structures within the staircase region and having steps comprising edges of the tiers of the stack structure within the deck and the additional deck; and
      semiconductive pillar structures within the memory array region and vertically extending through the stack structure.

8. A method of forming a microelectronic device, comprising:
- forming a microelectronic device structure having a memory array region and a staircase region, the microelectronic device structure formed to comprise a first preliminary stack structure comprising a vertically alternating sequence of first insulative structures and second insulative structures arranged in tiers;
- forming a dielectric structure within an upper portion of the first preliminary stack structure and substantially confined within horizontal boundaries of the memory array region;
- forming a second preliminary stack structure over the first preliminary stack structure and the dielectric structure, the second preliminary stack structure comprising a vertically alternating sequence of additional first insulative structures and additional second insulative structures arranged in additional tiers;
- forming semiconductive pillar structures vertically extending through portions of the second preliminary stack structure, the dielectric structure, and the first preliminary stack structure within the memory array region;
- forming staircase structures within the portions of the second preliminary stack structure and the first preliminary stack structure within the staircase region, some of the staircase structures having steps comprising horizontal ends of the tiers of the first preliminary stack structure and other of the staircase structures having additional steps comprising horizontal ends of the additional tiers of the second preliminary stack structure; and
- at least partially replacing the second insulative structures and the additional second insulative structures with conductive structures.

9. The method of claim 8, wherein forming a dielectric structure within an upper portion of the first preliminary stack structure comprises:
- forming a photoresist structure over portions of the first preliminary stack structure within the staircase region;
- selectively removing the upper portion of the first preliminary stack structure using the photoresist structure as a mask to form a recess within the first preliminary stack structure and substantially confined within the horizontal boundaries of the memory array region;
- forming a dielectric fill material over exposed surfaces of the first preliminary stack structure inside and outside of the recess; and
- removing portions of the dielectric fill material outside of horizontal boundaries and vertical boundaries of the recess to form the dielectric structure.

10. The method of claim 8, further comprising selecting the first insulative structures of the first preliminary stack structure, the dielectric structure, and the additional first insulative structures of the second preliminary stack structure to each comprise a dielectric oxide material.

11. The method of claim 8, wherein forming semiconductive pillar structures comprises:
- forming openings vertically extending through the dielectric structure and a lower portion of the first preliminary stack structure underlying the dielectric structure;
- covering the openings with plug structures that partially vertical extend into the openings;
- forming the second preliminary stack structure over the first preliminary stack structure, the dielectric structure, and the plug structures;
- forming additional openings vertically extending through second preliminary stack structure and the plug structures and to remaining portions of the openings to form relatively larger openings; and
- filling the relatively larger openings with semiconductive material.

12. The method of claim 8, wherein forming staircase structures within the portions of the second preliminary stack structure and the first preliminary stack structure within the staircase region comprises:
- forming a stadium structure within the second preliminary stack structure, the stadium structure comprising:
  - a first of the staircase structures having positive slope; and
  - a second of the staircase structures opposing the first of the staircase structures and having negative slope; and
- forming an additional stadium structure within the first preliminary stack structure, the additional stadium structure comprising:
  - a third of the staircase structures having positive slope; and
  - a fourth of the staircase structures opposing the third of the staircase structures and having negative slope.

13. The method of claim 12, wherein forming an additional stadium structure within the first preliminary stack structure comprises subjecting the second preliminary stack structure to a chopping process to vertically extend an opening defined by another stadium structure formed within the second preliminary stack structure into the first preliminary stack structure and form the additional stadium structure.

14. The method of claim 8, wherein at least partially replacing the second insulative structures and the additional second insulative structures with conductive structures comprises at least partially replacing the second insulative structures and the additional second insulative structures with tungsten.

* * * * *

UNITED STATES PATENT AND TRADEMARK OFFICE
CERTIFICATE OF CORRECTION

PATENT NO. : 11,282,747 B2
APPLICATION NO. : 16/799254
DATED : March 22, 2022
INVENTOR(S) : Bo Zhao et al.

It is certified that error appears in the above-identified patent and that said Letters Patent is hereby corrected as shown below:

In the Specification

| | | |
|---|---|---|
| Column 6, | Line 62, | change "(Sift))." to --(SiO$_2$).-- |
| Column 10, | Line 57, | change "the preliminary stack structure 100" to --the first preliminary stack structure 104-- |
| Column 18, | Line 62, | change "110." to --104.-- |
| Column 21, | Line 23, | change "Sift." to --SiO$_2$.-- |
| Column 21, | Line 32, | change "Sift." to --SiO$_2$.-- |
| Column 29, | Line 44, | change "134" to --124-- |

In the Claims

| | | | |
|---|---|---|---|
| Claim 2, | Column 35, | Line 66, | change "dielectric structure" to --dielectric structures-- |

Signed and Sealed this
Twenty-fourth Day of May, 2022

*Katherine Kelly Vidal*

Katherine Kelly Vidal
*Director of the United States Patent and Trademark Office*